United States Patent
Ishibashi et al.

(10) Patent No.: US 8,025,986 B2
(45) Date of Patent: Sep. 27, 2011

(54) ORGANIC ELECTROLUMINESCENT ELEMENT AND LIGHT-EMITTING DEVICE OR DISPLAY DEVICE INCORPORATED THEREWITH

(75) Inventors: Tadashi Ishibashi, Kanagawa (JP); Mari Ichimura, Kanagawa (JP); Shinichiro Tamura, Kanagawa (JP); Naoyuki Ueda, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/487,584

(22) PCT Filed: Jun. 25, 2003

(86) PCT No.: PCT/JP03/08043
§ 371 (c)(1),
(2), (4) Date: Sep. 10, 2004

(87) PCT Pub. No.: WO2004/003104
PCT Pub. Date: Jan. 8, 2004

(65) Prior Publication Data
US 2005/0158577 A1    Jul. 21, 2005

(30) Foreign Application Priority Data

Jun. 26, 2002 (JP) .................................. 2002-185675
Jun. 11, 2003 (JP) .................................. 2003-165852

(51) Int. Cl.
*H01J 1/62* (2006.01)
*H01L 29/08* (2006.01)
*H01L 29/18* (2006.01)

(52) U.S. Cl. ........ 428/690; 428/917; 313/504; 313/506; 257/40; 257/88

(58) Field of Classification Search .................. 257/88, 257/103, 40; 428/690, 917; 313/504, 506
See application file for complete search history.

(56) References Cited

U.S. PATENT DOCUMENTS

| | | | |
|---|---|---|---|
| 6,534,199 B1 * | 3/2003 | Hosokawa et al. | 428/690 |
| 6,680,131 B1 * | 1/2004 | Ishibashi et al. | 428/690 |
| 6,713,192 B2 * | 3/2004 | Fukuoka et al. | 428/690 |
| 2004/0018387 A1 * | 1/2004 | Tada et al. | 428/690 |
| 2004/0202891 A1 * | 10/2004 | Ishibashi et al. | 428/690 |

FOREIGN PATENT DOCUMENTS

| EP | 1072669 | * | 7/2000 |
|---|---|---|---|
| EP | 1182244 A1 | | 2/2002 |
| JP | 2002-134276 A | | 5/2002 |

* cited by examiner

*Primary Examiner* — Angela Ortiz
*Assistant Examiner* — Camie S Thompson
(74) *Attorney, Agent, or Firm* — Robert J. Depke; Rockey, Depke & Lyons, LLC

(57) ABSTRACT

The present invention provides an organic electroluminescent element which is superior in luminance, reliability, and thermal stability and is capable of selectively emitting light with comparative long wavelengths such as red and good color purity and a light-emitting device or display device incorporated therewith. The organic electroluminescent element consists of a glass substrate (1), an anode (2), a hole transporting layer (10), an emitting layer (11), an electron transporting layer (12), and a cathode (3), which are sequentially laminated on top of the other. The emitting layer (11) is formed from a mixture composed of at least one species of the styryl compound represented by the general formula [I] below and a material with charge transporting capability.

$$Y\text{---}CH\text{=}CH\text{---}X \qquad \text{General formula [I]}$$

(where X denotes an aryl group (such as phenyl group) which has a substituent group (such as cyano group and methyl group), and Y denotes a group having a skeleton of aminophenyl group or the like.)

14 Claims, 4 Drawing Sheets

ORGANIC ELECTROLUMINESCENT ELEMENT AND LIGHT-EMITTING DEVICE OR DISPLAY DEVICE INCORPORATED THEREWITH

This application claims priority to Japanese Patent Application Number JP2002-185675, filed Jun. 26, 2002, and Japanese Patent Application Number JP2003-165852, filed Jun. 11, 2003 which are incorporated herein by reference.

TECHNICAL FIELD

The present invention relates to an organic electroluminescent element (organic EL element) having an organic layer for light emission which is sandwiched between the anode and the cathode, and also relates to a light-emitting device or display device incorporated therewith.

BACKGROUND ART

Enormous efforts are being directed to research and development of light-weight high-efficiency flat-panel displays for use as computer screens or television screens.

One reason for this is that the conventional CRT now in general use as the display device is bulky, heavy, and power-consumptive despite its high luminance and good color reproduction.

Among the light-weight high-efficiency flat-panel displays which have recently been commercialized is, for example, a liquid-crystal display of active matrix drive type. Unfortunately, it has a narrow viewing angle and needs back light (which consumes a large amount of electric power) for use in a dark place because it does not emit light by itself. Moreover, it cannot quickly respond to high-definition high-speed video signals to be put to practical use in near future. Another problem is high production cost and technical difficulties involved in production of large-sized display.

A possible substitute for liquid-crystal display is a display with light-emitting diodes. However, it also has a problem with high production cost and technical difficulties in forming light-emitting diodes in matrix structure on a single substrate. It is not an inexpensive display to replace CTRs in near future.

There has recently appeared a flat panel display which is expected to solve the above-mentioned problems. It is an organic electroluminescent element (organic EL element) made with an organic luminescent material. It is expected that a specific organic compound as a luminescent material will help realize a flat display panel which emits light by itself, responds quickly, and ensures good visibility free from viewing angles.

The organic EL element is composed of a transparent anode and a metal cathode and an organic thin film interposed between the anode and the cathode which contains a luminescent material which emits light upon injection of electric current. That of single hetero structure, which was developed by C. W. Tang and S. A. VanSlyke, is reported in Applied Physics Letters, vol. 51, No. 12, pp. 913 to 915 (1987). It has an organic thin film of double-layer structure, which is composed of a thin film of hole transporting material and a thin film of electron transporting material, so that luminescence takes place upon recombination of holes and electrons injected into the organic thin film from each electrode.

The organic EL element of this structure permits either the hole transfer material or the electron transfer material to function as a luminescent material. Luminescence takes place in the wavelength region corresponding to the energy gap between the ground state and the excited state which are assumed by the luminescent material. The double-layer structure brings about a considerable reduction in driving voltage and a great improvement in luminescence efficiency.

At a later time, an organic EL element of double hetero structure was reported by C. Adachi, S. Tokita, T. Tsutsui, and S. Saito in Japanese Journal of Applied Physics, vol. 27, No. 2, pp. L269 to L271 (1988). The structure is composed of three layers of hole transporting material, luminescent material, and electron transporting material. Further, another organic EL element was reported by C. W. Tang, S. A. VanSlyke, and C. H. Chen in Journal of Applied Physics, vol. 65, No. 9, pp. 3610 to 3616 (1989). The structure has a luminescent material contained in the electron transporting material. These researches have proved the feasibility of intensive luminescence at a low voltage. Active research and development works in this field are going on.

The fact that there exists a large variety of organic compounds used as luminescent materials suggests that it would be possible, at least theoretically, to produce light of any desired color if their molecular structure is properly modified. In other words, properly designed organic compounds would give three pure colors (red, green, and blue) necessary for full color display more easily than inorganic compounds used for thin-film EL elements.

It is reported in non-patent literature (1) listed below that the emission of red color is possible with an electron transporting material which is tris(8-quinolyl)aluminum ($Alq_3$ for short hereinafter) doped with 4-dicyanomethylene-6-(p-dimethylaminostyryl)-2-methyl-4H-pyran (DCM for short hereinafter).

It is also reported in non-patent literature (2) listed below that BSB-BCN gives a luminescence of 1000 $cd/m^2$ or above.

It is proposed in patent literature (1) listed below that a specific styryl compound be used as the electroluminescent material.

Non-patent literature (1): Chem. Funct. Dyes, Proc. Int. Symp., 2nd. p.536 (1993)

Non-patent literature (2): T. Tsutsui, D. U. Kim, Inorganic and Organic Electroluminescence Conference (1996, Berlin)

Patent literature (1): Japanese Patent Laid-open No. Hei 7-188649 (Claim, from p. 5, right column, line 8, to p. 22, right column, line 5, and FIGS. 1 to 3)

Despite these prior art technologies, the actual organic electroluminescent element still have problems to be solved. Difficulties are involved in development of an element capable of stably emitting red light with a high luminance. The electron transporting material (DCM-doped $Alq_3$) reported in the non-patent literature (1) above does not exhibit satisfactory luminance and reliability required of the display material.

The BSB-BCN reported in the non-patent literature (2) above gives a luminance of 1000 $cd/m^2$ or above but does not give a complete red chromaticity necessary for full color display.

There is a need for development of an electroluminescent element capable of stably emitting red light with a high purity and a high luminance.

The specific styryl compound, which proposed for use as the organic electroluminescent material in the patent literature (1) above, is intended only for blue light emission. It is not intended for emission of light with wavelengths of red or other colors.

It is an object of the present invention to provide an organic electroluminescent element and a light-emitting device or display device incorporated therewith. The organic electroluminescent element is formed from a compound which has a high fluorescence yield and a good thermal stability. Moreover, it stably and selectively emits light of red and other colors (in the region of comparatively long wavelengths) with a high color purity and a high luminance.

DISCLOSURE OF INVENTION

In order to address the above-mentioned problems, the present inventors carried out a series of researches which led to the finding that it is possible to provide an electroluminescent element superior in luminance, reliability, and thermal stability and capable of emitting light with a high color purity in the region of comparatively long wavelengths (such as red) if it has an emitting region formed from a specific styryl compound and a material capable of efficiently transmitting energy thereto. The present invention is based on this finding.

BEST MODE FOR CARRYING OUT THE INVENTION

Figure 1:
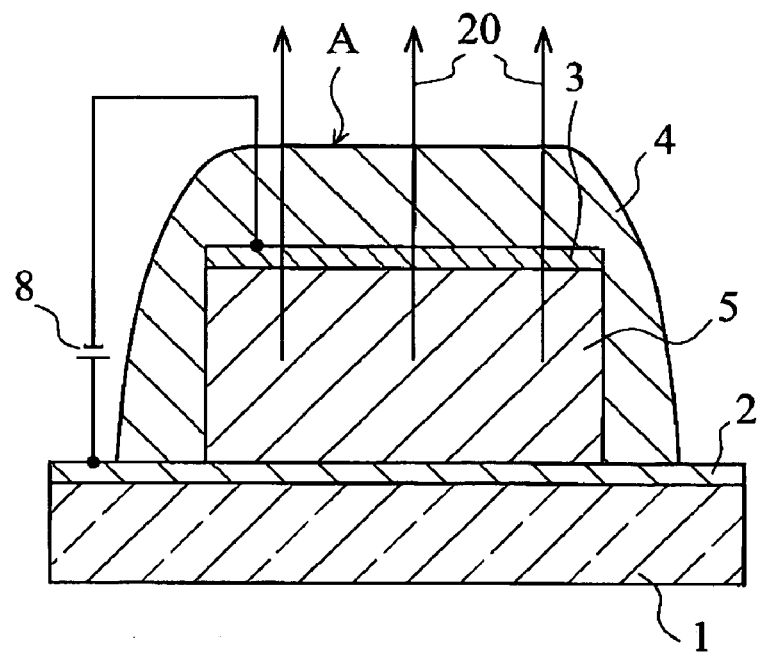
FIG. 1 is a schematic sectional view showing important parts of the organic electroluminescent element in one example according to the present invention.

The gist of the present invention resides in an organic electroluminescent element in which organic layers having a light emitting region are formed between the anode and the cathode and which contains as a constituent an organic substance capable of emitting light upon injection of electric current. At least one of the organic layers is formed from a mixture of at least one species (optionally two or more species) of the styryl compound represented by the general formula [I] shown below and a material with charge transporting capability. (This organic electroluminescent element may occasionally be referred to as the first organic EL element according to the present invention.)

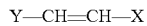    General formula [I]

[where, in the general formula [I], X denotes any group represented by the general formulas (1) to (13) shown below.

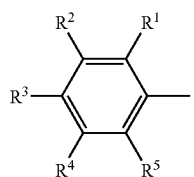 (1)

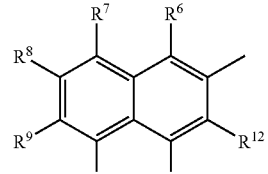 (2)

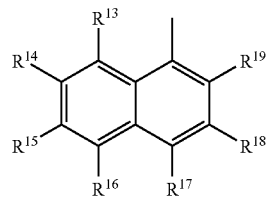 (3)

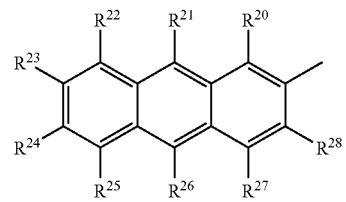 (4)

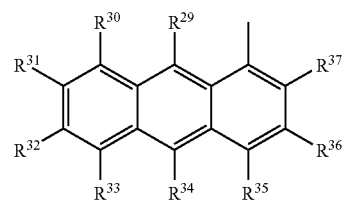 (5)

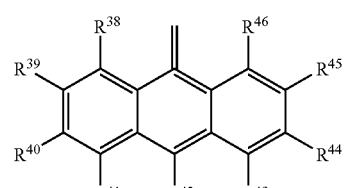 (6)

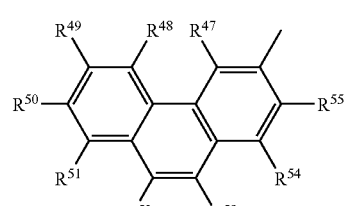 (7)

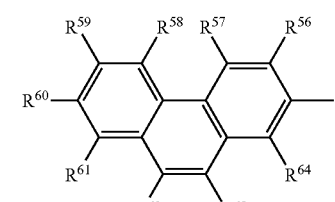 (8)

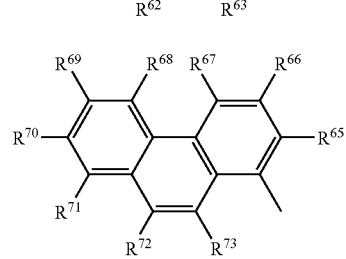 (9)

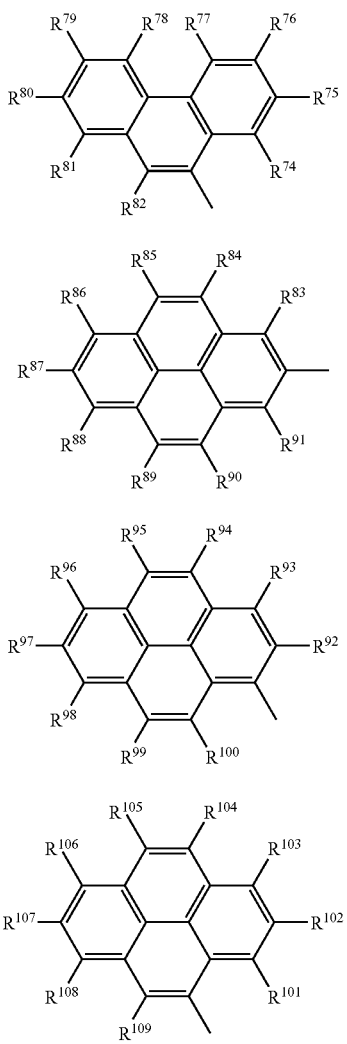

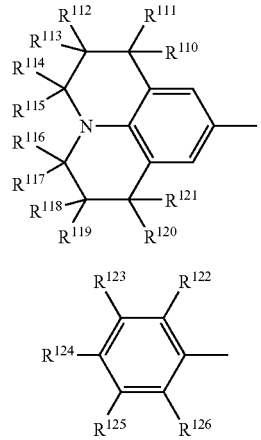

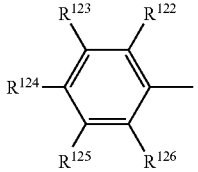

(where, in the general formula (14) above, each of $Z^1$ and $Z^2$, which may be identical or different, is a group selected from hydrogen atom, alkyl group (optionally substituted), and aryl group (optionally substituted); and in the general formulas (15) and (16) above, each of $R^{110}$ to $R^{126}$, which may be identical or different, denotes a group selected from hydrogen atom, alkyl group (optionally substituted), aryl group (optionally substituted), alkoxyl group (optionally substituted), halogen atom, nitro group, cyano group, and trifluoromethyl group.)]

Now, in the general formula [I] above, it is essential that any of $R^1$ to $R^5$ should be a substituent such as halogen atom and nitro group. If any of $R^1$ to $R^5$ is a hydrogen atom, the compound does not contribute to red light emission and does not help reduce crystallinity.

The styryl compound represented by the general formula [I] above, which can be used in the organic electroluminescent element according to the present invention, is at least one styryl compound having the molecular structure represented by the structural formulas (17)-1 to (17)-86 shown below.

(where, in the general formula (1), $R^1$ to $R^5$ may be identical or different, and at least one of $R^1$ to $R^5$ is a group selected from halogen atom, nitro group, cyano group, trifluoromethyl group, alkyl group (optionally substituted), and alkoxyl group (optionally substituted); and in the general formulas (2) to (13), each of $R^6$ to $R^{109}$, which may be identical or different, denotes a group selected from hydrogen atom, halogen atom, such as fluorine atom and chlorine atom (the same shall apply hereinafter), nitro group, cyano group, trifluoromethyl group, alkyl group (optionally substituted), aryl group (optionally substituted), and alkoxyl group (optionally substituted).)

Also, in the general formula [I], Y denotes any group represented by the general formulas (14) to (16) below.

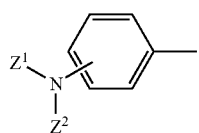

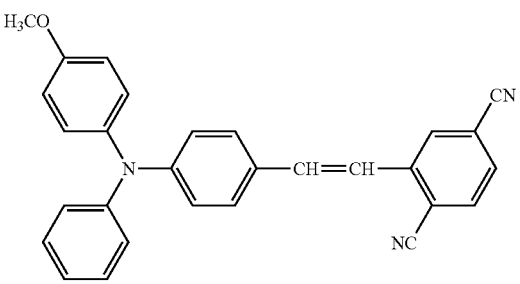

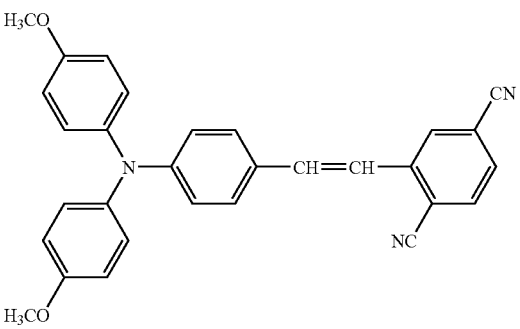

(17)-3
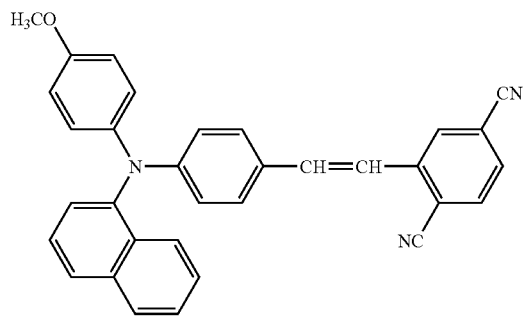
(17)-4
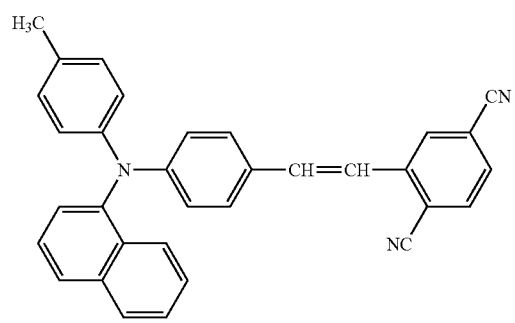
(17)-5
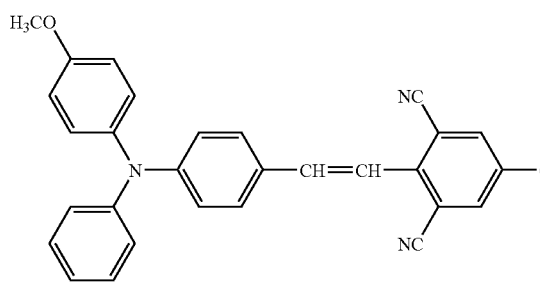
(17)-6
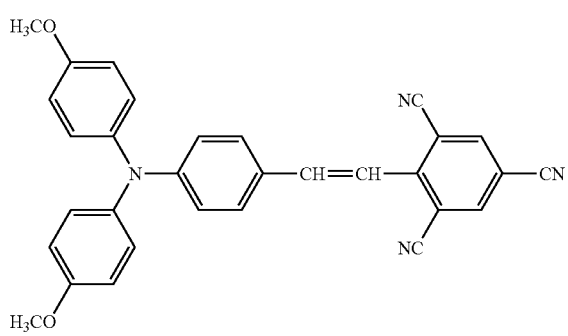
(17)-7
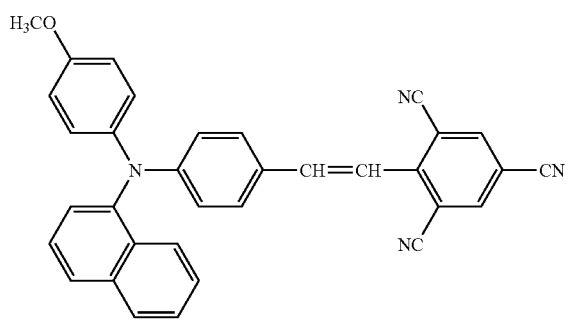
(17)-8
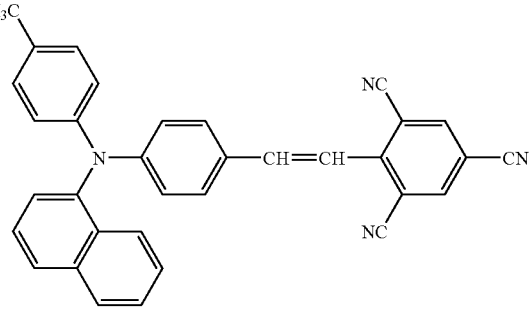
(17)-9
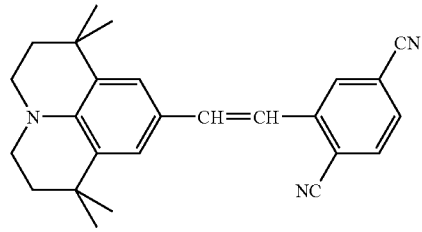
(17)-10
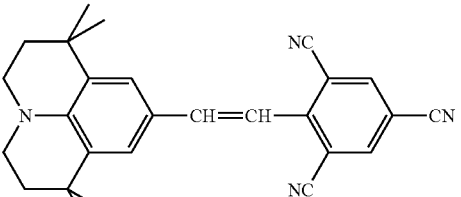
(17)-11
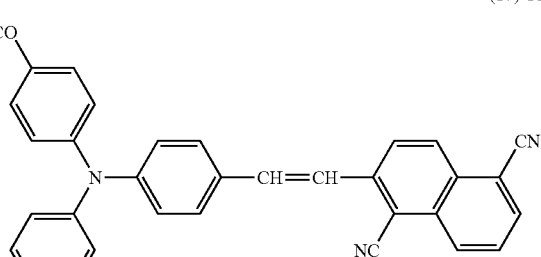
(17)-12
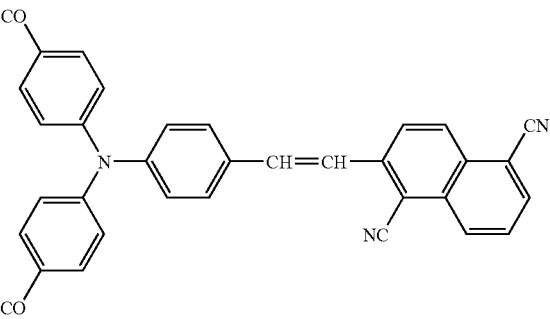

(17)-13
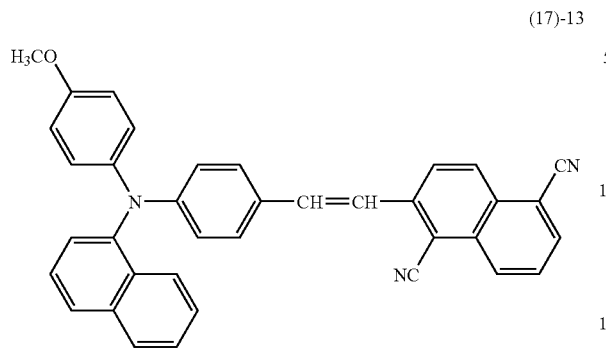
(17)-14
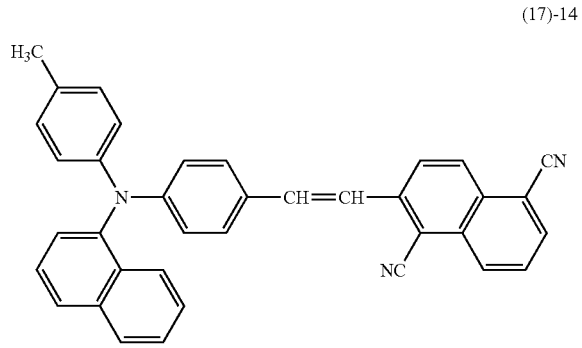
(17)-15
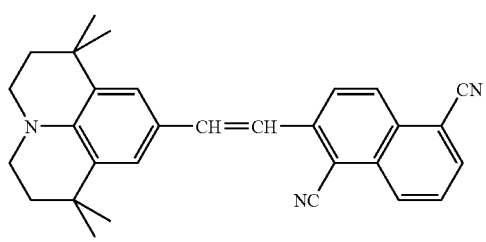
(17)-16
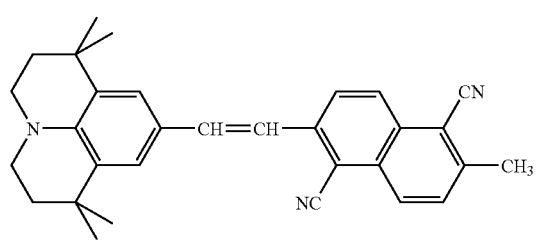
(17)-17
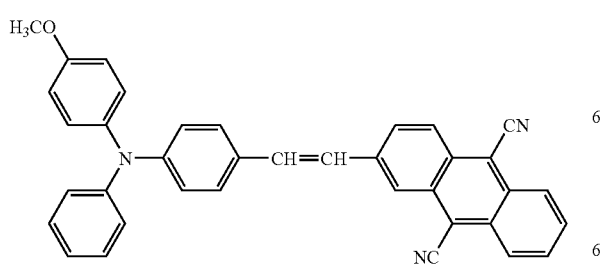
(17)-18
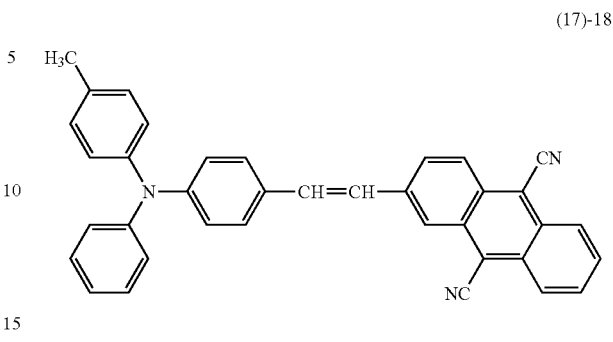
(17)-19
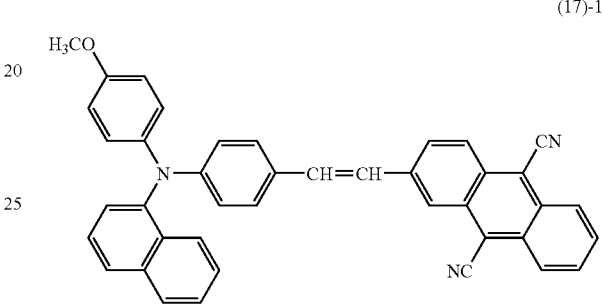
(17)-20
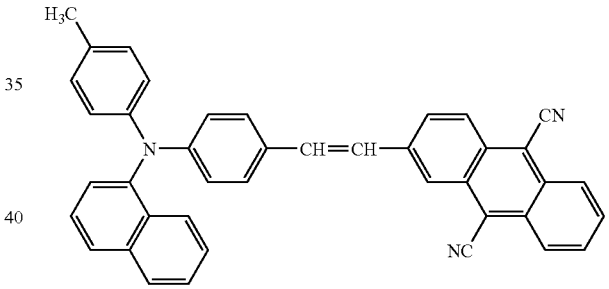
(17)-21
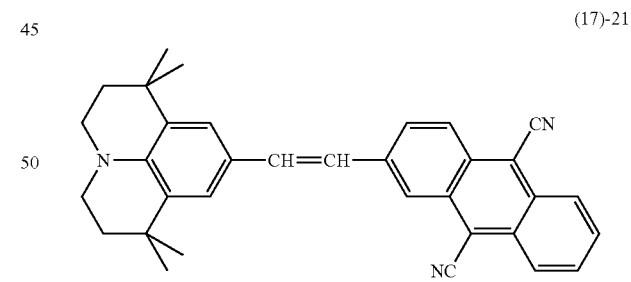
(17)-22
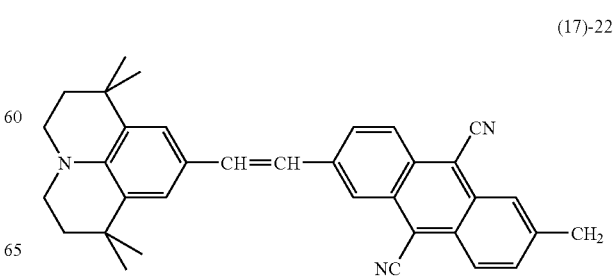

(17)-23
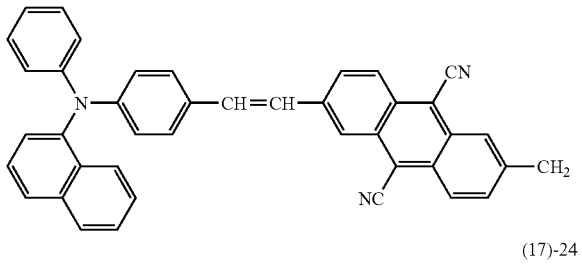
(17)-24
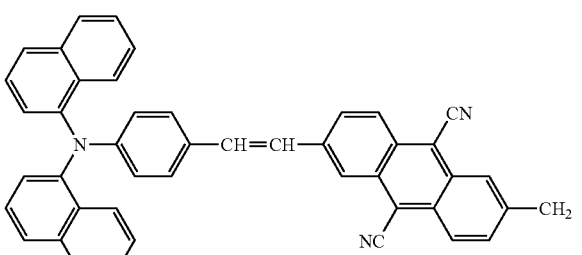
(17)-25
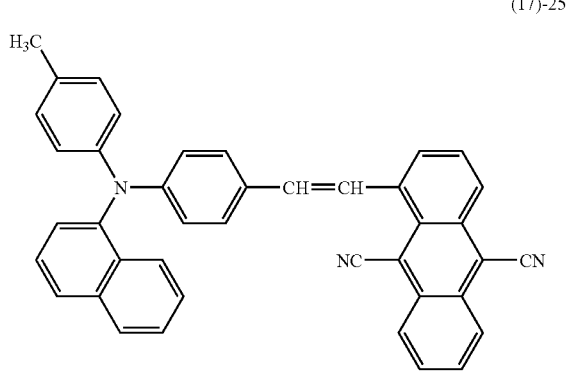
(17)-26
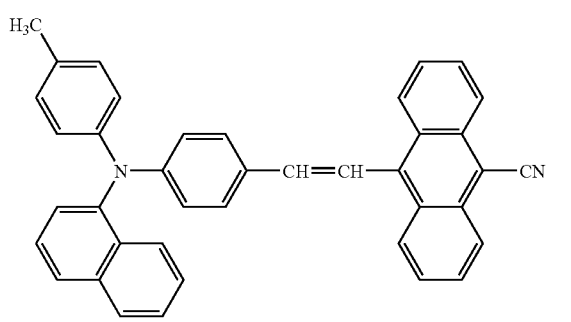
(17)-27
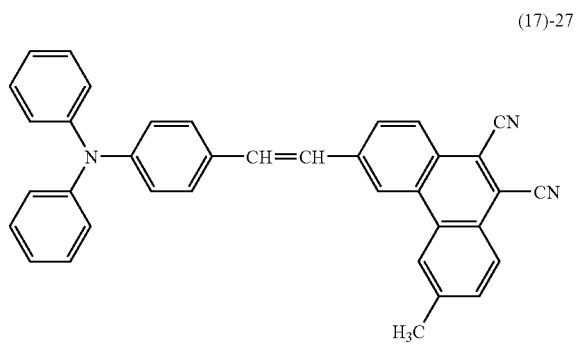
(17)-28
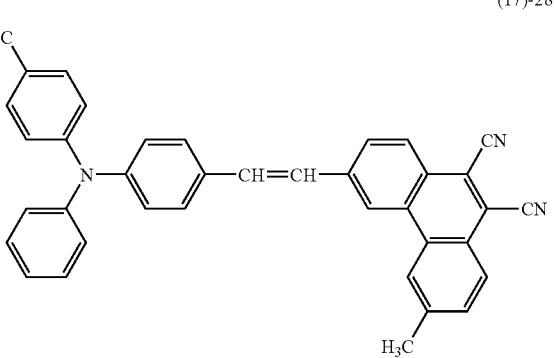
(17)-29
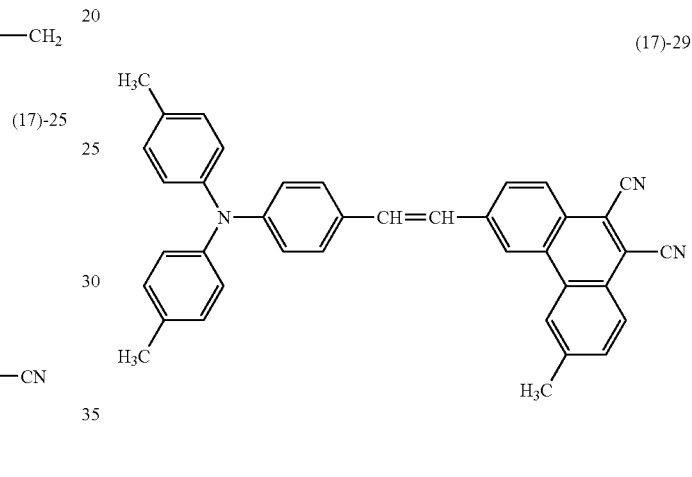
(17)-30
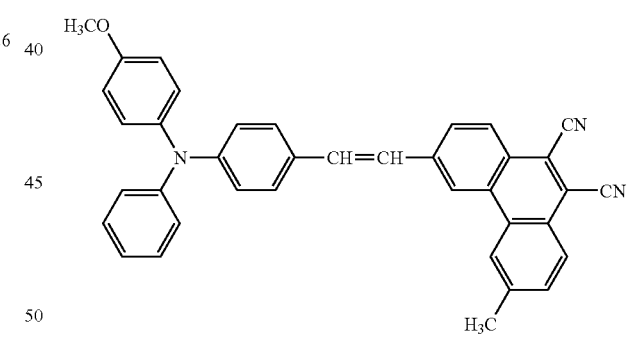
(17)-31
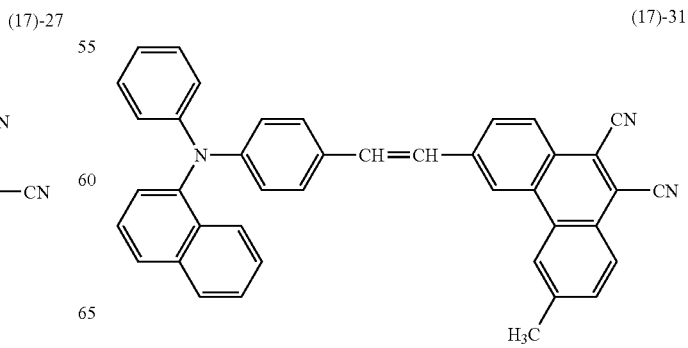

(17)-32
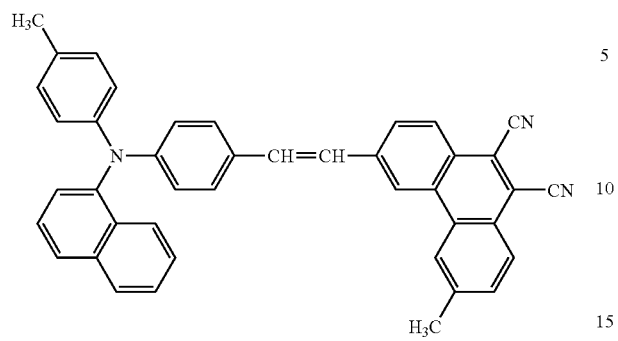
(17)-33
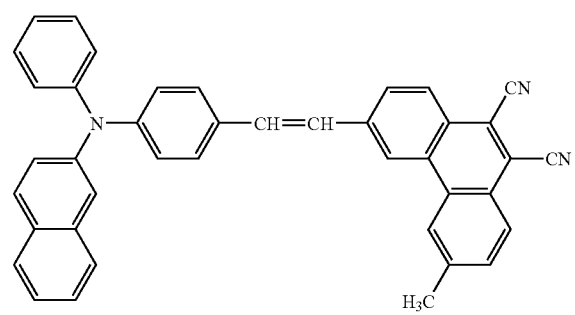
(17)-34
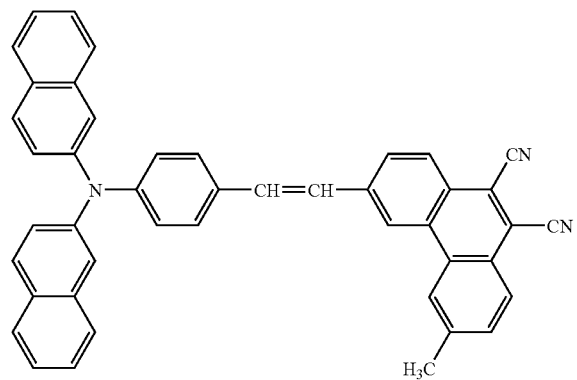
(17)-35
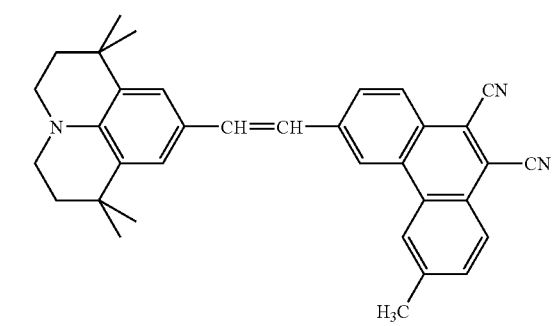
(17)-36
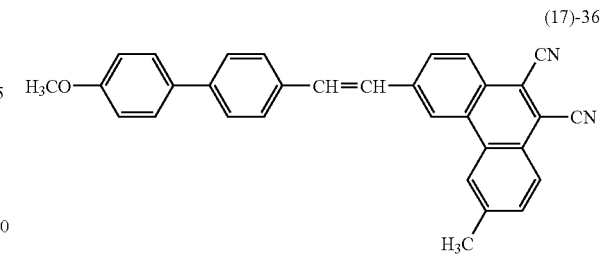
(17)-37
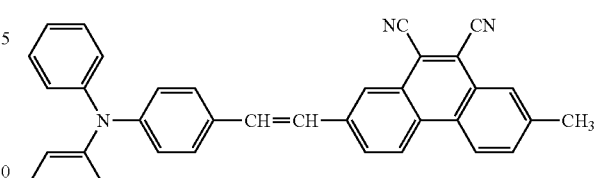
(17)-38
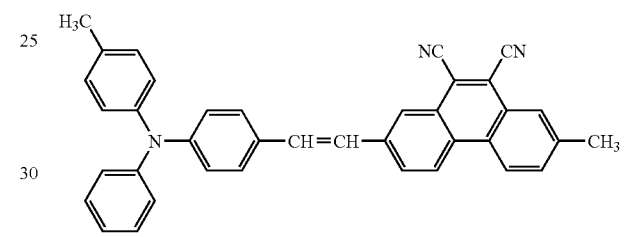
(17)-39
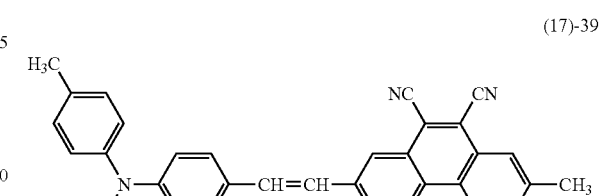
(17)-40
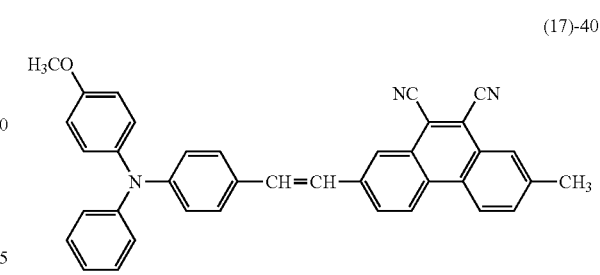
(17)-41
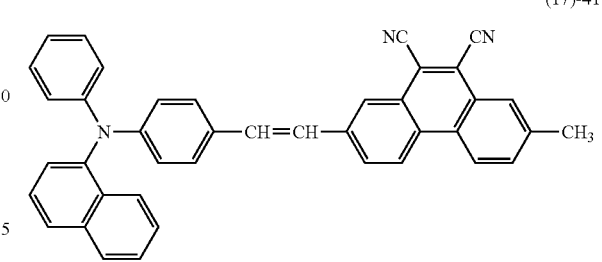

(17)-42
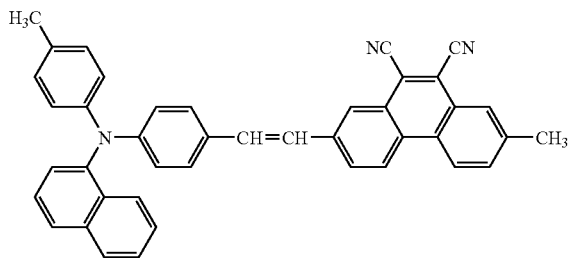
(17)-43
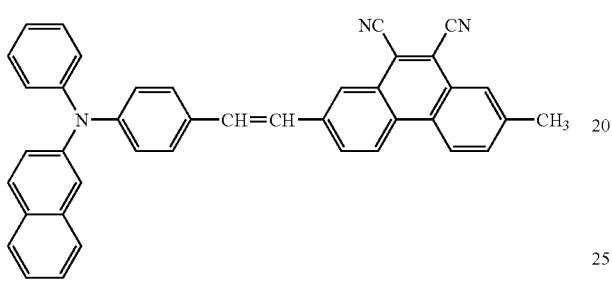
(17)-44
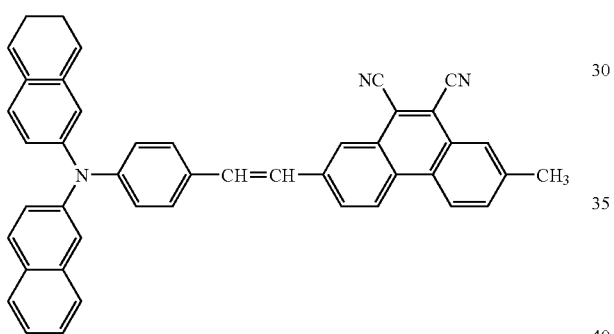
(17)-45
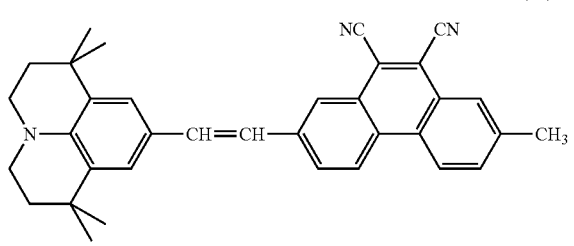
(17)-46
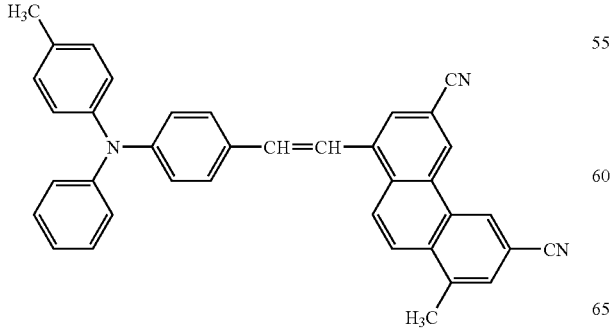
(17)-47
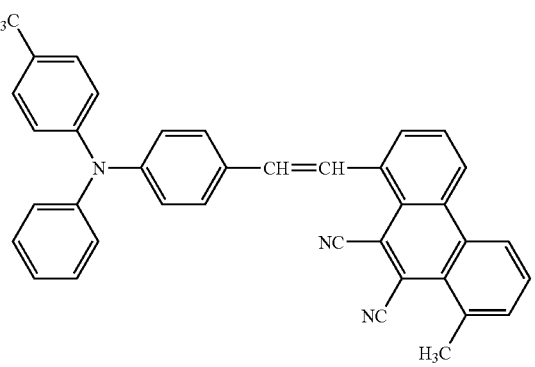
(17)-48
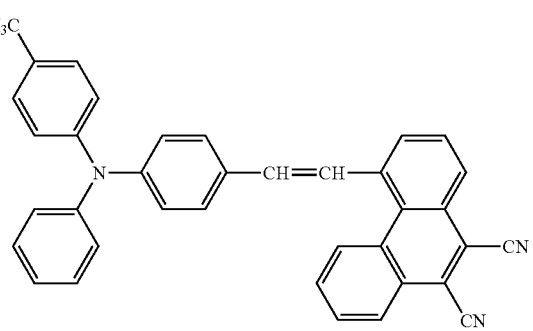
(17)-49
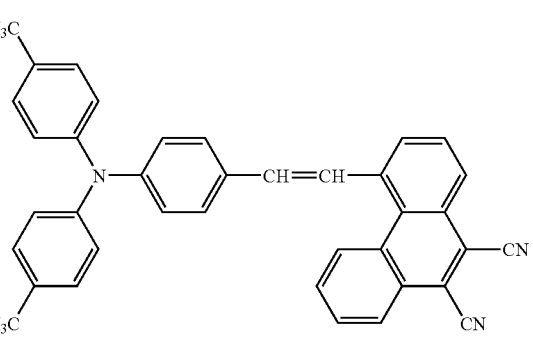
(17)-50

(17)-51
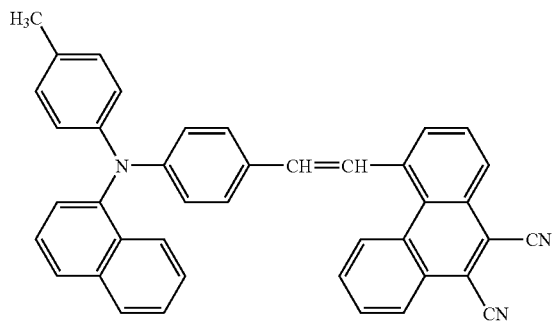
(17)-52
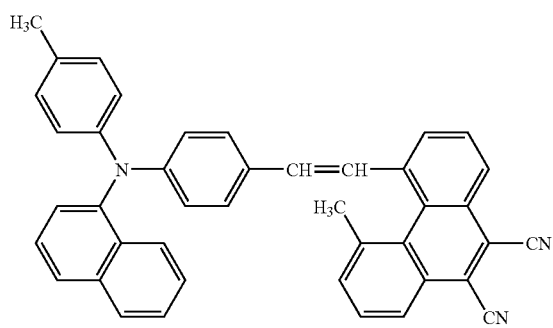
(17)-53
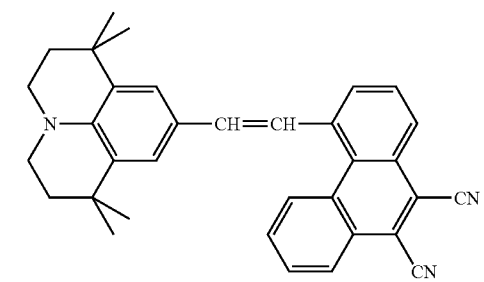
(17)-54
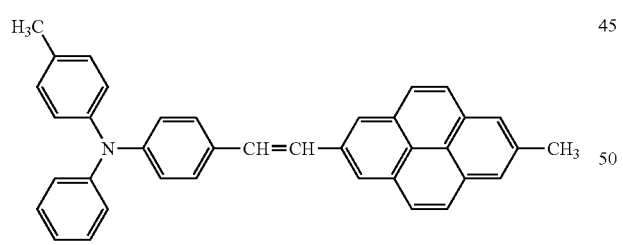
(17)-55
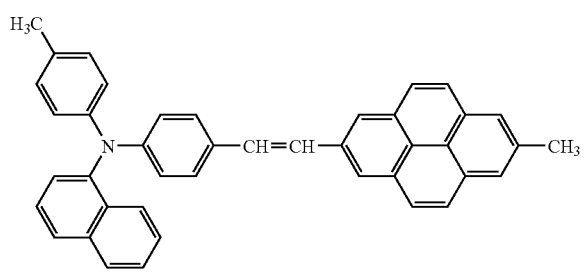
(17)-56
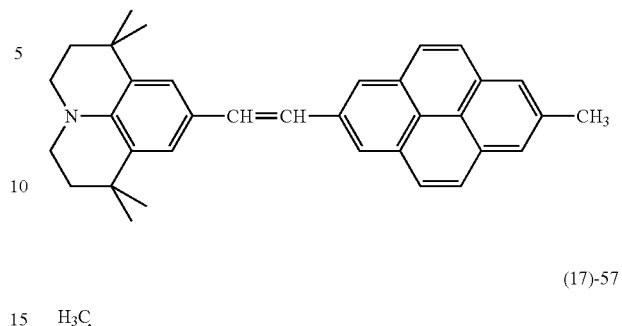
(17)-57
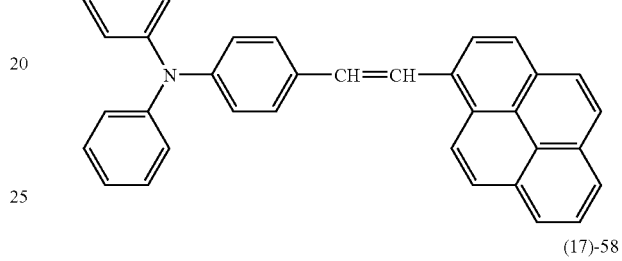
(17)-58
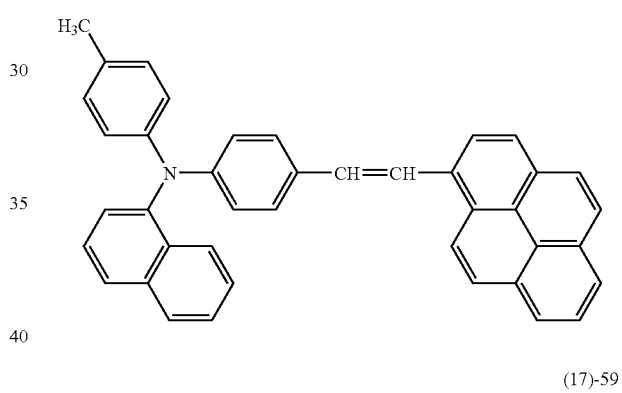
(17)-59
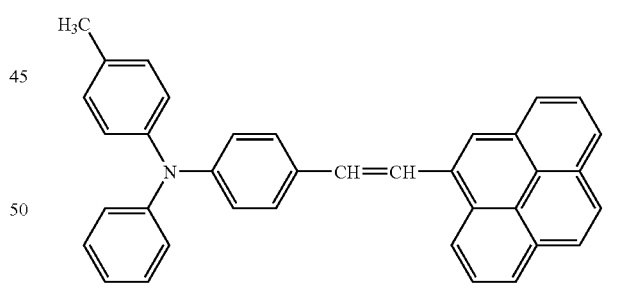
(17)-60
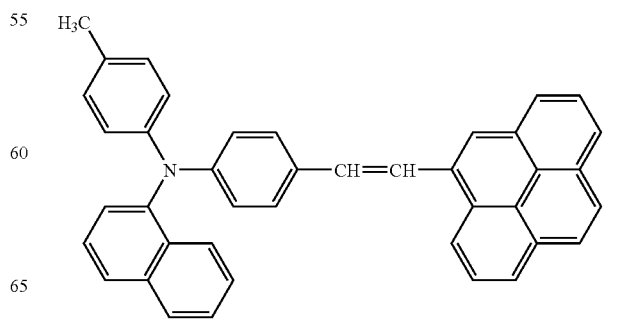

(17)-61
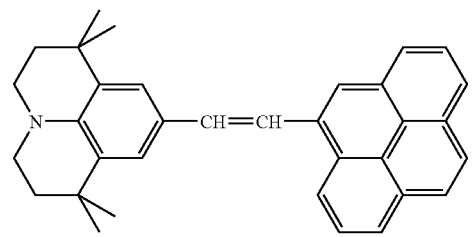
(17)-62
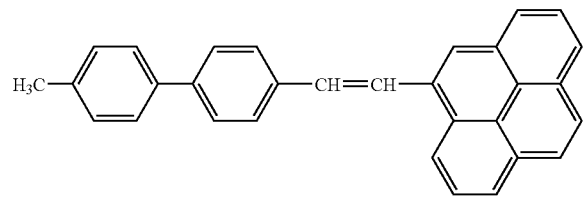
(17)-63
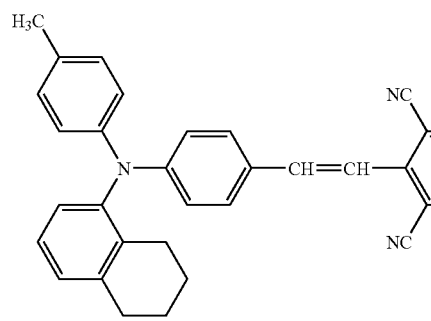
(17)-64
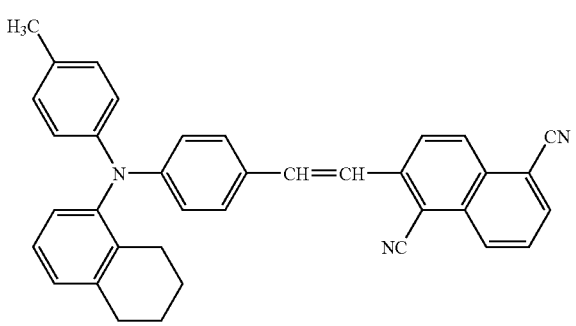
(17)-65
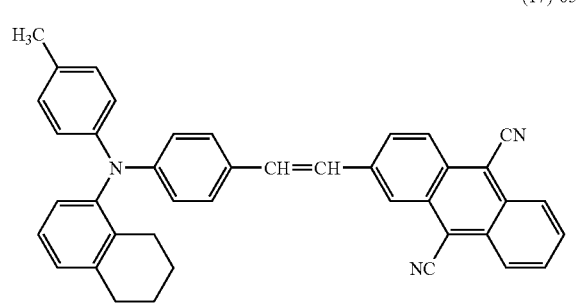
(17)-66
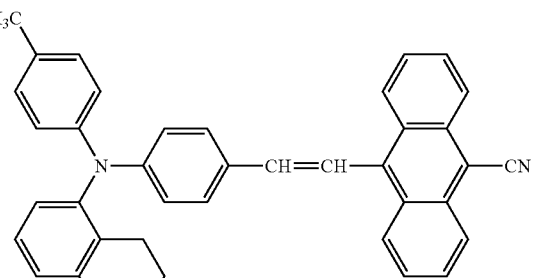
(17)-67
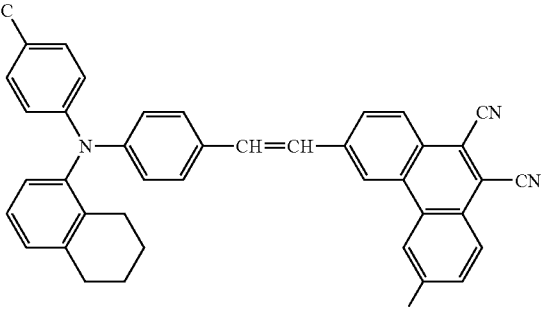
(17)-68
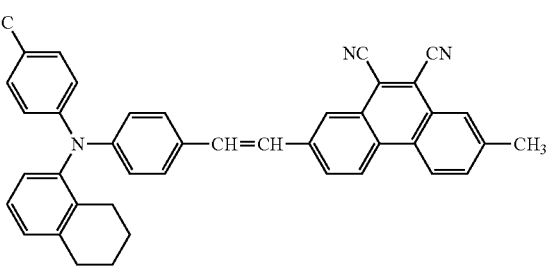
(17)-69
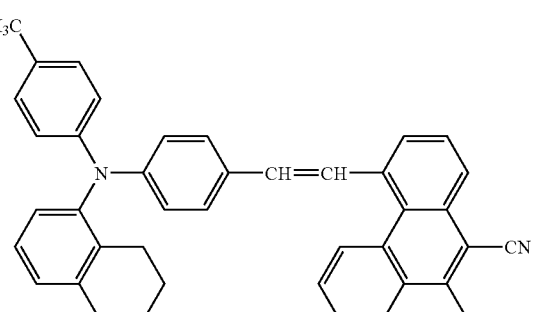
(17)-70
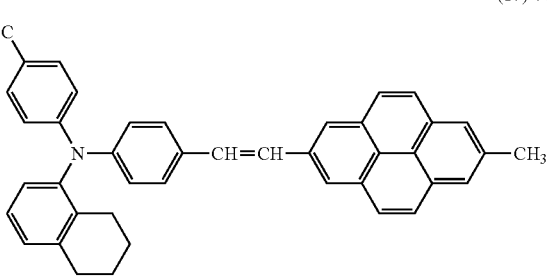

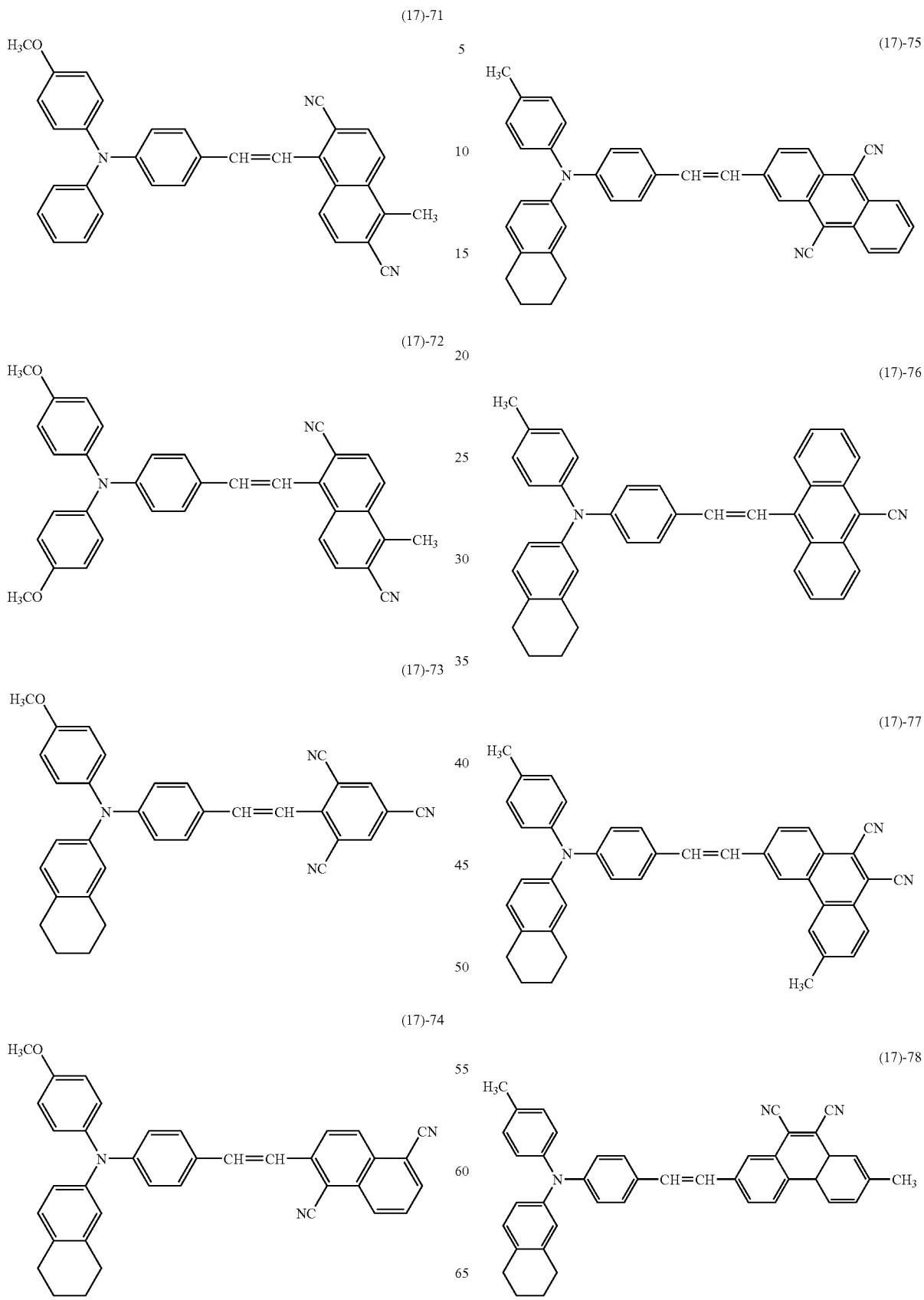

(17)-79

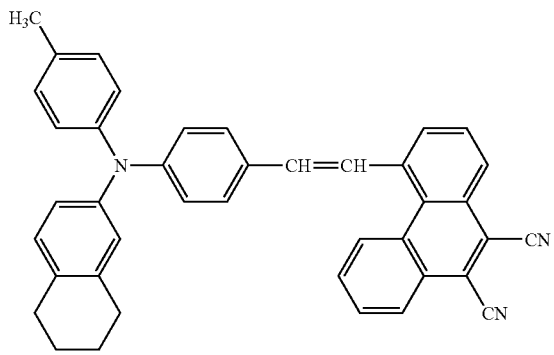

(17)-80

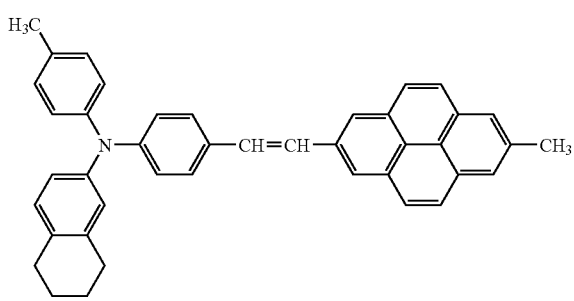

(17)-81

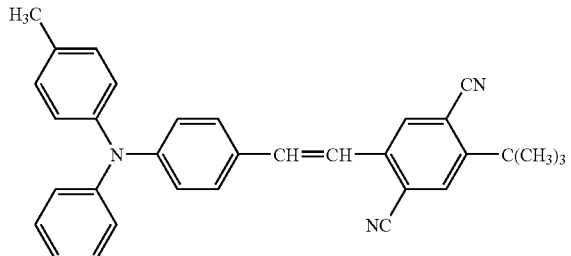

(17)-82

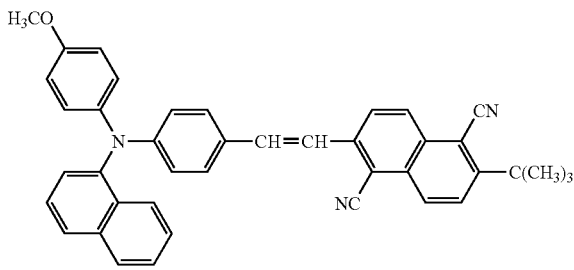

(17)-83

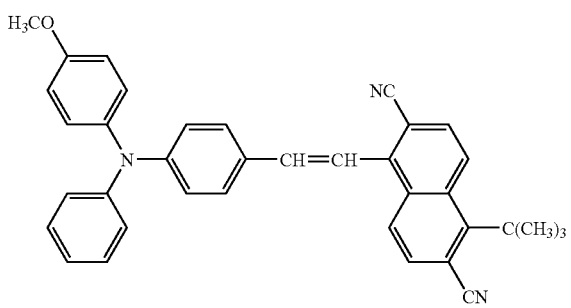

(17)-84

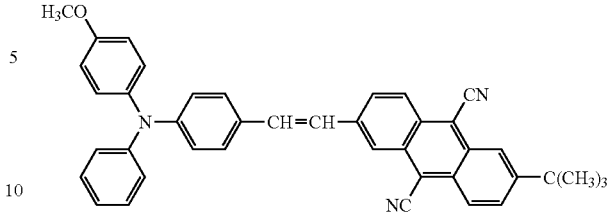

(17)-85

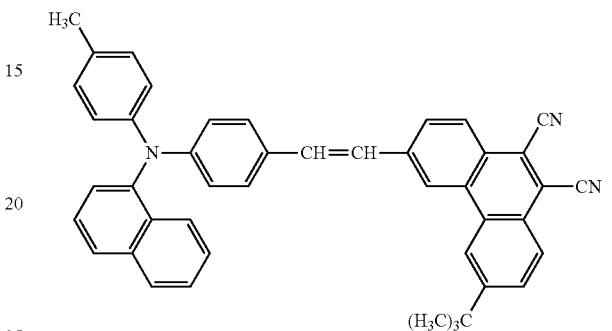

(17)-86

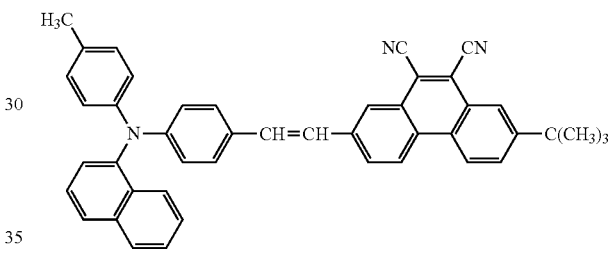

These styryl compounds vary in properties depending on the position of substituents. For example, the styryl compound having cyano groups at the positions indicated by the structural formula (17)-13 gives light with comparatively shorter wavelengths than that having cyano groups at other positions. However, the latter has a stable molecular skeleton and gives light with long wavelengths.

As mentioned above, the organic layer is formed from a mixture of the compound specified in the present invention and hole transporting materials (such as aromatic amines), electron transporting materials (such as Alq$_3$, pyrazolines, oxadiazoles, triazoles, and phenylenes), and a series of compounds generally used as a dopant for red light emission (such as DCM and its similar compounds, porphins, phthalocyanines, perylene compounds, Nile red, and squarilium compounds). (The same shall apply hereinafter.)

In the organic electroluminescent element according to the present invention, the organic layer mentioned above may have an organic layered structure composed of a hole transporting layer and an electron transporting layer which are laminated on top of the other, and at least the electron transporting layer of the organic layered structure may contain at least one species of the styryl compounds represented by the general formula [I] given above or the structural formulas (17)-1 to (17)-86 given above.

The organic layer mentioned above may be composed of a hole transporting layer and an electron transporting layer which are laminated on top of the other, and at least the hole transporting layer may contain at least one species of the styryl compounds represented by the general formula [I] given above or the structural formulas (17)-1 to (17)-86 given above.

The organic layer mentioned above may be composed of a hole transporting layer and an electron transporting layer which are laminated on top of the other, and the hole transporting layer may contain at least one species of the styryl compounds represented by the general formula [I] given above or the structural formulas (17)-1 to (17)-86 given above, and the electron transporting layer may contain at least one species of the styryl compounds represented by the general formula [I] given above or the structural formulas (17)-1 to (17)-86 given above.

The organic layer mentioned above may be composed of a hole transporting layer, a light-emitting layer, and an electron transporting layer which are laminated on top of the other, and at least the light-emitting layer may contain at least one species of the styryl compounds represented by the general formula [I] given above or the structural formulas (17)-1 to (17)-86 given above.

The mixture layer mentioned above should preferably be composed of at least one species of the styryl compounds represented by the general formula [I] given above or the structural formulas (17)-l to (17)-86 given above and the above-mentioned material with charge transporting capability, with the former being present in concentrations from 5 wt % to 90 wt %.

The mixture layer mentioned above should preferably contain at least one species of the styryl compounds represented by the general formula [I] given above or the structural formulas (17)-1 to (17)-86 given above and a red or orange luminescent dye which has the emission maximum in the range of 600 nm to 700 nm.

Incidentally, the "mixture layer" mentioned above typically implies the one which is composed of the styryl compound mentioned above and the other compound. It occasionally implies the one which contains two or more species of the styryl compound mentioned above. The mixture layer composed of more than one compound contributes to emission of red light having a desired luminance and chromaticity.

The organic electroluminescent element according to the present invention is suitable for a light-emitting device or a display device in which the organic electroluminescent element is used at least a part of pixels. (The same shall apply hereinafter.)

FIGS. 1 to 6 show examples of the organic electroluminescent element (organic EL element) according to the present invention.

Figure 2:
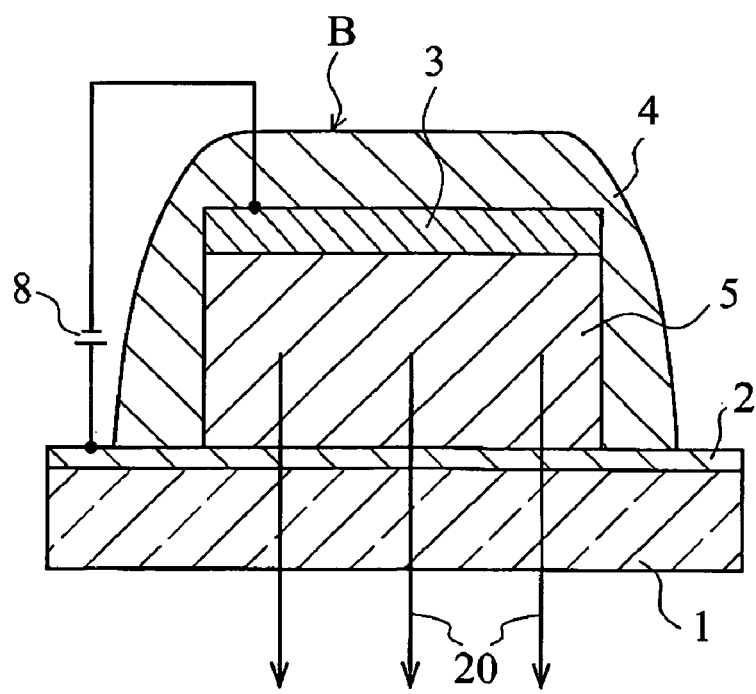
FIG. 2 is a schematic sectional view showing important parts of the organic electroluminescent element in another example according to the present invention.

FIG. 1 shows Example (A) of the organic electroluminescent element of top emitting type constructed such that the emitted light 20 passes through the cathode 3. FIG. 2 shows Example (B) of the organic electroluminescent element of bottom emitting type constructed such that the emitted light 20 is reflected by the cathode 3.

In FIGS. 1 and 2, there is shown a substrate 1 on which the organic electroluminescent element is formed. It is made of glass, plastics, or any other proper material. One single substrate may serve for the organic electroluminescent element and another display element which are combined together. There is also shown an anode 2, which is a transparent, translucent or opaque electrode made of ITO (Indium Tin Oxide), $SnO_2$, Au, Ag, Al, Cr, or the like.

Further, there is shown an organic layer 5, which contains more than one styryl compound mentioned above as a luminescent material (with at least one species of the styryl compounds being mixed with another compound or two or more species of the styryl compounds being combined together). (The same shall apply hereinafter.) This emitting layer may have any known layer structure for emission of the organic electroluminescent light 20.

The emitting layer may be formed by laminating a thin film of hole transporting layer and a thin film of electron transporting layer, either of which is made of a luminescent material. Either or both of the hole transporting layer and the electron transporting layer may be a thin film made of a mixture of two or more materials or a laminate composed of two or more thin films each made of different material. This improves the charge transporting performance to the extent intended by the present invention.

For better luminescent performance, the emitting layer may have a thin film of at least one fluorescent material interposed between the hole transporting layer and the electron transporting layer; alternatively, either or both of the hole transporting layer and the electron transporting layer may contain at least one fluorescent material. In these cases, the layer structure may be incorporated with a thin layer to control hole or electron transport for improvement in luminescence efficiency.

The styryl compound represented by the general formula [I] given above has both the electron transporting capability and the hole transporting capability; therefore, it may be mixed with either an electron transporting material or a hole transporting material to form the luminescent mixture layer in the element. It may also serve as a luminescent material to be incorporated into the mixture layer interposed between the electron transporting layer and the hole transporting layer.

The mixture layer as the emitting layer may contain two or more species of the styryl compounds represented by the general formula [I] given above. An adequate combination of two or more compounds permits the color of emitted light to be selected as desired without the element appreciably changing in electrical properties.

The styryl compound represented by the general formula [I] given above has the aryl part represented by the general formulas (2) to (13), in which any of $R^6$ to $R^{109}$ may have a substituent such as halogen atom, nitro group, cyano group, trifluoromethyl group, alkyl group (optionally substituted), and alkoxyl group (optionally substituted). With such a substituent, the styryl compound prevents the thin film (as the emitting layer) from crystallizing, thereby improving the thin film amorphous. This makes the luminescent element more reliable, particularly life (in terms of half life).

In FIGS. 1 and 2, there is shown a cathode 3, which is made of metal (such as Ag, Au, Al, Cr, and In) or alloy thereof with an active metal (such as Li, Mg, and Ca). The metal or alloy may form a laminate structure. (The same shall apply hereinafter.) The cathode 3 may also be made of alkali metal oxide or alkaline earth metal oxide or lithium compound (such as LiF and $Li_2O$) in their composite form or laminate form. (The same shall apply hereinafter.) The organic electroluminescent element of top emitting type may give an adequate transmittance according to use if its cathode has a properly adjusted thickness. There is also shown a sealing layer 4, which entirely covers the organic electroluminescent element to enhance its effect. The sealing layer 4 may be formed from any material that ensures airtightness.

The organic electroluminescent element according to the present invention has the organic layer of single hetero structure or double hetero structure. The organic layer of single hetero structure consists of a hole transporting layer and an electron transporting layer which are laminated on top of the other. The hole transporting layer and the electron transporting layer may be a layer of mixture containing the styryl compound mentioned above. The organic layer of double hetero structure consists of hole transporting layers and electron transporting layers which are sequentially laminated one over another. The emitting layer may be a layer of mixture containing the styryl compound mentioned above.

The layer of mixture should preferably contain the styryl compound in a mixing ratio of 5 to 90 wt %. If two or more styryl compounds are used in combination, the luminescent region in which luminescence takes place through recombination of holes and electrons emerges not only in the interface but also throughout the emitting layer. The luminescent region emerging throughout the emitting layer contributes to the reliability of the element.

Figure 3:
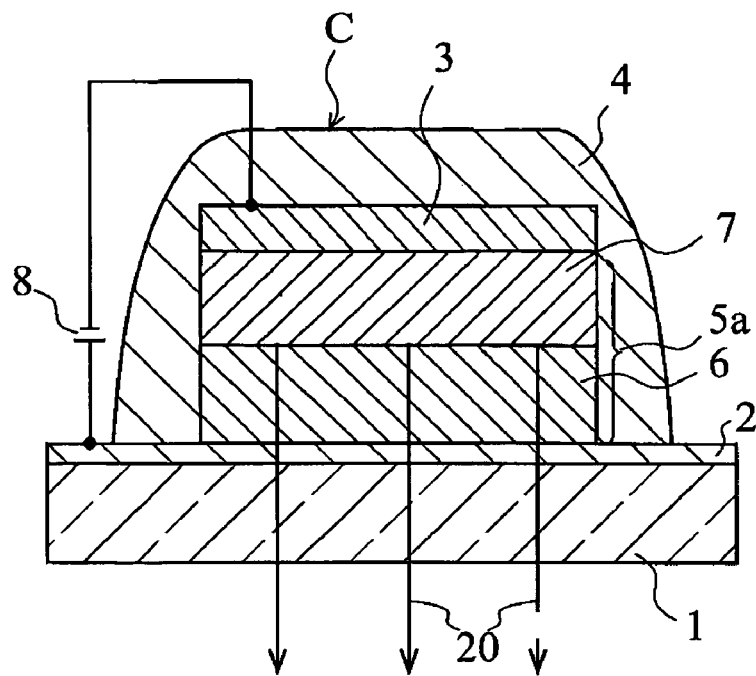
FIG. 3 is a schematic sectional view showing important parts of the organic electroluminescent element in further another example according to the present invention.

FIG. 3 shows Example (C) of the organic electroluminescent element (bottom emitting type) of single hetero structure. It consists of a transparent substrate 1, a transparent anode 2, an organic layer 5a (consisting of a hole transporting layer 6 and an electron transporting layer 7), and a cathode 3, which are sequentially laminated one over another. The laminate structure is sealed with a sealing layer 4.

The organic electroluminescent element shown in FIG. 3 has no emitting layer; it emits light 20 of prescribed wavelength from the interface between the hole transporting layer 6 and the electron transporting layer 7. This light is visible through the substrate 1.

Figure 4:
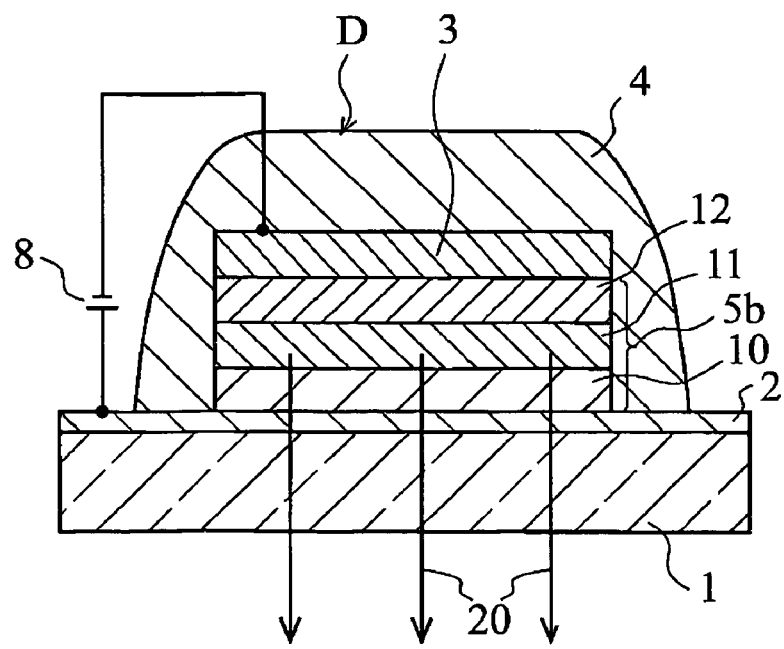
FIG. 4 is a schematic sectional view showing important parts of the organic electroluminescent element in further another example according to the present invention.

FIG. 4 shows Example (D) of the organic electroluminescent element (bottom emitting type) of double hetero structure. It consists of a transparent substrate 1, a transparent anode 2, an organic layer 5b (consisting of a hole transporting layer 10, an emitting layer 11, and an electron transporting layer 12), and a cathode 3, which are sequentially laminated one over another. The laminate structure is sealed with a sealing layer 4.

The organic electroluminescent element shown in FIG. 4 works in such a way that direct current applied across the anode 2 and the cathode 3 injects holes through the anode 2 and electrons through the cathode 3, thereby causing the injected holes to reach the emitting layer 11 through the hole transporting layer 10 and also causing the injected electrons to reach the emitting layer 11 through the electron transporting layer 12. As the result, recombination of electrons and holes takes place in the emitting layer 11, thereby giving excitons to emit light of prescribed wavelengths.

In the above-mentioned examples (C) and (D) of organic electroluminescent element, the following materials can be used as the hole transporting material which have the charge transporting capability.

Benzidine, styrylamine, triphenylmethane, porphyrin, triazole, imidazole, oxadiazole, polyarylalkane, phenylenediamine, arylamine, oxazole, anthracene, fluorenone, hydrazone, and stilbene, and derivatives thereof; and heterocyclic conjugate compounds, such as polysilane-based compounds, vinylcarbazole-based compounds, thiophene-based compounds, and aniline-based compounds, in the form of monomer, oligomer, or polymer. (The same shall apply hereinafter.)

Their typical examples include α-naphthylphenyldiamine, porphyrin, metal tetraphenylporphyrin, metal naphthalocyanine, 4,4',4"-trimethyltriphenylamine, 4,4',4"-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilben, poly(paraphenylenevinylene), poly(thiophenevinylene), and poly(2,2'-thienylpyrrole). They are merely exemplary.

Also, the following materials can be used as the electron transporting material which have the charge transporting capability. Quinoline, perylene, bisstyryl, and pyrazine, and derivatives thereof. (The same shall apply hereinafter.) Their typical examples include 8-hydroxyquinoline aluminum ($Alq_3$), anthracene, naphthalene, phenanthrene, pyrene, chrysene, perylene, butadiene, coumarin, acridine, and stilbene, and derivatives thereof.

The substrate 1 may be formed from any transparent material such as glass and plastics. One substrate may be used in common for the elements (of laminate structure as shown in FIGS. 3 and 4) arranged in matrix. Also, the organic electroluminescent elements and other elements may be arranged on the same substrate.

The anode 2 is a transparent electrode, which is made of ITO or $SnO_2$. A thin film may optionally be interposed between the anode 2 and the hole transporting layer 6 or 10. This thin film is made of an inorganic compound, an organic compound, or an organometallic compound, such as 2-TNATA (4,4',4"-tris(2-naphthylphenylamino)triphenylamine) and porphyrin compound (mentioned in U.S. Pat. No. 4,720,432). It is intended to improve the efficiency of charge injection. In addition, in the case where the sealing layer 4 is formed from a conducting material (like metal), an insulating film may optionally be formed on the lateral face of the anode 2.

In the case of Example (C) of the organic electroluminescent element, the organic layer 5a is a laminate layer consisting of the hole transporting layer 6 and the electron transporting layer 7. Either or both of them may be a mixture layer containing the styryl compound mentioned above, so that they are made to emit light. In the case of Example (D) of the organic electroluminescent element, the organic layer 5b is a laminate layer consisting of the hole transporting layer 10, the emitting layer 11 of a mixture containing the styryl compound mentioned above, and the electron transporting layer 12. The layer structure may be modified variously, such that, for example, either or both of the hole transporting layer and the electron transporting layer are made to emit light.

The hole transforming layer may be formed from two or more hole transporting materials laminated one over the other for improvement in hole transporting performance.

In the case of Example (C) of the organic electroluminescent element, the electron transporting layer 7 function as the emitting layer; however, emission may take place in the hole transporting layer 6 or the interface thereof depending on voltage supplied from the power source 8. Likewise, in the case of Example (D) of the organic electroluminescent element, the emitting layer may be the electron transporting layer 12 or the hole transporting layer 10 in addition to the emitting layer 11. A desired layer structure for improved light emitting performance is such that the emitting layer 11 (containing at least one species of fluorescent material) is interposed between the hole transporting layer and the electron transporting layer. Alternatively, this fluorescent material may be incorporated into either or both of the hole transporting layer and the electron transporting layer. In this case, the layer structure may have an additional thin layer (which is a hole blocking layer or an exciton generating layer) to control hole transport or electron transport.

The cathode 3 may be a single layer formed from an alloy of such active metal as Li, Mg, and Ca and such inactive metal as Ag, Al, and In. It may also be a laminate layer composed of the active metal and the inactive metal. The thickness and material of the cathode should be adequately selected according to the use of the organic electroluminescent element.

The sealing layer 4 (which functions as a sealing film) entirely covers the organic electroluminescent element so as to improve the charge injecting efficiency and the light emitting efficiency. It may be formed from metal (such as aluminum, gold, and chromium), alloy thereof, silicon compound (such as silicon oxide and silicon nitride), organic compound, or the like, which keeps airtightness.

Figure 5:
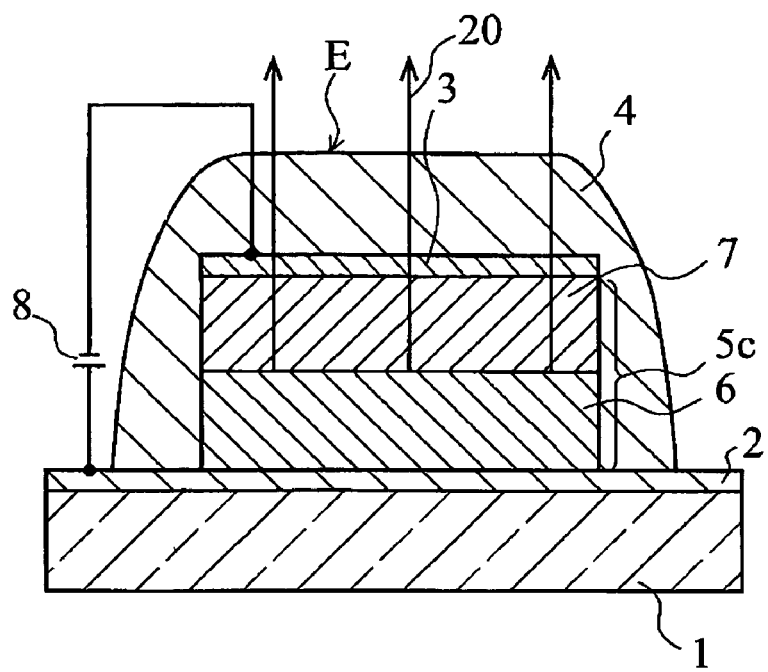
FIG. 5 is a schematic sectional view showing important parts of the organic electroluminescent element in further another example according to the present invention.

FIG. 5 shows Example (E) of the organic electroluminescent element (top emitting type) of single hetero structure. The element consists of a substrate 1, an anode 2, an organic layer 5c (consisting of a hole transporting layer 6 and an electron transporting layer 7), and a transparent or translucent cathode 3, which are sequentially laminated one over another. The laminate structure is sealed with a sealing layer 4. In this case, light 20 of prescribed wavelength is emitted from the interface between the hole transporting layer 6 and the electron transporting layer 7. This light is visible through the cathode 3 or the sealing layer 4.

Figure 6:
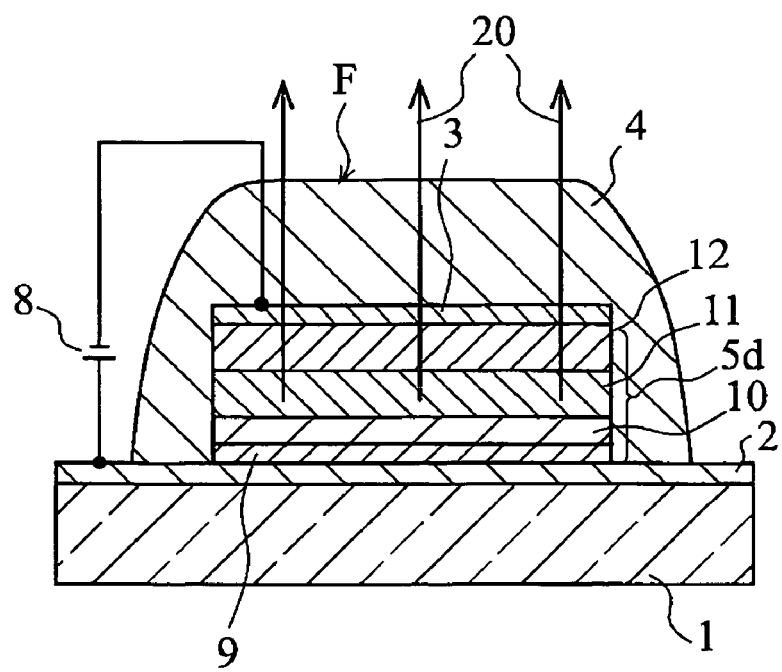
FIG. 6 is a schematic sectional view showing important parts of the organic electroluminescent element in further another example according to the present invention.

FIG. 6 shows Example (F) of the organic electroluminescent element (top emitting type), which consists of a substrate 1, an anode 2, an organic layer 5d (consisting of a hole injecting layer 9, a hole transporting layer 10, an emitting layer 11, and an electron transporting layer 12), and a transparent or translucent cathode 3, which are sequentially laminated one over another. The laminate structure is sealed with a sealing layer 4. As in the organic electroluminescent element shown in FIG. 4, recombination of electrons and holes takes place in the emitting layer 11, thereby giving excitons to emit light of prescribed wavelengths.

In Examples (E) and (F) of the organic electroluminescent element, the substrate 1 may be formed from any reflecting material such as Ag, Au, Al, Cr, In, and alloy thereof. One substrate may be used in common for the elements (of laminate structure as shown in FIGS. 5 and 6) arranged in matrix. Also, the organic electroluminescent elements and other elements may be arranged on the same substrate.

The anode 2 on the substrate 1 is a reflecting electrode made of Ag, Au, Al, Cr, In, or alloy thereof. It may also be formed by laminating ITO or the like. The thickness of the anode 2 should preferably be no less than 50 nm and no more than 200 nm in consideration of film formability and reflection. In the case where the reflecting anode is used, the substrate 1 may be formed from not only the reflecting material mentioned above but also a transparent or translucent material such as glass.

As shown in FIG. 6, the hole injecting layer 9 (made of inorganic or organic compound or organometallic compound) may optionally be interposed between the anode 2 and the hole transporting layer 10 in order to improve the charge injecting efficiency. Likewise, in FIG. 5, the hole injecting layer 9 (not shown) may be interposed between the anode 2 and the hole transporting layer 6. Incidentally, in the case where the sealing layer 4 is formed from a conducting material (such as metal), an insulating film may be formed for isolation on the lateral face of the anode 2.

In Example (E) of the organic electroluminescent element, the organic layer 5c is a laminated organic layer consisting of the hole transporting layer 6 and the electron transporting layer 7. Either or both of the hole transporting layer 6 and the electron transporting layer 7 may be a mixture layer containing the styryl compound mentioned above, so that they are made to emit light. In Example (F) of the organic electroluminescent element, the organic layer 5d is a laminated organic layer consisting of the hole transporting layer 10, the emitting layer 11 of a mixture containing the styryl compound mentioned above, and the electron transporting layer 12. The layer structure may be modified variously, such that, for example, either or both of the hole transporting layer and the electron transporting layer are made to emit light.

The hole transforming layer may be formed from two or more hole transporting materials laminated one over the other for improvement in hole transporting performance.

In Example (E) of the organic electroluminescent element, the electron transporting layer 7 functions as the emitting layer; however, emission may take place in the hole transporting layer 6 or the interface thereof depending on voltage supplied from the power source 8. Likewise, in Example (F) of the organic electroluminescent element, the emitting layer may be the electron transporting layer 12 or the hole transporting layer 10 in addition to the emitting layer 11. A desired layer structure for improved light emitting performance is such that the emitting layer 11 (containing at least one species of fluorescent material) is interposed between the hole transporting layer and the electron transporting layer. Alternatively, this fluorescent material may be incorporated into either or both of the hole transporting layer and the electron transporting layer. In this case, the layer structure may have an additional thin layer (which is a hole blocking layer or an exciton generating layer) to control hole transport or electron transport.

The cathode 3 may be a single layer formed from an alloy of such active metal as Li, Mg, and Ca and such inactive metal as Ag, Al, and In. It may also be a laminate layer composed of the active metal and the inactive metal. The thickness and material of the cathode should be adequately selected according to the use of the organic electroluminescent element. The thickness of the cathode should be 0.5 to 15 nm, preferably 0.5 to 5 nm.

The sealing layer 4 (which functions as a sealing film) entirely covers the organic electroluminescent element so as to improve the charge injecting efficiency and the light emitting efficiency. It may be formed from metal (such as aluminum, gold, and chromium), alloy thereof, silicon compound (such as silicon oxide and silicon nitride), or the like, which keeps airtightness.

In Examples (E) and (F) of the organic electroluminescent element, the emitting layer is held between the anode and the cathode; therefore, the emitted light is subject to multiple beam interference between the anode and the cathode. It is possible to positively use the effect of multiple beam interference if the anode and cathode have adequate optical properties (such as reflectance and transmittance) and the organic layer held between them has an adequate thickness. Thus, it is possible to control the wavelength of the light emitted from the organic electroluminescent element (E) or (F). In this way it is possible to improve the chromaticity of the emitted light. Incidentally, the mechanism of multiple beam interference is mentioned by J. Yamada et al. in AM-LCD Digest of Technical Papers, OD-2, p. 77 to 80 (2002).

The organic electroluminescent elements mentioned above are usually actuated by application of direct current. However, pulsed current or alternating current may also be used. Any amperage and voltage are allowable unless the element is broken. However, efficient light emission with a minimum electric energy is desirable in view of the power consumption and life of the organic electroluminescent element.

Figure 7:
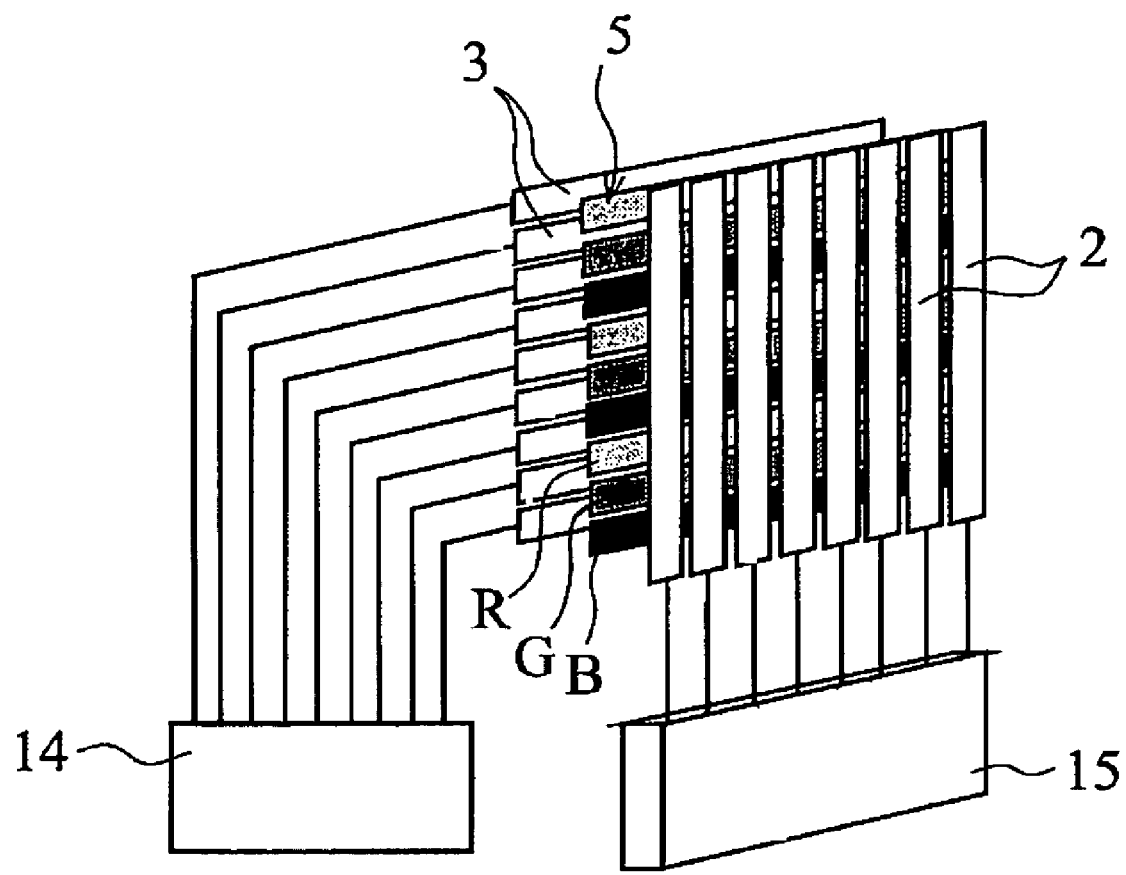
FIG. 7 is a diagram showing the structure of the full-color flat panel display incorporated with the organic electroluminescent element.

FIG. 7 is a diagram showing the structure of a flat panel display with the organic electroluminescent elements according to the present invention. As shown in the figure, for example, a full color flat panel display consists of the anode 2 and the cathode 3 and the organic layer 5 held between them. The organic layer 5 is any of the organic layers 5a, 5b, 5c, and 5d, which is capable of emitting three primary colors, red (R), green (G), and blue (B). The anodes 2 and the cathodes 3 are mutually crossing narrow strips. They are selected by the luminance signal circuit 14 and the control circuit 15 containing shift registers, so that the selected electrodes are given signal voltage. Thus, the organic layer emits light at the position (or pixel) where the selected anode 2 crosses the cathode 3.

The flat display panel shown in FIG. 7 is of simple matrix type (8×3 RGB). It is constructed such that the organic layer 5, which is at least any one of the hole transporting layer, the emitting layer, and the electron transporting layer, is held between the anode 2 and the cathode 3. (Refer to FIG. 3 or 4, and FIG. 5 or 6.) The anodes and the cathodes are patterned in a narrow strip, with the former crossing the latter at right angles to form a matrix. They sequentially receive signal voltage from the luminance signal circuit 14 and the control circuit 15 containing shift register, so that light emission takes place at the intersecting points. The EL element constructed as mentioned above can be used not only as a display for letters and codes but also as an image reproducing device. An alternative is a multi-color or full color flat panel display of all solid type in which each of the anode 2 and the cathode 3 in stripy pattern is assigned to red (R), green (G), and blue (B). The EL element is capable of simple matrix drive as well as active matrix drive.

Now, the present invention will be described with reference to the following examples, which are not intended to restrict the scope thereof.

EXAMPLE 1

This example demonstrates an organic electroluminescent element (bottom emitting type) of single hetero structure in which the hole transporting layer which functions also as the emitting layer (hole transporting and emitting layer) is formed from a mixture of an aminostyryl compound represented by the structural formula (17)-11 below (which is one of the styryl compounds represented by the general formula [I] given above) and α-NPD (α-naphthylphenyldiamine).

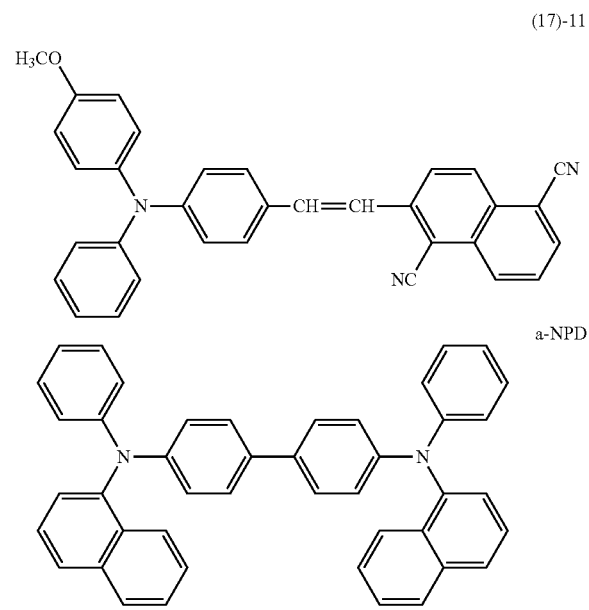

First, a glass substrate, measuring 30 mm by 30 mm, was placed in a vacuum deposition apparatus. This glass substrate has an anode of ITO film (100 nm thick) formed on one surface thereof. The glass substrate underwent vacuum deposition at $10^{-4}$ Pa or less, with a metal mask arranged close thereto, which has a plurality of openings, each measuring 2.0 mm by 2.0 mm. The vacuum deposition gave rise to a 50-nm thick hole transporting layer (which functions also as the emitting layer) composed of the styryl compound represented by the structural formula (17)-11 given above and α-NPD as the hole transporting material in a ratio of 1:1 by weight. The rate of deposition was adjusted to 0.1 nm/s for each component.

Then, on the hole transporting layer was formed a 50-nm thick electron transporting layer by vacuum deposition from $Alq_3$ (tris(8-quinolinol)aluminum) represented by the structural formula below. The rate of deposition was adjusted to 0.2 nm/s.

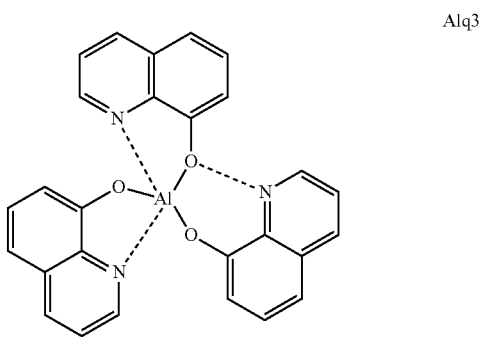

A 200-nm thick cathode was formed by vacuum deposition from Mg and Ag in a mixing ratio of 1:3. In this way, there was obtained the organic electroluminescent element of an Example 1 as shown in FIG. 3.

The thus obtained organic electroluminescent element of an Example 1 was tested for light-emitting characteristics by application of forward bias direct current in an atmosphere of nitrogen. It emitted a red light, which was found by spectrometry to have a peak at about 620 nm. Spectrometry was carried out by using a spectroscope (made by Otsuka Electronics Co., Ltd.) which is equipped with a detector of photodiode array. It gave a luminance of 1500 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 2500 hours for luminance to decrease by half.

EXAMPLE 2

This example demonstrates an organic electroluminescent element (bottom emitting type) of single hetero structure in which the electron transporting layer which functions also as the emitting layer (electron transporting and emitting layer) is formed from a mixture of a styryl compound represented by the structural formula (17)-11 given above (which is one of the styryl compounds represented by the general formula [I] given above) and $Alq_3$ represented by the structural formula given above.

First, a glass substrate, measuring 30 mm by 30 mm, was placed in a vacuum deposition apparatus. This glass substrate has an anode of ITO film (100 nm thick) formed on one surface thereof. The glass substrate underwent vacuum deposition at $10^{-4}$ Pa or less, with a metal mask arranged close thereto, which has a plurality of openings, each measuring 2.0 mm by 2.0 mm. The vacuum deposition gave rise to a 50-nm thick layer of α-NPD represented by the structural formula given above. The rate of deposition was adjusted to 0.1 nm/s.

Then, on the hole transporting layer was formed a 50-nm thick electron transporting and emitting layer by vacuum deposition from a mixture of an aminostyryl compound represented by the structural formula (17)-11 given above and Alq$_3$ as an electron transporting material in a mixing ratio of 1:1 by weight. The rate of deposition was adjusted to 0.2 nm/s for each component.

A 200-nm thick cathode was formed by vacuum deposition from Mg and Ag in a mixing ratio of 1:3. In this way, there was obtained the organic electroluminescent element of an Example 2 as shown in FIG. 3.

The thus obtained organic electroluminescent element was tested for light-emitting characteristics by application of forward bias direct current in an atmosphere of nitrogen. It emitted a red light, which was found by spectrometry (as in Example 1) to have a peak at about 620 nm. It gave a luminance of 2600 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 2700 hours for luminance to decrease by half.

EXAMPLE 3

This example demonstrates an organic electroluminescent element (bottom emitting type) of double hetero structure in which the electron transporting and emitting layer is formed from a mixture of a styryl compound represented by the structural formula (17)-11 given above (which is one of the styryl compounds represented by the general formula [I] given above) and Alq$_3$ represented by the structural formula given above.

First, a glass substrate, measuring 30 mm by 30 mm, was placed in a vacuum deposition apparatus. This glass substrate has an anode of ITO film (100 nm thick) formed on one surface thereof. The glass substrate underwent vacuum deposition at $10^{-4}$ Pa or less, with a metal mask arranged close thereto, which has a plurality of openings, each measuring 2.0 mm by 2.0 mm. The vacuum deposition gave rise to a 30-nm thick layer of α-NPD represented by the structural formula given above. The rate of deposition was adjusted to 0.2 nm/s.

Then, on the hole transporting layer was deposited an emitting material which is a mixture of the styryl compound represented by the structural formula (17)-11 given above and Alq$_3$ in a mixing ratio of 1:1 by weight. Thus there was formed a 30-nm thick emitting layer consisting of the styryl compound represented by the structural formula (17)-11 given above and Alq$_3$. The rate of deposition was adjusted to 0.2 nm/s for each component.

Vacuum deposition was performed on the emitting layer with Alq$_3$ represented by the structural formula given above as an electron transporting material. There was formed a 30-nm thick Alq$_3$ film. The rate of deposition was adjusted to 0.2 nm/s.

A 200-nm thick cathode was formed by vacuum deposition from Mg and Ag in a mixing ratio of 1:3. In this way, there was obtained the organic electroluminescent element of an Example 3 as shown in FIG. 4.

The thus obtained organic electroluminescent element was tested for light-emitting characteristics by application of forward bias direct current in an atmosphere of nitrogen. It emitted a red light, which was found by spectrometry (as in Example 1) to have a peak at 620 nm. It gave a luminance of 3200 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3500 hours for luminance to decrease by half.

EXAMPLE 4

This example demonstrates an organic electroluminescent element (bottom emitting type) of double hetero structure in which the emitting layer is formed from a mixture of a styryl compound represented by the structural formula (17)-11 given above and a styryl compound represented by the structural formula (17)-1 below, both styryl compounds being the members of the styryl compounds represented by the general formula [I] given above.

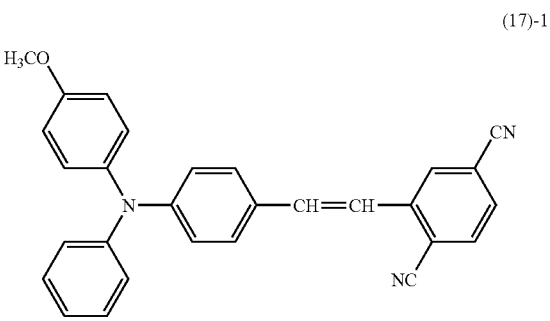

(17)-1

First, a glass substrate, measuring 30 mm by 30 mm, was placed in a vacuum deposition apparatus. This glass substrate has an anode of ITO film (100 nm thick) formed on one surface thereof. The glass substrate underwent vacuum deposition at $10^{-4}$ Pa or less, with a metal mask arranged close thereto, which has a plurality of openings, each measuring 2.0 mm by 2.0 mm. The vacuum deposition gave rise to a 30-nm thick layer of α-NPD represented by the structural formula given above. The rate of deposition was adjusted to 0.2 nm/s.

Then, on the hole transporting layer was codeposited an emitting material which is a mixture of the styryl compound represented by the structural formula (17)-11 given above and the styryl compound represented by the structural formula (17)-1 given above in a mixing ratio of 1:3 by weight. Thus there was formed a 30-nm thick emitting layer consisting of the styryl compound represented by the structural formula (17)-11 given above and the styryl compound represented by the structural formula (17)-1 given above. The rate of deposition was adjusted to 0.1 nm/s for the first component and 0.3 nm/s for the second component.

Vacuum deposition was performed on the emitting layer with Alq$_3$ represented by the structural formula given above as an electron transporting material. There was formed a 30-nm thick Alq$_3$ film. The rate of deposition was adjusted to 0.2 nm/s.

A 200-nm thick cathode was formed by vacuum deposition from Mg and Ag in a mixing ratio of 1:3. In this way, there was obtained the organic electroluminescent element of an Example 4 as shown in FIG. 4.

The thus obtained organic electroluminescent element of an Example 4 was tested for light-emitting characteristics by application of forward bias direct current in an atmosphere of nitrogen. It emitted an orange light, which was found by spectrometry (as in Example 1) to have a peak at 610 nm. It gave a luminance of 2200 cd/m$^2$ at 8 V.

The sample showed no sign of degradation after standing for 1 month in an atmosphere of nitrogen. The accelerated test for degradation, in which current to produce the initial lumi-

EXAMPLE 5

This example demonstrates an organic electroluminescent element (bottom emitting type) of single hetero structure in which the electron transporting and emitting layer is formed from a mixture of a styryl compound represented by the structural formula (17)-1 given above (which is one of the styryl compounds represented by the general formula [I] given above) and $Alq_3$ represented by the structural formula given above.

The organic electroluminescent element conforms to the layer structure and film forming method mentioned in Example 2.

The thus obtained organic electroluminescent element of an Example 5 was tested for light-emitting characteristics by application of forward bias direct current in an atmosphere of nitrogen. It emitted an orange light, which was found by spectrometry (as in Example 1) to have a peak at about 608 nm. It gave a luminance of 1000 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 800 hours for luminance to decrease by half.

EXAMPLE 6

This example demonstrates an organic electroluminescent element (bottom emitting type) of single hetero structure in which the electron transporting and emitting layer is formed from a mixture of a styryl compound represented by the structural formula (17)-2 below (which is one of the styryl compounds represented by the general formula [I] given above) and $Alq_3$ represented by the structural formula given above.

(17)-2

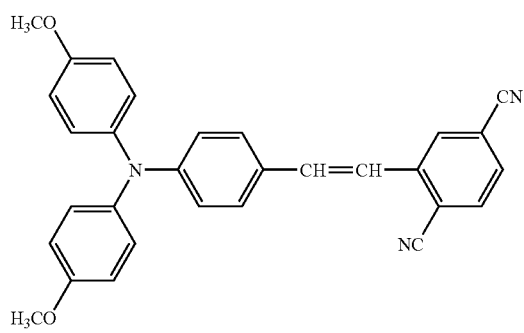

The organic electroluminescent element conforms to the layer structure and film forming method mentioned in Example 2.

The thus obtained organic electroluminescent element of an Example 6 was tested for light-emitting characteristics by application of forward bias direct current in an atmosphere of nitrogen. It emitted an orange light, which was found by spectrometry (as in Example 1) to have a peak at about 610 nm. It gave a luminance of 500 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 700 hours for luminance to decrease by half.

EXAMPLE 7

This example demonstrates an organic electroluminescent element (bottom emitting type) of single hetero structure in which the electron transporting and emitting layer is formed from a mixture of a styryl compound represented by the structural formula (17)-3 below (which is one of the styryl compounds represented by the general formula [I] given above) and $Alq_3$ represented by the structural formula given above.

(17)-3

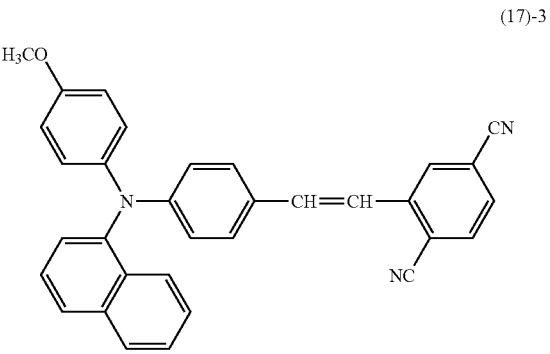

The organic electroluminescent element conforms to the layer structure and film forming method mentioned in Example 2.

The thus obtained organic electroluminescent element of an Example 7 was tested for light-emitting characteristics by application of forward bias direct current in an atmosphere of nitrogen. It emitted an orange light, which was found by spectrometry (as in Example 1) to have a peak at about 605 nm. It gave a luminance of 1200 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 1100 hours for luminance to decrease by half.

EXAMPLE 8

This example demonstrates an organic electroluminescent element (bottom emitting type) of single hetero structure in which the electron transporting and emitting layer is formed from a mixture of a styryl compound represented by the structural formula (17)-4 below (which is one of the styryl compounds represented by the general formula [I] given above) and $Alq_3$ represented by the structural formula given above.

(17)-4

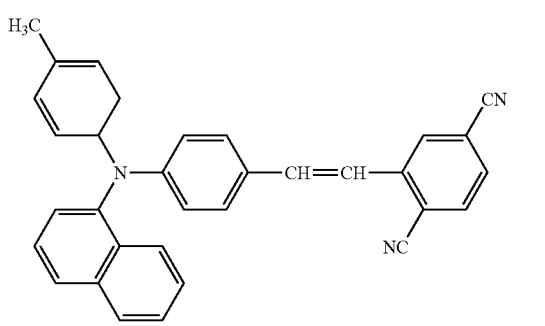

The organic electroluminescent element conforms to the layer structure and film forming method mentioned in Example 2.

The thus obtained organic electroluminescent element of an Example 8 was tested for light-emitting characteristics by application of forward bias direct current in an atmosphere of nitrogen. It emitted an orange light, which was found by spectrometry (as in Example 1) to have a peak at about 600 nm. It gave a luminance of 1000 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1400 hours for luminance to decrease by half.

EXAMPLE 9

This example demonstrates an organic electroluminescent element (bottom emitting type) of single hetero structure in which the electron transporting and emitting layer is formed from a mixture of a styryl compound represented by the structural formula (17)-5 below (which is one of the styryl compounds represented by the general formula [I] given above) and Alq₃ represented by the structural formula given above.

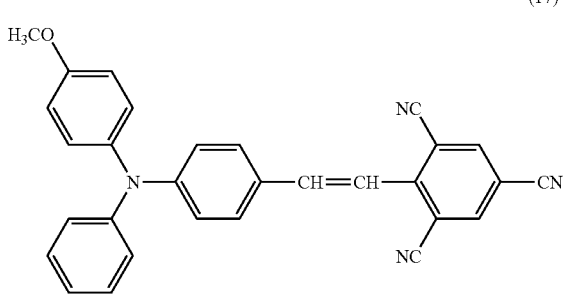
(17)-5

The organic electroluminescent element conforms to the layer structure and film forming method mentioned in Example 2.

The thus obtained organic electroluminescent element of an Example 9 was tested for light-emitting characteristics by application of forward bias direct current in an atmosphere of nitrogen. It emitted an orange light, which was found by spectrometry (as in Example 1) to have a peak at about 615 nm. It gave a luminance of 900 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 850 hours for luminance to decrease by half.

EXAMPLE 10

This example demonstrates an organic electroluminescent element (bottom emitting type) of single hetero structure in which the electron transporting and emitting layer is formed from a mixture of a styryl compound represented by the structural formula (17)-6 below (which is one of the styryl compounds represented by the general formula [I] given above) and Alq₃ represented by the structural formula given above.

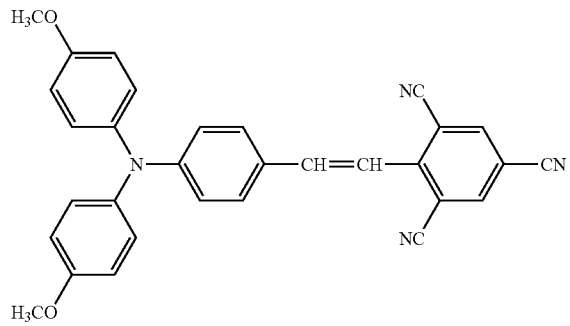
(17)-6

The organic electroluminescent element conforms to the layer structure and film forming method mentioned in Example 2.

The thus obtained organic electroluminescent element of an Example 10 was tested for light-emitting characteristics by application of forward bias direct current in an atmosphere of nitrogen. It emitted a red light, which was found by spectrometry (as in Example 1) to have a peak at about 620 nm. It gave a luminance of 800 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 700 hours for luminance to decrease by half.

EXAMPLE 11

This example demonstrates an organic electroluminescent element (bottom emitting type) of single hetero structure in which the electron transporting and emitting layer is formed from a mixture of a styryl compound represented by the structural formula (17)-7 below (which is one of the styryl compounds represented by the general formula [I] given above) and Alq₃ represented by the structural formula given above.

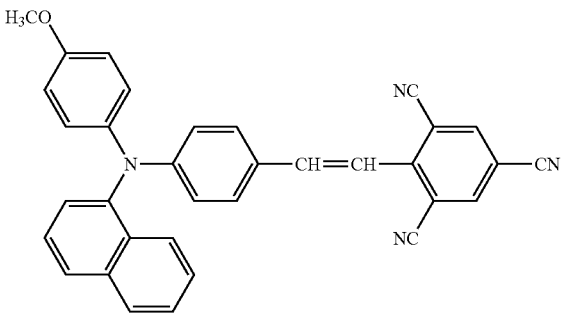
(17)-7

The organic electroluminescent element conforms to the layer structure and film forming method mentioned in Example 2.

The thus obtained organic electroluminescent element of an Example 11 was tested for light-emitting characteristics by application of forward bias direct current in an atmosphere of nitrogen. It emitted an orange light, which was found by spectrometry (as in Example 1) to have a peak at about 615 nm. It gave a luminance of 1100 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1000 hours for luminance to decrease by half.

EXAMPLE 12

This example demonstrates an organic electroluminescent element (bottom emitting type) of single hetero structure in which the electron transporting and emitting layer is formed from a mixture of a styryl compound represented by the structural formula (17)-8 below (which is one of the styryl compounds represented by the general formula [I] given above) and Alq₃ represented by the structural formula given above.

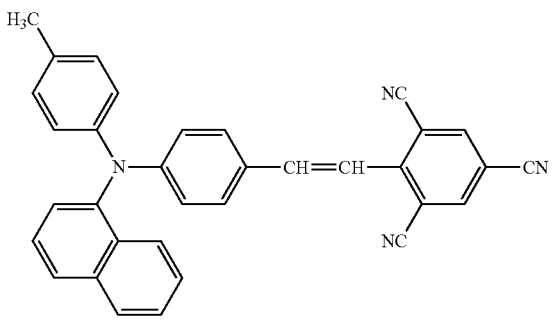

(17)-8

The organic electroluminescent element conforms to the layer structure and film forming method mentioned in Example 2.

The thus obtained organic electroluminescent element of an Example 12 was tested for light-emitting characteristics by application of forward bias direct current in an atmosphere of nitrogen. It emitted an orange light, which was found by spectrometry (as in Example 1) to have a peak at about 610 nm. It gave a luminance of 950 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1300 hours for luminance to decrease by half.

EXAMPLE 13

This example demonstrates an organic electroluminescent element (bottom emitting type) of single hetero structure in which the electron transporting and emitting layer is formed from a mixture of a styryl compound represented by the structural formula (17)-9 below (which is one of the styryl compounds represented by the general formula [I] given above) and Alq₃ represented by the structural formula given above.

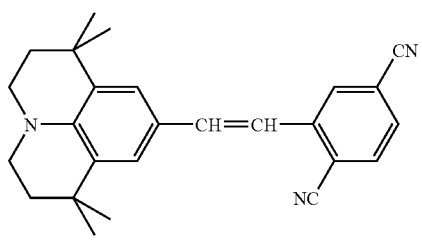

(17)-9

The organic electroluminescent element conforms to the layer structure and film forming method mentioned in Example 2.

The thus obtained organic electroluminescent element of an Example 13 was tested for light-emitting characteristics by application of forward bias direct current in an atmosphere of nitrogen. It emitted an orange light, which was found by spectrometry (as in Example 1) to have a peak at about 605 nm. It gave a luminance of 850 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 650 hours for luminance to decrease by half.

EXAMPLE 14

This example demonstrates an organic electroluminescent element (bottom emitting type) of single hetero structure in which the electron transporting and emitting layer is formed from a mixture of a styryl compound represented by the structural formula (17)-10 below (which is one of the styryl compounds represented by the general formula [I] given above) and Alq₃ represented by the structural formula given above.

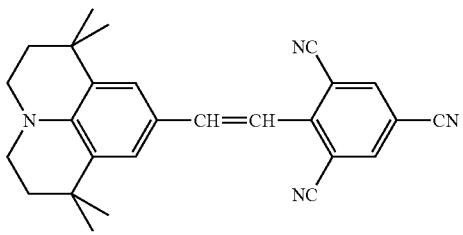

(17)-10

The organic electroluminescent element conforms to the layer structure and film forming method mentioned in Example 2.

The thus obtained organic electroluminescent element of an Example 14 tested for light-emitting characteristics by application of forward bias direct current in an atmosphere of nitrogen. It emitted an orange light, which was found by spectrometry (as in Example 1) to have a peak at about 610 nm. It gave a luminance of 750 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 500 hours for luminance to decrease by half.

EXAMPLE 15

This example demonstrates an organic electroluminescent element (bottom emitting type) of single hetero structure in which the electron transporting and emitting layer is formed from a mixture of a styryl compound represented by the structural formula (17)-12 below (which is one of the styryl compounds represented by the general formula [I] given above) and Alq₃ represented by the structural formula given above.

(17)-12

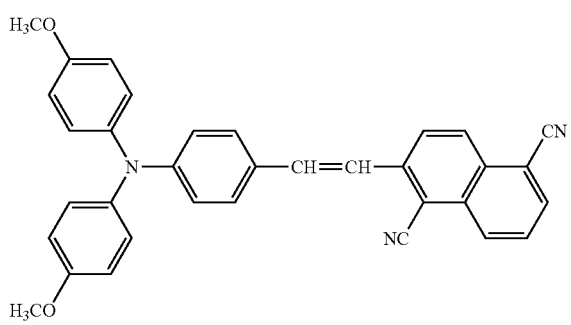

The organic electroluminescent element conforms to the layer structure and film forming method mentioned in Example 2.

The thus obtained organic electroluminescent element of an Example 15 was tested for light-emitting characteristics by application of forward bias direct current in an atmosphere of nitrogen. It emitted a red light, which was found by spectrometry (as in Example 1) to have a peak at about 625 nm. It gave a luminance of 1000 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1500 hours for luminance to decrease by half.

EXAMPLE 16

This example demonstrates an organic electroluminescent element (bottom emitting type) of single hetero structure in which the electron transporting and emitting layer is formed from a mixture of a styryl compound represented by the structural formula (17)-13 below (which is one of the styryl compounds represented by the general formula [I] given above) and Alq$_3$ represented by the structural formula given above.

(17)-13

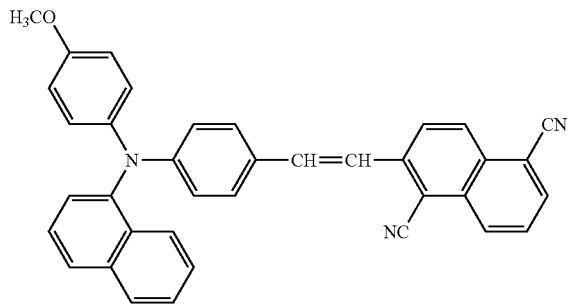

The organic electroluminescent element conforms to the layer structure and film forming method mentioned in Example 2.

The thus obtained organic electroluminescent element of an Example 16 was tested for light-emitting characteristics by application of forward bias direct current in an atmosphere of nitrogen. It emitted an orange light, which was found by spectrometry (as in Example 1) to have a peak at about 610 nm. It gave a luminance of 2000 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 2800 hours for luminance to decrease by half.

EXAMPLE 17

This example demonstrates an organic electroluminescent element (bottom emitting type) of single hetero structure in which the electron transporting and emitting layer is formed from a mixture of a styryl compound represented by the structural formula (17)-14 below (which is one of the styryl compounds represented by the general formula [I] given above) and Alq$_3$ represented by the structural formula given above.

(17)-14

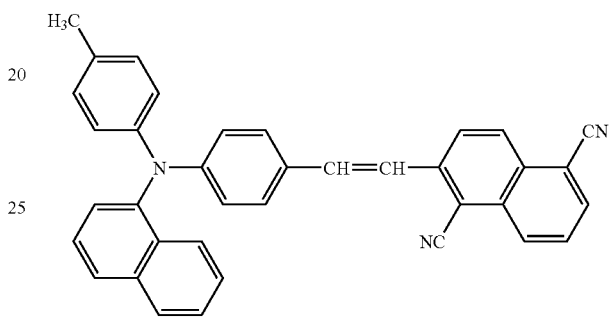

The organic electroluminescent element conforms to the layer structure and film forming method mentioned in Example 2.

The thus obtained organic electroluminescent element of an Example 17 was tested for light-emitting characteristics by application of forward bias direct current in an atmosphere of nitrogen. It emitted an orange light, which was found by spectrometry (as in Example 1) to have a peak at about 605 nm. It gave a luminance of 1800 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3300 hours for luminance to decrease by half.

EXAMPLE 18

This example demonstrates an organic electroluminescent element (bottom emitting type) of single hetero structure in which the electron transporting and emitting layer is formed from a mixture of a styryl compound represented by the structural formula (17)-15 below (which is one of the styryl compounds represented by the general formula [I] given above) and Alq$_3$ represented by the structural formula given above.

(17)-15

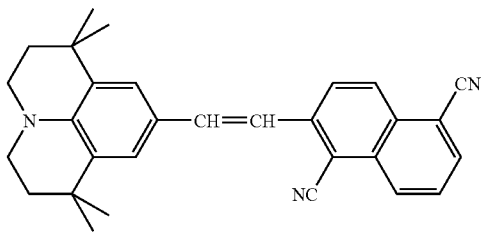

The organic electroluminescent element conforms to the layer structure and film forming method mentioned in Example 2.

The thus obtained organic electroluminescent element of an Example 18 was tested for light-emitting characteristics by application of forward bias direct current in an atmosphere of nitrogen. It emitted an orange light, which was found by spectrometry (as in Example 1) to have a peak at about 605 nm. It gave a luminance of 880 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 700 hours for luminance to decrease by half.

EXAMPLE 19

This example demonstrates an organic electroluminescent element (bottom emitting type) of single hetero structure in which the electron transporting and emitting layer is formed from a mixture of a styryl compound represented by the structural formula (17)-16 below (which is one of the styryl compounds represented by the general formula [I] given above) and Alq₃ represented by the structural formula given above.

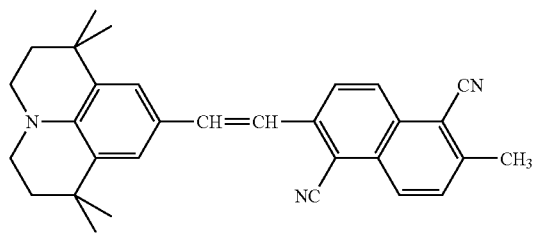

(17)-16

The organic electroluminescent element conforms to the layer structure and film forming method mentioned in Example 2.

The thus obtained organic electroluminescent element of an Example 19 was tested for light-emitting characteristics by application of forward bias direct current in an atmosphere of nitrogen. It emitted an orange light, which was found by spectrometry (as in Example 1) to have a peak at about 605 nm. It gave a luminance of 900 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 850 hours for luminance to decrease by half.

EXAMPLE 20

This example demonstrates an organic electroluminescent element (bottom emitting type) of single hetero structure in which the electron transporting and emitting layer is formed from a mixture of a styryl compound represented by the structural formula (17)-17 below (which is one of the styryl compounds represented by the general formula [I] given above) and Alq₃ represented by the structural formula given above.

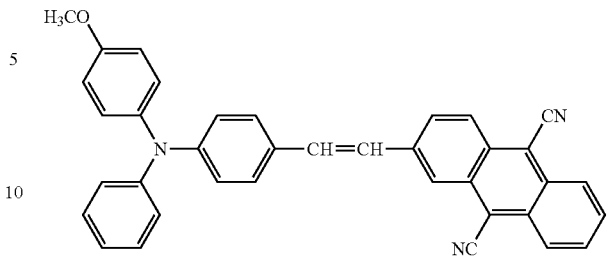

(17)-17

The organic electroluminescent element conforms to the layer structure and film forming method mentioned in Example 2.

The thus obtained organic electroluminescent element of an Example 20 was tested for light-emitting characteristics by application of forward bias direct current in an atmosphere of nitrogen. It emitted a red light, which was found by spectrometry (as in Example 1) to have a peak at about 700 nm. It gave a luminance of 250 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 350 hours for luminance to decrease by half.

EXAMPLE 21

This example demonstrates an organic electroluminescent element (bottom emitting type) of single hetero structure in which the electron transporting and emitting layer is formed from a mixture of a styryl compound represented by the structural formula (17)-18 below (which is one of the styryl compounds represented by the general formula [I] given above) and Alq₃ represented by the structural formula given above.

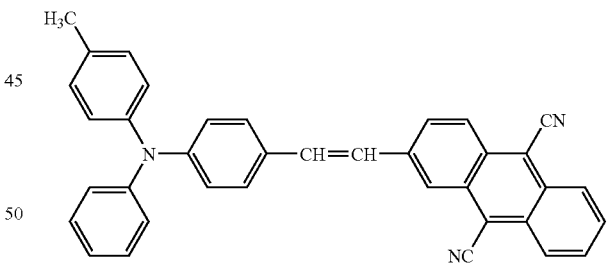

(17)-18

The organic electroluminescent element conforms to the layer structure and film forming method mentioned in Example 2.

The thus obtained organic electroluminescent element of an Example 21 was tested for light-emitting characteristics by application of forward bias direct current in an atmosphere of nitrogen. It emitted a red light, which was found by spectrometry (as in Example 1) to have a peak at about 690 nm. It gave a luminance of 180 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 450 hours for luminance to decrease by half.

EXAMPLE 22

This example demonstrates an organic electroluminescent element (bottom emitting type) of single hetero structure in which the electron transporting and emitting layer is formed from a mixture of a styryl compound represented by the structural formula (17)-19 below (which is one of the styryl compounds represented by the general formula [I] given above) and $Alq_3$ represented by the structural formula given above.

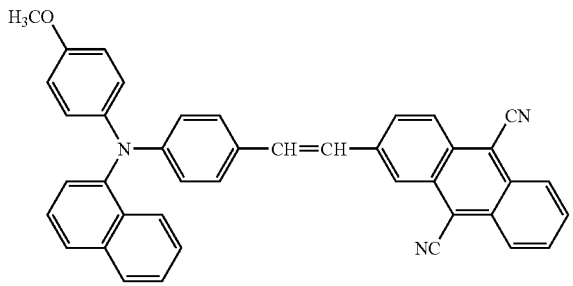

(17)-19

The organic electroluminescent element conforms to the layer structure and film forming method mentioned in Example 2.

The thus obtained organic electroluminescent element of an Example 22 was tested for light-emitting characteristics by application of forward bias direct current in an atmosphere of nitrogen. It emitted a red light, which was found by spectrometry (as in Example 1) to have a peak at about 690 nm. It gave a luminance of 330 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 390 hours for luminance to decrease by half.

EXAMPLE 23

This example demonstrates an organic electroluminescent element (bottom emitting type) of single hetero structure in which the electron transporting and emitting layer is formed from a mixture of a styryl compound represented by the structural formula (17)-20 below (which is one of the styryl compounds represented by the general formula [I] given above) and $Alq_3$ represented by the structural formula given above.

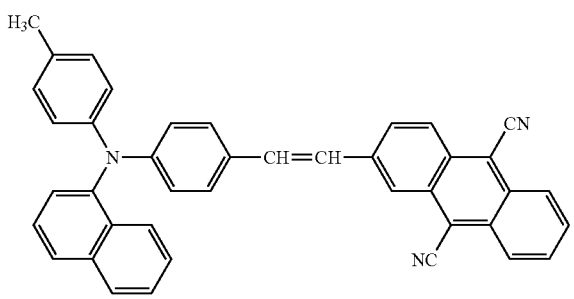

(17)-20

The organic electroluminescent element conforms to the layer structure and film forming method mentioned in Example 2.

The thus obtained organic electroluminescent element of an Example 23 was tested for light-emitting characteristics by application of forward bias direct current in an atmosphere of nitrogen. It emitted a red light, which was found by spectrometry (as in Example 1) to have a peak at about 680 nm. It gave a luminance of 280 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 500 hours for luminance to decrease by half.

EXAMPLE 24

This example demonstrates an organic electroluminescent element (bottom emitting type) of single hetero structure in which the electron transporting and emitting layer is formed from a mixture of a styryl compound represented by the structural formula (17)-21 below (which is one of the styryl compounds represented by the general formula [I] given above) and $Alq_3$ represented by the structural formula given above.

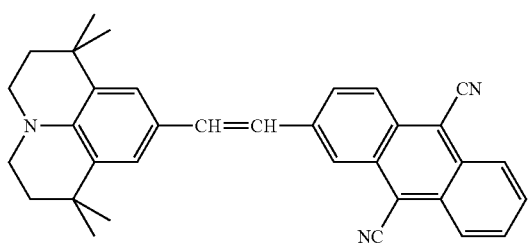

(17)-21

The organic electroluminescent element conforms to the layer structure and film forming method mentioned in Example 2.

The thus obtained organic electroluminescent element of an Example 24 was tested for light-emitting characteristics by application of forward bias direct current in an atmosphere of nitrogen. It emitted a red light, which was found by spectrometry (as in Example 1) to have a peak at about 680 nm. It gave a luminance of 220 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 210 hours for luminance to decrease by half.

EXAMPLE 25

This example demonstrates an organic electroluminescent element (bottom emitting type) of single hetero structure in which the electron transporting and emitting layer is formed from a mixture of a styryl compound represented by the structural formula (17)-22 below (which is one of the styryl compounds represented by the general formula [I] given above) and $Alq_3$ represented by the structural formula given above.

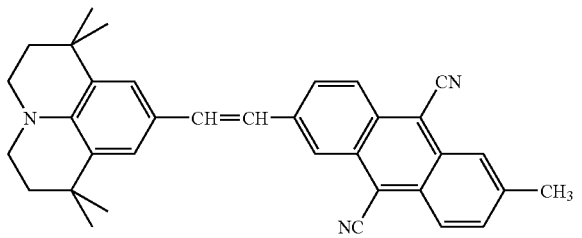

(17)-22

The organic electroluminescent element conforms to the layer structure and film forming method mentioned in Example 2.

The thus obtained organic electroluminescent element of an Example 25 was tested for light-emitting characteristics by application of forward bias direct current in an atmosphere of nitrogen. It emitted a red light, which was found by spectrometry (as in Example 1) to have a peak at about 675 nm. It gave a luminance of 240 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 240 hours for luminance to decrease by half.

EXAMPLE 26

This example demonstrates an organic electroluminescent element (bottom emitting type) of single hetero structure in which the electron transporting and emitting layer is formed from a mixture of a styryl compound represented by the structural formula (17)-23 below (which is one of the styryl compounds represented by the general formula [I] given above) and Alq$_3$ represented by the structural formula given above.

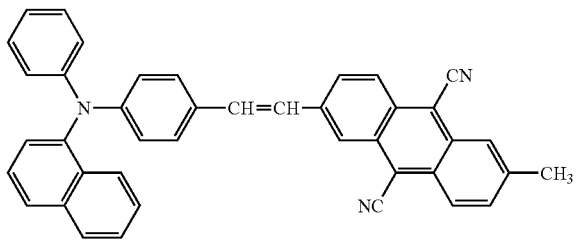

(17)-23

The organic electroluminescent element conforms to the layer structure and film forming method mentioned in Example 2.

The thus obtained organic electroluminescent element of an Example 26 was tested for light-emitting characteristics by application of forward bias direct current in an atmosphere of nitrogen. It emitted a red light, which was found by spectrometry (as in Example 1) to have a peak at about 680 nm. It gave a luminance of 260 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 320 hours for luminance to decrease by half.

EXAMPLE 27

This example demonstrates an organic electroluminescent element (bottom emitting type) of single hetero structure in which the electron transporting and emitting layer is formed from a mixture of a styryl compound represented by the structural formula (17)-24 below (which is one of the styryl compounds represented by the general formula [I] given above) and Alq$_3$ represented by the structural formula given above.

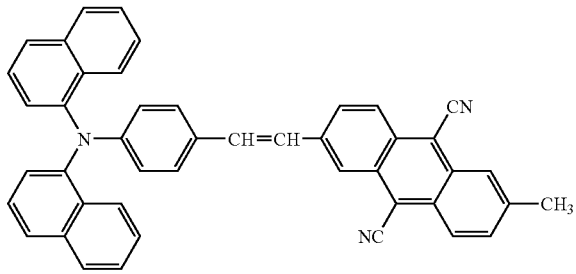

(17)-24

The organic electroluminescent element conforms to the layer structure and film forming method mentioned in Example 2.

The thus obtained organic electroluminescent element of an Example 27 was tested for light-emitting characteristics by application of forward bias direct current in an atmosphere of nitrogen. It emitted a red light, which was found by spectrometry (as in Example 1) to have a peak at about 680 nm. It gave a luminance of 180 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 280 hours for luminance to decrease by half.

EXAMPLE 28

This example demonstrates an organic electroluminescent element (bottom emitting type) of single hetero structure in which the electron transporting and emitting layer is formed from a mixture of a styryl compound represented by the structural formula (17)-25 below (which is one of the styryl compounds represented by the general formula [I] given above) and Alq$_3$ represented by the structural formula given above.

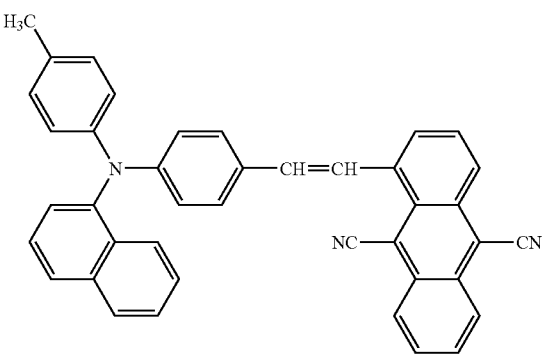

(17)-25

The organic electroluminescent element conforms to the layer structure and film forming method mentioned in Example 2.

The thus obtained organic electroluminescent element of an Example 28 was tested for light-emitting characteristics by application of forward bias direct current in an atmosphere of nitrogen. It emitted a red light, which was found by spectrometry (as in Example 1) to have a peak at about 675 nm. It gave a luminance of 340 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 600 hours for luminance to decrease by half.

EXAMPLE 29

This example demonstrates an organic electroluminescent element (bottom emitting type) of single hetero structure in which the electron transporting and emitting layer is formed from a mixture of a styryl compound represented by the structural formula (17)-26 below (which is one of the styryl compounds represented by the general formula [I] given above) and $Alq_3$ represented by the structural formula given above.

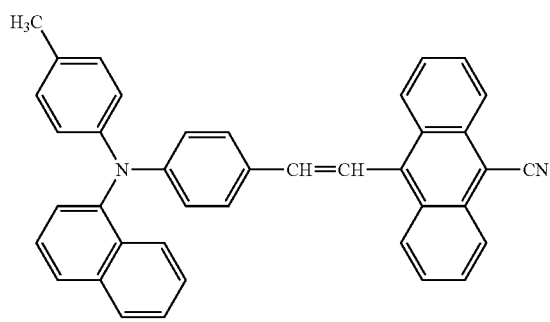

(17)-26

The organic electroluminescent element conforms to the layer structure and film forming method mentioned in Example 2.

The thus obtained organic electroluminescent element of an Example 29 was tested for light-emitting characteristics by application of forward bias direct current in an atmosphere of nitrogen. It emitted a red light, which was found by spectrometry (as in Example 1) to have a peak at about 630 nm. It gave a luminance of 550 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 780 hours for luminance to decrease by half.

EXAMPLE 30

This example demonstrates an organic electroluminescent element (bottom emitting type) of single hetero structure in which the electron transporting and emitting layer is formed from a mixture of a styryl compound represented by the structural formula (17)-27 below (which is one of the styryl compounds represented by the general formula [I] given above) and $Alq_3$ represented by the structural formula given above.

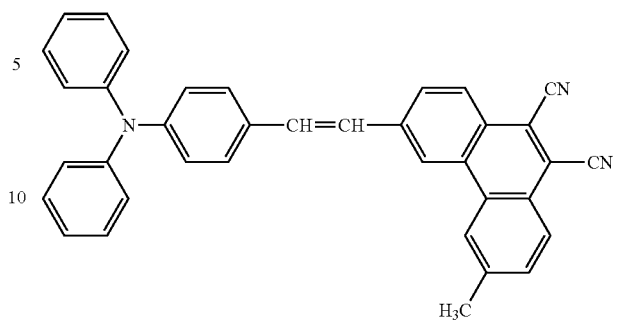

(17)-27

The organic electroluminescent element conforms to the layer structure and film forming method mentioned in Example 2.

The thus obtained organic electroluminescent element of an Example 30 was tested for light-emitting characteristics by application of forward bias direct current in an atmosphere of nitrogen. It emitted a red light, which was found by spectrometry (as in Example 1) to have a peak at about 640 nm. It gave a luminance of 700 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1500 hours for luminance to decrease by half.

EXAMPLE 31

This example demonstrates an organic electroluminescent element (bottom emitting type) of single hetero structure in which the electron transporting and emitting layer is formed from a mixture of a styryl compound represented by the structural formula (17)-28 below (which is one of the styryl compounds represented by the general formula [I] given above) and $Alq_3$ represented by the structural formula given above.

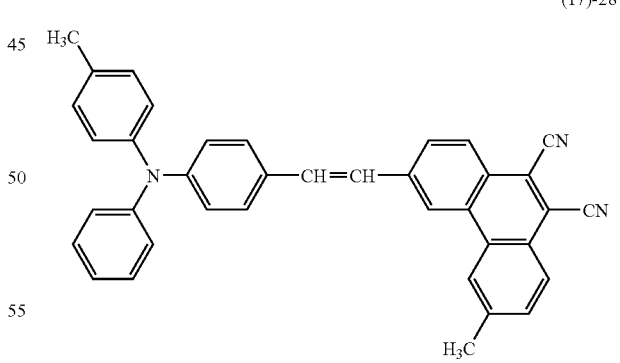

(17)-28

The organic electroluminescent element conforms to the layer structure and film forming method mentioned in Example 2.

The thus obtained organic electroluminescent element of an Example 31 was tested for light-emitting characteristics by application of forward bias direct current in an atmosphere of nitrogen. It emitted a red light, which was found by spectrometry (as in Example 1) to have a peak at about 645 nm. It gave a luminance of 720 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 2200 hours for luminance to decrease by half.

EXAMPLE 32

This example demonstrates an organic electroluminescent element (bottom emitting type) of single hetero structure in which the electron transporting and emitting layer is formed from a mixture of a styryl compound represented by the structural formula (17)-29 below (which is one of the styryl compounds represented by the general formula [I] given above) and $Alq_3$ represented by the structural formula given above.

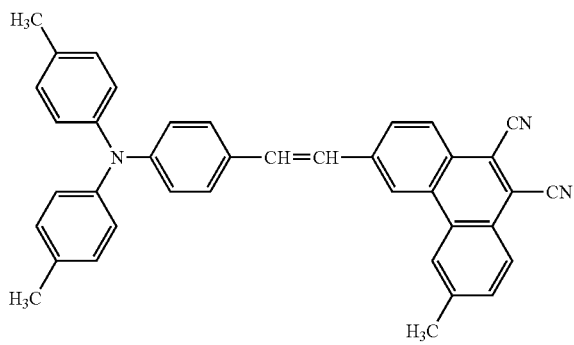

(17)-29

The organic electroluminescent element conforms to the layer structure and film forming method mentioned in Example 2.

The thus obtained organic electroluminescent element of an Example 32 was tested for light-emitting characteristics by application of forward bias direct current in an atmosphere of nitrogen. It emitted a red light, which was found by spectrometry (as in Example 1) to have a peak at about 648 nm. It gave a luminance of 750 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 3200 hours for luminance to decrease by half.

EXAMPLE 33

This example demonstrates an organic electroluminescent element (bottom emitting type) of single hetero structure in which the electron transporting and emitting layer is formed from a mixture of a styryl compound represented by the structural formula (17)-30 below (which is one of the styryl compounds represented by the general formula [I] given above) and $Alq_3$ represented by the structural formula given above.

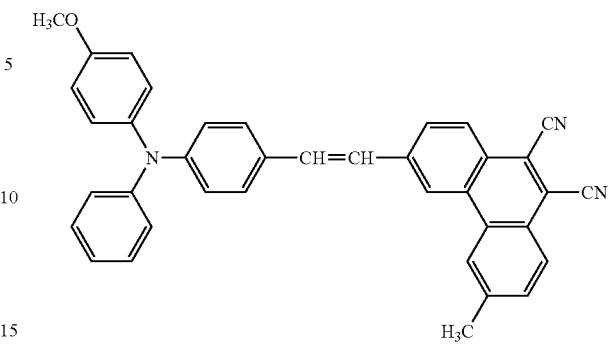

(17)-30

The organic electroluminescent element conforms to the layer structure and film forming method mentioned in Example 2.

The thus obtained organic electroluminescent element of an Example 33 was tested for light-emitting characteristics by application of forward bias direct current in an atmosphere of nitrogen. It emitted a red light, which was found by spectrometry (as in Example 1) to have a peak at about 665 nm. It gave a luminance of 850 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 2500 hours for luminance to decrease by half.

EXAMPLE 34

This example demonstrates an organic electroluminescent element (bottom emitting type) of single hetero structure in which the electron transporting and emitting layer is formed from a mixture of a styryl compound represented by the structural formula (17)-31 below (which is one of the styryl compounds represented by the general formula [I] given above) and $Alq_3$ represented by the structural formula given above.

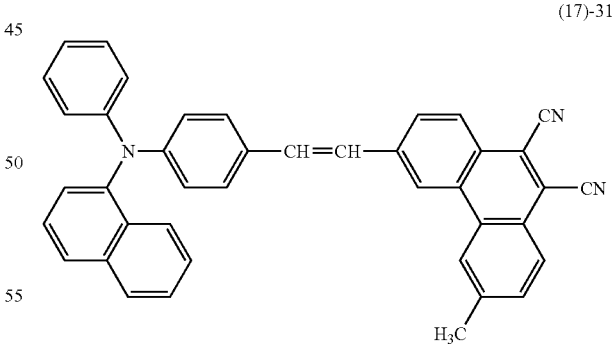

(17)-31

The organic electroluminescent element conforms to the layer structure and film forming method mentioned in Example 2.

The thus obtained organic electroluminescent element of an Example 34 was tested for light-emitting characteristics by application of forward bias direct current in an atmosphere of nitrogen. It emitted a red light, which was found by spectrometry (as in Example 1) to have a peak at about 638 nm. It gave a luminance of 1200 cd/m² at 8 V.

EXAMPLE 35

This example demonstrates an organic electroluminescent element (bottom emitting type) of single hetero structure in which the electron transporting and emitting layer is formed from a mixture of a styryl compound represented by the structural formula (17)-32 below (which is one of the styryl compounds represented by the general formula [I] given above) and $Alq_3$ represented by the structural formula given above.

(17)-32

The organic electroluminescent element conforms to the layer structure and film forming method mentioned in Example 2.

The thus obtained organic electroluminescent element of an Example 35 was tested for light-emitting characteristics by application of forward bias direct current in an atmosphere of nitrogen. It emitted a red light, which was found by spectrometry (as in Example 1) to have a peak at about 640 nm. It gave a luminance of 1150 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 5500 hours for luminance to decrease by half.

EXAMPLE 36

This example demonstrates an organic electroluminescent element (bottom emitting type) of single hetero structure in which the electron transporting and emitting layer is formed from a mixture of a styryl compound represented by the structural formula (17)-33 below (which is one of the styryl compounds represented by the general formula [I] given above) and $Alq_3$ represented by the structural formula given above.

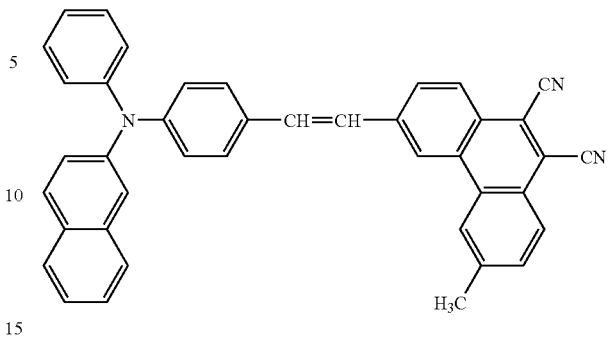

(17)-33

The organic electroluminescent element conforms to the layer structure and film forming method mentioned in Example 2.

The thus obtained organic electroluminescent element of an Example 36 was tested for light-emitting characteristics by application of forward bias direct current in an atmosphere of nitrogen. It emitted a red light, which was found by spectrometry (as in Example 1) to have a peak at about 645 nm. It gave a luminance of 1180 $cd/m^2$ at 8 V.

The sample showed no sign of degradation after standing for 1 month in an atmosphere of nitrogen. The accelerated test for degradation, in which current to produce the initial luminance of 300 $cd/m^2$ was maintained, revealed that it took 4800 hours for luminance to decrease by half.

EXAMPLE 37

This example demonstrates an organic electroluminescent element (bottom emitting type) of single hetero structure in which the electron transporting and emitting layer is formed from a mixture of a styryl compound represented by the structural formula (17)-34 below (which is one of the styryl compounds represented by the general formula [I] given above) and $Alq_3$ represented by the structural formula given above.

(17)-34

The organic electroluminescent element conforms to the layer structure and film forming method mentioned in Example 2.

The thus obtained organic electroluminescent element of an Example 37 was tested for light-emitting characteristics by application of forward bias direct current in an atmosphere of nitrogen. It emitted a red light, which was found by spectrometry (as in Example 1) to have a peak at about 647 nm. It gave a luminance of 950 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 5100 hours for luminance to decrease by half.

EXAMPLE 38

This example demonstrates an organic electroluminescent element (bottom emitting type) of single hetero structure in which the electron transporting and emitting layer is formed from a mixture of a styryl compound represented by the structural formula (17)-35 below (which is one of the styryl compounds represented by the general formula [I] given above) and Alq₃ represented by the structural formula given above.

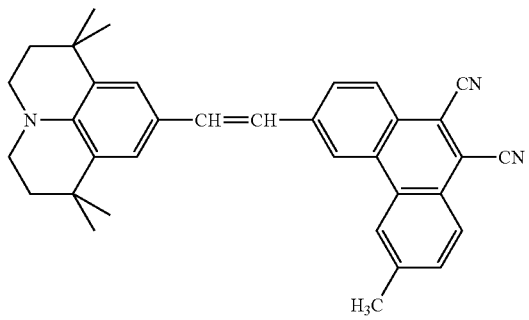

(17)-35

The organic electroluminescent element conforms to the layer structure and film forming method mentioned in Example 2.

The thus obtained organic electroluminescent element of an Example 38 was tested for light-emitting characteristics by application of forward bias direct current in an atmosphere of nitrogen. It emitted a red light, which was found by spectrometry (as in Example 1) to have a peak at about 632 nm. It gave a luminance of 890 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1500 hours for luminance to decrease by half.

EXAMPLE 39

This example demonstrates an organic electroluminescent element (bottom emitting type) of single hetero structure in which the electron transporting and emitting layer is formed from a mixture of a styryl compound represented by the structural formula (17)-36 below (which is one of the styryl compounds represented by the general formula [I] given above) and Alq₃ represented by the structural formula given above.

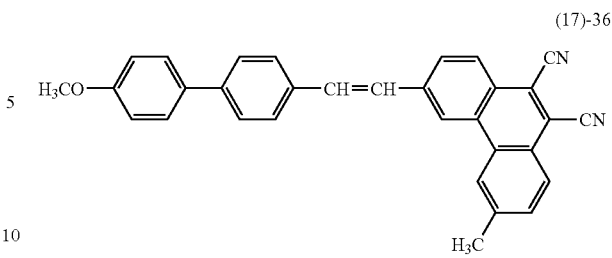

(17)-36

The organic electroluminescent element conforms to the layer structure and film forming method mentioned in Example 2.

The thus obtained organic electroluminescent element of an Example 39 was tested for light-emitting characteristics by application of forward bias direct current in an atmosphere of nitrogen. It emitted a orange light, which was found by spectrometry (as in Example 1) to have a peak at about 585 nm. It gave a luminance of 300 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 850 hours for luminance to decrease by half.

EXAMPLE 40

This example demonstrates an organic electroluminescent element (bottom emitting type) of single hetero structure in which the electron transporting and emitting layer is formed from a mixture of a styryl compound represented by the structural formula (17)-37 below (which is one of the styryl compounds represented by the general formula [I] given above) and Alq₃ represented by the structural formula given above.

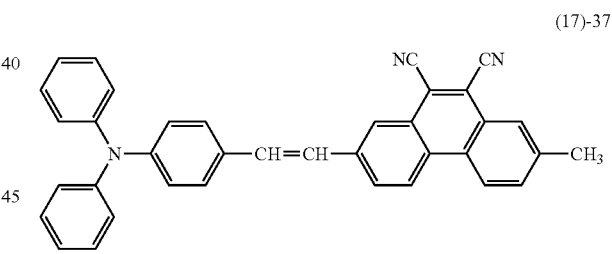

(17)-37

The organic electroluminescent element conforms to the layer structure and film forming method mentioned in Example 2.

The thus obtained organic electroluminescent element of an Example 40 was tested for light-emitting characteristics by application of forward bias direct current in an atmosphere of nitrogen. It emitted an orange light, which was found by spectrometry (as in Example 1) to have a peak at about 580 nm. It gave a luminance of 580 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1200 hours for luminance to decrease by half.

EXAMPLE 41

This example demonstrates an organic electroluminescent element (bottom emitting type) of single hetero structure in which the electron transporting and emitting layer is formed from a mixture of a styryl compound represented by the structural formula (17)-38 below (which is one of the styryl compounds represented by the general formula [I] given above) and Alq$_3$ represented by the structural formula given above.

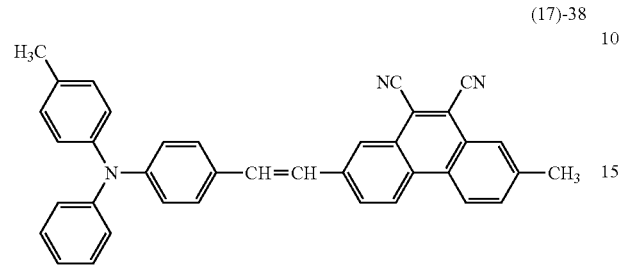

(17)-38

The organic electroluminescent element conforms to the layer structure and film forming method mentioned in Example 2.

The thus obtained organic electroluminescent element of an Example 41 was tested for light-emitting characteristics by application of forward bias direct current in an atmosphere of nitrogen. It emitted a red light, which was found by spectrometry (as in Example 1) to have a peak at about 650 nm. It gave a luminance of 620 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1500 hours for luminance to decrease by half.

EXAMPLE 42

This example demonstrates an organic electroluminescent element (bottom emitting type) of single hetero structure in which the electron transporting and emitting layer is formed from a mixture of a styryl compound represented by the structural formula (17)-39 below (which is one of the styryl compounds represented by the general formula [I] given above) and Alq$_3$ represented by the structural formula given above.

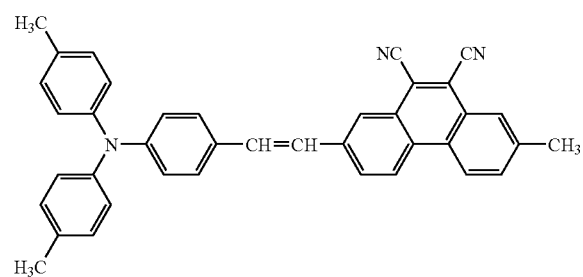

(17)-39

The organic electroluminescent element conforms to the layer structure and film forming method mentioned in Example 2.

The thus obtained organic electroluminescent element of an Example 42 was tested for light-emitting characteristics by application of forward bias direct current in an atmosphere of nitrogen. It emitted a red light, which was found by spectrometry (as in Example 1) to have a peak at about 660 nm. It gave a luminance of 520 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 850 hours for luminance to decrease by half.

EXAMPLE 43

This example demonstrates an organic electroluminescent element (bottom emitting type) of single hetero structure in which the electron transporting and emitting layer is formed from a mixture of a styryl compound represented by the structural formula (17)-40 below (which is one of the styryl compounds represented by the general formula [I] given above) and Alq$_3$ represented by the structural formula given above.

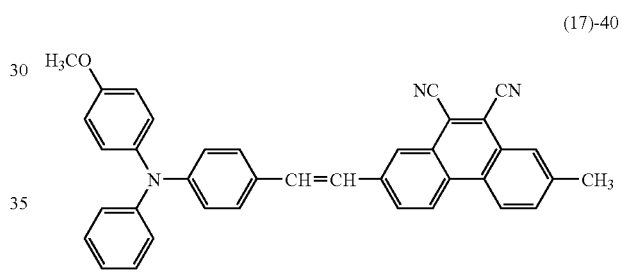

(17)-40

The organic electroluminescent element conforms to the layer structure and film forming method mentioned in Example 2.

The thus obtained organic electroluminescent element of an Example 43 was tested for light-emitting characteristics by application of forward bias direct current in an atmosphere of nitrogen. It emitted a red light, which was found by spectrometry (as in Example 1) to have a peak at about 665 nm. It gave a luminance of 750 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 720 hours for luminance to decrease by half.

EXAMPLE 44

This example demonstrates an organic electroluminescent element (bottom emitting type) of single hetero structure in which the electron transporting and emitting layer is formed from a mixture of a styryl compound represented by the structural-formula (17)-41 below (which is one of the styryl compounds represented by the general formula [I] given above) and Alq$_3$ represented by the structural formula given above.

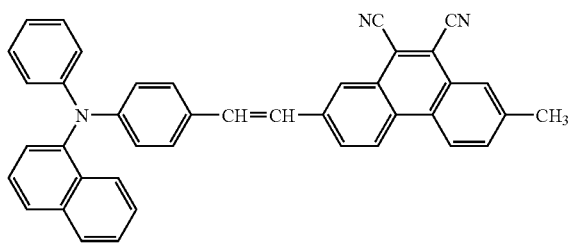

(17)-41

The organic electroluminescent element conforms to the layer structure and film forming method mentioned in Example 2.

The thus obtained organic electroluminescent element of an Example 44 was tested for light-emitting characteristics by application of forward bias direct current in an atmosphere of nitrogen. It emitted a red light, which was found by spectrometry (as in Example 1) to have a peak at about 645 nm. It gave a luminance of 950 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1200 hours for luminance to decrease by half.

EXAMPLE 45

This example demonstrates an organic electroluminescent element (bottom emitting type) of single hetero structure in which the electron transporting and emitting layer is formed from a mixture of a styryl compound represented by the structural formula (17)-42 below (which is one of the styryl compounds represented by the general formula [I] given above) and Alq$_3$ represented by the structural formula given above.

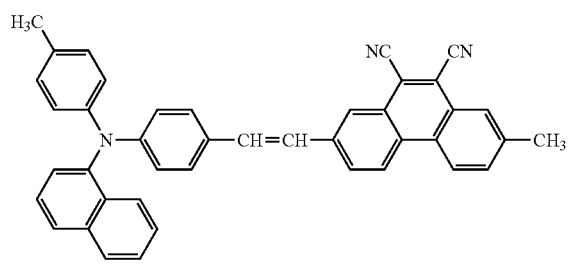

(17)-42

The organic electroluminescent element conforms to the layer structure and film forming method mentioned in Example 2.

The thus obtained organic electroluminescent element of an Example 45 was tested for light-emitting characteristics by application of forward bias direct current in an atmosphere of nitrogen. It emitted a red light, which was found by spectrometry (as in Example 1) to have a peak at about 650 nm. It gave a luminance of 900 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1550 hours for luminance to decrease by half.

EXAMPLE 46

This example demonstrates an organic electroluminescent element (bottom emitting type) of single hetero structure in which the electron transporting and emitting layer is formed from a mixture of a styryl compound represented by the structural formula (17)-43 below (which is one of the styryl compounds represented by the general formula [I] given above) and Alq$_3$ represented by the structural formula given above.

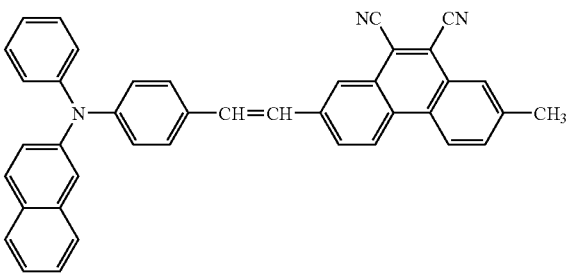

(17)-43

The organic electroluminescent element conforms to the layer structure and film forming method mentioned in Example 2.

The thus obtained organic electroluminescent element of an Example 46 was tested for light-emitting characteristics by application of forward bias direct current in an atmosphere of nitrogen. It emitted a red light, which was found by spectrometry (as in Example 1) to have a peak at about 655 nm. It gave a luminance of 1000 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1300 hours for luminance to decrease by half.

EXAMPLE 47

This example demonstrates an organic electroluminescent element (bottom emitting type) of single hetero structure in which the electron transporting and emitting layer is formed from a mixture of a styryl compound represented by the structural formula (17)-44 below (which is one of the styryl compounds represented by the general formula [I] given above) and Alq$_3$ represented by the structural formula given above.

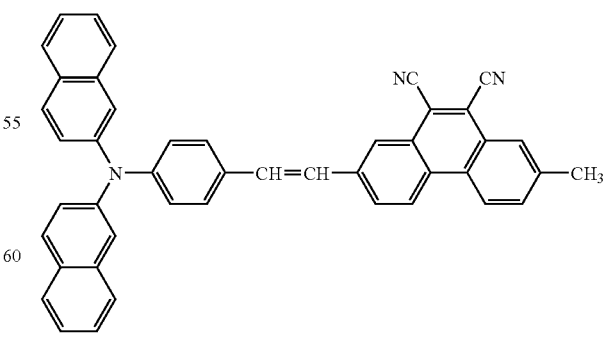

(17)-44

The organic electroluminescent element conforms to the layer structure and film forming method mentioned in Example 2.

The thus obtained organic electroluminescent element of an Example 47 was tested for light-emitting characteristics by application of forward bias direct current in an atmosphere of nitrogen. It emitted a red light, which was found by spectrometry (as in Example 1) to have a peak at about 655 nm. It gave a luminance of 1100 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1100 hours for luminance to decrease by half.

EXAMPLE 48

This example demonstrates an organic electroluminescent element (bottom emitting type) of single hetero structure in which the electron transporting and emitting layer is formed from a mixture of a styryl compound represented by the structural formula (17)-45 below (which is one of the styryl compounds represented by the general formula [I] given above) and Alq₃ represented by the structural formula given above.

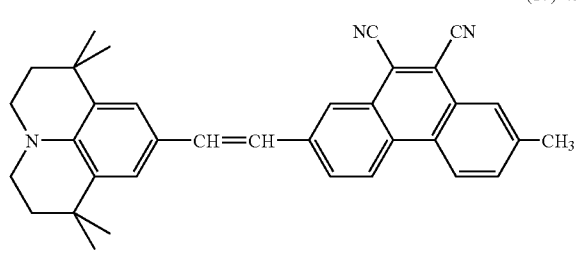
(17)-45

The organic electroluminescent element conforms to the layer structure and film forming method mentioned in Example 2.

The thus obtained organic electroluminescent element of an Example 4-8 was tested for light-emitting characteristics by application of forward bias direct current in an atmosphere of nitrogen. It emitted a red light, which was found by spectrometry (as in Example 1) to have a peak at about 642 nm. It gave a luminance of 350 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 250 hours for luminance to decrease by half.

EXAMPLE 49

This example demonstrates an organic electroluminescent element (bottom emitting type) of single hetero structure in which the electron transporting and emitting layer is formed from a mixture of a styryl compound represented by the structural formula (17)-46 below (which is one of the styryl compounds represented by the general formula [I] given above) and Alq₃ represented by the structural formula given above.

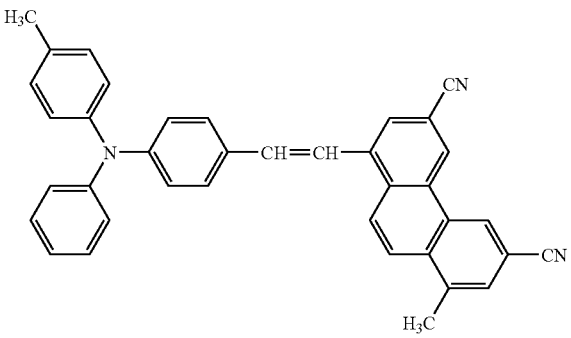
(17)-46

The organic electroluminescent element conforms to the layer structure and film forming method mentioned in Example 2.

The thus obtained organic electroluminescent element of an Example 49 was tested for light-emitting characteristics by application of forward bias direct current in an atmosphere of nitrogen. It emitted a red light, which was found by spectrometry (as in Example 1) to have a peak at about 640 nm. It gave a luminance of 250 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 180 hours for luminance to decrease by half.

EXAMPLE 50

This example demonstrates an organic electroluminescent element (bottom emitting type) of single hetero structure in which the electron transporting and emitting layer is formed from a mixture of a styryl compound represented by the structural formula (17)-47 below (which is one of the styryl compounds represented by the general formula [I] given above) and Alq₃ represented by the structural formula given above.

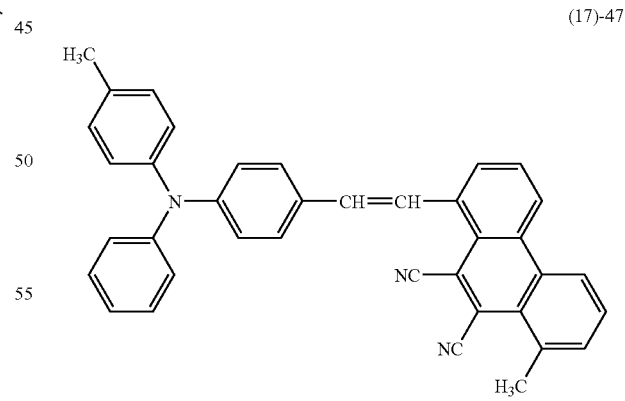
(17)-47

The organic electroluminescent element conforms to the layer structure and film forming method mentioned in Example 2.

The thus obtained organic electroluminescent element of an Example 50 was tested for light-emitting characteristics by application of forward bias direct current in an atmosphere of nitrogen. It emitted a red light, which was found by spectrometry (as in Example 1) to have a peak at about 625 nm. It gave a luminance of 280 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 240 hours for luminance to decrease by half.

EXAMPLE 51

This example demonstrates an organic electroluminescent element (bottom emitting type) of single hetero structure in which the electron transporting and emitting layer is formed from a mixture of a styryl compound represented by the structural formula (17)-48 below (which is one of the styryl compounds represented by the general formula [I] given above) and Alq₃ represented by the structural formula given above.

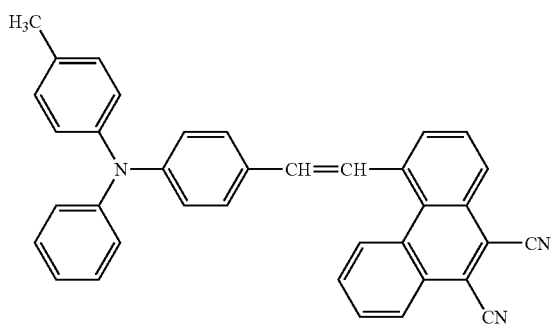

(17)-48

The organic electroluminescent element conforms to the layer structure and film forming method mentioned in Example 2.

The thus obtained organic electroluminescent element of an Example 51 was tested for light-emitting characteristics by application of forward bias direct current in an atmosphere of nitrogen. It emitted a red light, which was found by spectrometry.(as in Example 1) to have a peak at about 635 nm. It gave a luminance of 350 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 750 hours for luminance to decrease by half.

EXAMPLE 52

This example demonstrates an organic electroluminescent element (bottom emitting type) of single hetero structure in which the electron transporting and emitting layer is formed from a mixture of a styryl compound represented by the structural formula (17)-49 below (which is one of the styryl compounds represented by the general formula [I] given above) and Alq₃ represented by the structural formula given above.

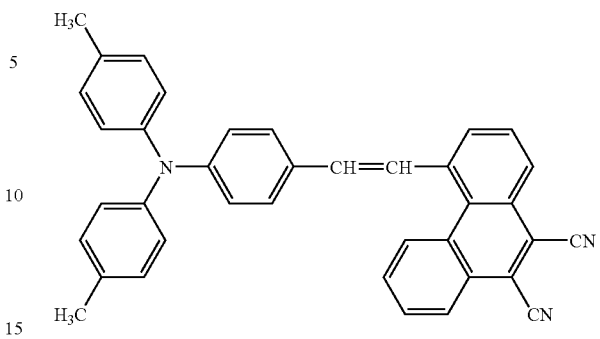

(17)-49

The organic electroluminescent element conforms to the layer structure and film forming method mentioned in Example 2.

The thus obtained organic electroluminescent element of an Example 52 was tested for light-emitting characteristics by application of forward bias direct current in an atmosphere of nitrogen. It emitted a red light, which was found by spectrometry (as in Example 1) to have a peak at about 640 nm. It gave a luminance of 300 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 600 hours for luminance to decrease by half.

EXAMPLE 53

This example demonstrates an organic electroluminescent element (bottom emitting type) of single hetero structure in which the electron transporting and emitting layer is formed from a mixture of a styryl compound represented by the structural formula (17)-50 below (which is one of the styryl compounds represented by the general formula [I] given above) and Alq₃ represented by the structural formula given above.

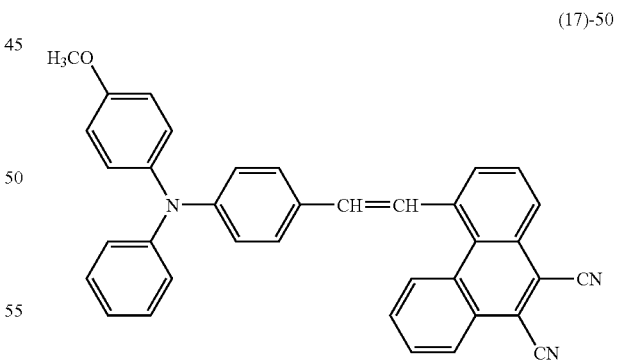

(17)-50

The organic electroluminescent element conforms to the layer structure and film forming method mentioned in Example 2.

The thus obtained organic electroluminescent element of an Example 53 was tested for light-emitting characteristics by application of forward bias direct current in an atmosphere of nitrogen. It emitted a red light, which was found by spectrometry (as in Example 1) to have a peak at about 650 nm. It gave a luminance of 400 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 300 hours for luminance to decrease by half.

EXAMPLE 54

This example demonstrates an organic electroluminescent element (bottom emitting type) of single hetero structure in which the electron transporting and emitting layer is formed from a mixture of a styryl compound represented by the structural formula (17)-51 below (which is one of the styryl compounds represented by the general formula [I] given above) and Alq₃ represented by the structural formula given above.

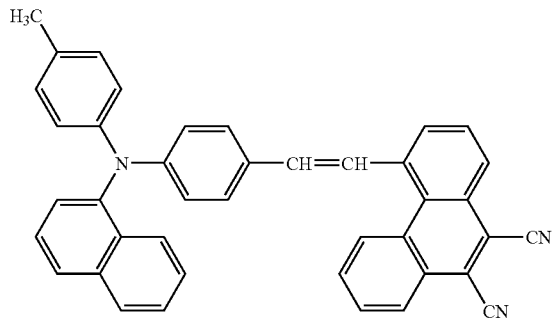

(17)-51

The organic electroluminescent element conforms to the layer structure and film forming method mentioned in Example 2.

The thus obtained organic electroluminescent element of an Example 54 was tested for light-emitting characteristics by application of forward bias direct current in an atmosphere of nitrogen. It emitted a red light, which was found by spectrometry (as in Example 1) to have a peak at about 645 nm. It gave a luminance of 520 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1050 hours for luminance to decrease by half.

EXAMPLE 55

This example demonstrates an organic electroluminescent element (bottom emitting type) of single hetero structure in which the electron transporting and emitting layer is formed from a mixture of a styryl compound represented by the structural formula (17)-52 below (which is one of the styryl compounds represented by the general formula [I] given above) and Alq₃ represented by the structural formula given above.

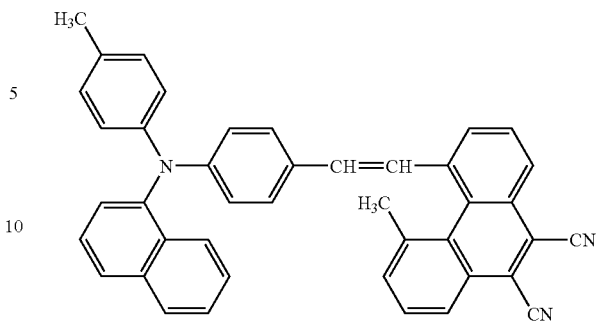

(17)-52

The organic electroluminescent element conforms to the layer structure and film forming method mentioned in Example 2.

The thus obtained organic electroluminescent element of an Example 55 was tested for light-emitting characteristics by application of forward bias direct current in an atmosphere of nitrogen. It emitted a red light, which was found by spectrometry (as in Example 1) to have a peak at about 647 nm. It gave a luminance of 500 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1200 hours for luminance to decrease by half.

EXAMPLE 56

This example demonstrates an organic electroluminescent element (bottom emitting type) of single hetero structure in which the electron transporting and emitting layer is formed from a mixture of a styryl compound represented by the structural formula (17)-53 below (which is one of the styryl compounds represented by the general formula [I] given above) and Alq₃ represented by the structural formula given above.

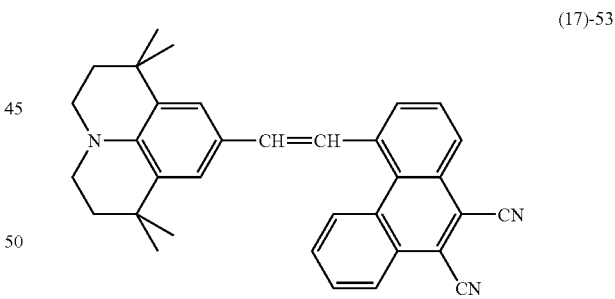

(17)-53

The organic electroluminescent element conforms to the layer structure and film forming method mentioned in Example 2.

The thus obtained organic electroluminescent element of an Example 56 was tested for light-emitting characteristics by application of forward bias direct current in an atmosphere of nitrogen. It emitted a red light, which was found by spectrometry (as in Example 1) to have a peak at about 633 nm. It gave a luminance of 220 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 230 hours for luminance to decrease by half.

EXAMPLE 57

This example demonstrates an organic electroluminescent element (bottom emitting type) of single hetero structure in which the electron transporting and emitting layer is formed from a mixture of a styryl compound represented by the structural formula (17)-54 below (which is one of the styryl compounds represented by the general formula [I] given above) and $Alq_3$ represented by the structural formula given above.

(17)-54

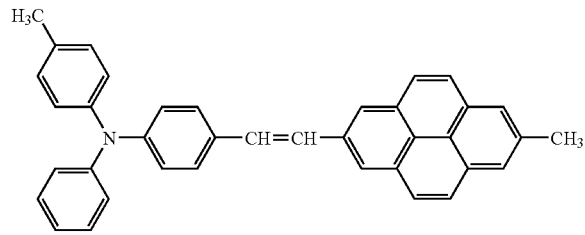

The organic electroluminescent element conforms to the layer structure and film forming method mentioned in Example 2.

The thus obtained organic electroluminescent element of an Example 57 was tested for light-emitting characteristics by application of forward bias direct current in an atmosphere of nitrogen. It emitted an orange light, which was found by spectrometry (as in Example 1) to have a peak at about 595 nm. It gave a luminance of 380 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 180 hours for luminance to decrease by half.

EXAMPLE 58

This example demonstrates an organic electroluminescent element (bottom emitting type) of single hetero structure in which the electron transporting and emitting layer is formed from a mixture of a styryl compound represented by the structural formula (17)-55 below (which is one of the styryl compounds represented by the general formula [I] given above) and $Alq_3$ represented by the structural formula given above.

(17)-55

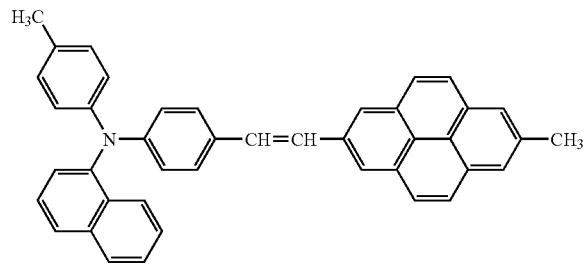

The organic electroluminescent element conforms to the layer structure and film forming method mentioned in Example 2.

The thus obtained organic electroluminescent element of an Example 58 was tested for light-emitting characteristics by application of forward bias direct current in an atmosphere of nitrogen. It emitted an orange light, which was found by spectrometry (as in Example 1) to have a peak at about 590 nm. It gave a luminance of 320 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 250 hours for luminance to decrease by half.

EXAMPLE 59

This example demonstrates an organic electroluminescent element (bottom emitting type) of single hetero structure in which the electron transporting and emitting layer is formed from a mixture of a styryl compound represented by the structural formula (17)-56 below (which is one of the styryl compounds represented by the general formula [I] given above) and $Alq_3$ represented by the structural formula given above.

(17)-56

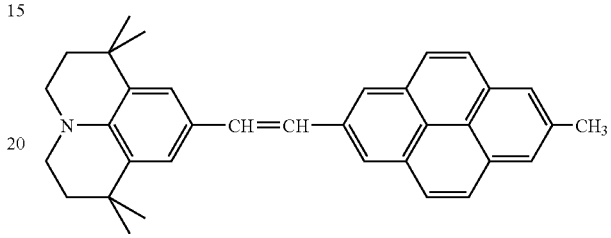

The organic electroluminescent element conforms to the layer structure and film forming method mentioned in Example 2.

The thus obtained organic electroluminescent element of an Example 59 was tested for light-emitting characteristics by application of forward bias direct current in an atmosphere of nitrogen. It emitted an orange light, which was found by spectrometry (as in Example 1) to have a peak at about 588 nm. It gave a luminance of 210 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 150 hours for luminance to decrease by half.

EXAMPLE 60

This example demonstrates an organic electroluminescent element (bottom emitting type) of single hetero structure in which the electron transporting and emitting layer is formed from a mixture of a styryl compound represented by the structural formula (17)-63 below (which is one of the styryl compounds represented by the general formula [I] given above) and $Alq_3$ represented by the structural formula given above.

(17)-63

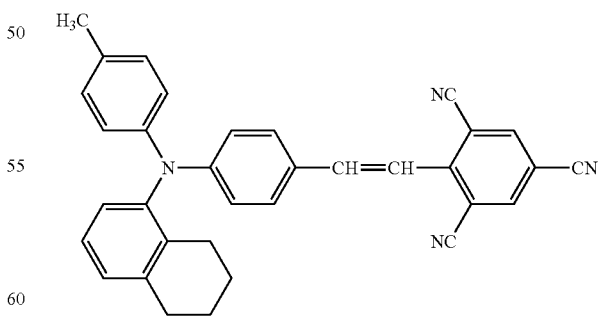

The organic electroluminescent element conforms to the layer structure and film forming method mentioned in Example 2.

The thus obtained organic electroluminescent element of an Example 60 was tested for light-emitting characteristics by application of forward bias direct current in an atmosphere of nitrogen. It emitted an orange light, which was found by spectrometry (as in Example 1) to have a peak at about 605 nm. It gave a luminance of 1000 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1350 hours for luminance to decrease by half.

EXAMPLE 61

This example demonstrates an organic electroluminescent element (bottom emitting type) of single hetero structure in which the electron transporting and emitting layer is formed from a mixture of a styryl compound represented by the structural formula (17)-64 below (which is one of the styryl compounds represented by the general formula [I] given above) and $Alq_3$ represented by the structural formula given above.

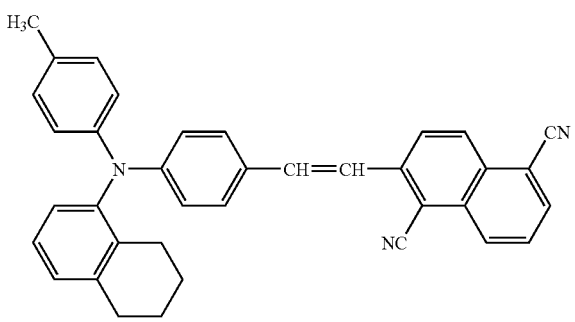

(17)-64

The organic electroluminescent element conforms to the layer structure and film forming method mentioned in Example 2.

The thus obtained organic electroluminescent element of an Example 61 was tested for light-emitting characteristics by application of forward bias direct current in an atmosphere of nitrogen. It emitted an orange light, which was found by spectrometry (as in Example 1) to have a peak at about 600 nm. It gave a luminance of 1950 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 3500 hours for luminance to decrease by half.

EXAMPLE 62

This example demonstrates an organic electroluminescent element (bottom emitting type) of single hetero structure in which the electron transporting and emitting layer is formed from a mixture of a styryl compound represented by the structural formula (17)-65 below (which is one of the styryl compounds represented by the general formula [I] given above) and $Alq_3$ represented by the structural formula given above.

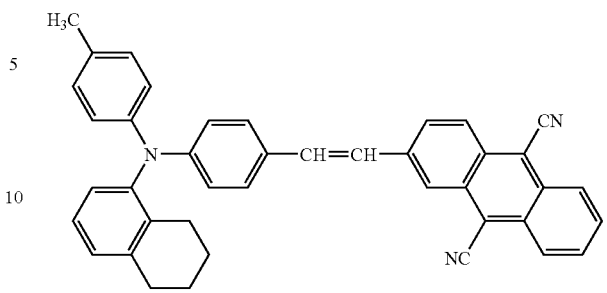

(17)-65

The organic electroluminescent element conforms to the layer structure and film forming method mentioned in Example 2.

The thus obtained organic electroluminescent element of an Example 62 was tested for light-emitting characteristics by application of forward bias direct current in an atmosphere of nitrogen. It emitted a red light, which was found by spectrometry (as in Example 1) to have a peak at about 670 nm. It gave a luminance of 290 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 520 hours for luminance to decrease by half.

EXAMPLE 63

This example demonstrates an organic electroluminescent element (bottom emitting type) of single hetero structure in which the electron transporting and emitting layer is formed from a mixture of a styryl compound represented by the structural formula (17)-66 below (which is one of the styryl compounds represented by the general formula [I] given above) and $Alq_3$ represented by the structural formula given above.

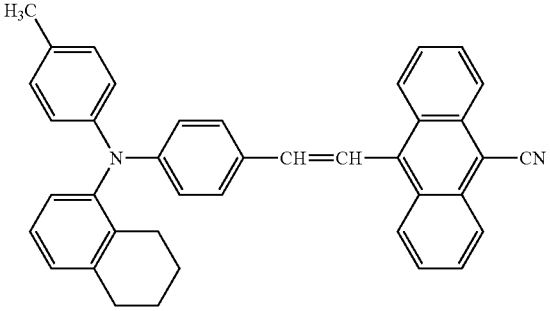

(17)-66

The organic electroluminescent element conforms to the layer structure and film forming method mentioned in Example 2.

The thus obtained organic electroluminescent element of an Example 63 was tested for light-emitting characteristics by application of forward bias direct current in an atmosphere of nitrogen. It emitted a red light, which was found by spectrometry (as in Example 1) to have a peak at about 625 nm. It gave a luminance of 620 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 770 hours for luminance to decrease by half.

EXAMPLE 64

This example demonstrates an organic electroluminescent element (bottom emitting type) of single hetero structure in which the electron transporting and emitting layer is formed from a mixture of a styryl compound represented by the structural formula (17)-67 below (which is one of the styryl compounds represented by the general formula [I] given above) and Alq$_3$ represented by the structural formula given above.

(17)-67

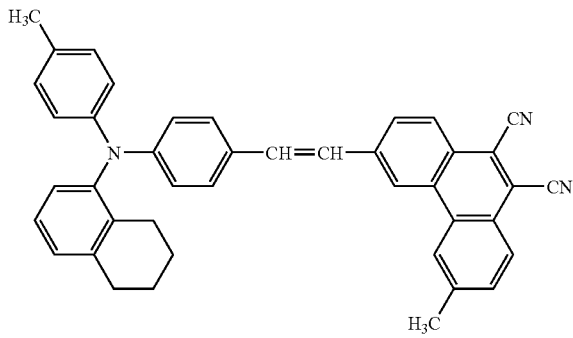

The organic electroluminescent element conforms to the layer structure and film forming method mentioned in Example 2.

The thus obtained organic electroluminescent element of an Example 64 was tested for light-emitting characteristics by application of forward bias direct current in an atmosphere of nitrogen. It emitted a red light, which was found by spectrometry (as in Example 1) to have a peak at about 635 nm. It gave a luminance of 1260 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 5400 hours for luminance to decrease by half.

EXAMPLE 65

This example demonstrates an organic electroluminescent element (bottom emitting type) of single hetero structure in which the electron transporting and emitting layer is formed from a mixture of a styryl compound represented by the structural formula (17)-68 below (which is one of the styryl compounds represented by the general formula [I] given above) and Alq$_3$ represented by the structural formula given above.

(17)-68

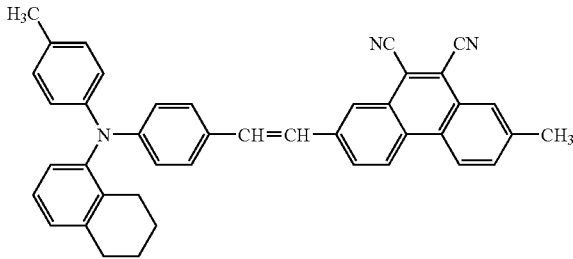

The organic electroluminescent element conforms to the layer structure and film forming method mentioned in Example 2.

The thus obtained organic electroluminescent element of an Example 65 was tested for light-emitting characteristics by application of forward bias direct current in an atmosphere of nitrogen. It emitted a red light, which was found by spectrometry (as in Example 1) to have a peak at about 645 nm. It gave a luminance of 950 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1600 hours for luminance to decrease by half.

EXAMPLE 66

This example demonstrates an organic electroluminescent element (bottom emitting type) of single hetero structure in which the electron transporting and emitting layer is formed from a mixture of a styryl compound represented by the structural formula (17)-69 below (which is one of the styryl compounds represented by the general formula [I] given above) and Alq$_3$ represented by the structural formula given above.

(17)-69

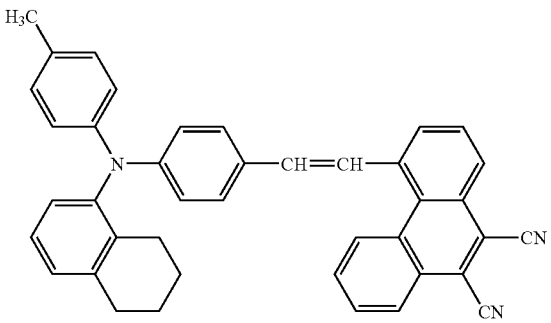

The organic electroluminescent element conforms to the layer structure and film forming method mentioned in Example 2.

The thus obtained organic electroluminescent element of an Example 66 was tested for light-emitting characteristics by application of forward bias direct current in an atmosphere of nitrogen. It emitted a red light, which was found by spectrometry (as in Example 1) to have a peak at about 640 nm. It gave a luminance of 550 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1000 hours for luminance to decrease by half.

EXAMPLE 67

This example demonstrates an organic electroluminescent element (bottom emitting type) of single hetero structure in which the electron transporting and emitting layer is formed from a mixture of a styryl compound represented by the structural formula (17)-70 below (which is one of the styryl compounds represented by the general formula [I] given above) and Alq$_3$ represented by the structural formula given above.

(17)-70

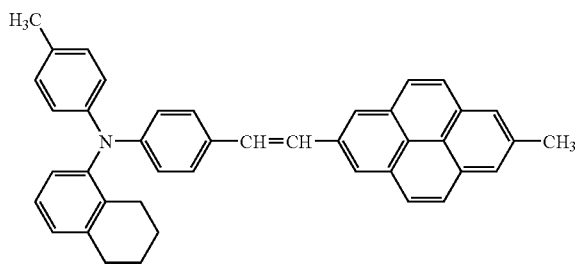

The organic electroluminescent element conforms to the layer structure and film forming method mentioned in Example 2.

The thus obtained organic electroluminescent element of an Example 67 was tested for light-emitting characteristics by application of forward bias direct current in an atmosphere of nitrogen. It emitted an orange light, which was found by spectrometry (as in Example 1) to have a peak at about 587 nm. It gave a luminance of 360 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 270 hours for luminance to decrease by half.

EXAMPLE 68

This example demonstrates organic electroluminescent elements (bottom emitting type) of single hetero structure in which the electron transporting and emitting layer is formed from a mixture of a styryl compound represented by the structural formula (17)-4 given above and a styryl compound represented by the structural formula (17)-20 given above, both styryl compounds being the members of the styryl compounds represented by the general formula [I] given above.

First, a glass substrate, measuring 30 mm by 30 mm, was placed in a vacuum deposition apparatus. This glass substrate has an anode of ITO film (100 nm thick) formed on one surface thereof. The glass substrate underwent vacuum deposition at $10^{-4}$ Pa or less, with a metal mask arranged close thereto, which has a plurality of openings, each measuring 2.0 mm by 2.0 mm. The vacuum deposition gave rise to a 50-nm thick layer of α-NPD represented by the structural formula given above. The rate of deposition was adjusted to 0.1 nm/s.

Then, on the hole transporting layer was deposited a layer of the mixture of the styryl compounds represented respectively by the structural formulas (17)-4 and (17)-20 given above. The ratio (by weight) of the styryl compound represented by the structural formula (17)-4 was varied. The thickness of the layer of the mixture of the styryl compounds was 50 nm.

A 200-nm thick cathode was formed by vacuum deposition from Mg and Ag in a mixing ratio of 1:3. In this way, there were obtained several samples of the organic electroluminescent element.

The thus obtained samples were tested for light-emitting characteristics by application of forward bias direct current in an atmosphere of nitrogen. The characteristics varied in emitting spectrum depending on the mixing ratio of the two styryl compounds. It was possible to choose a desired peak wavelength ranging from 600 nm to 680 nm without appreciable change in electrical characteristics (for example, voltage-current characteristics).

EXAMPLE 69

In this example, several samples of the organic electroluminescent elements (bottom emitting type) of single hetero structure were prepared in which the electron transporting and emitting layer is formed from a mixture of a styryl compound represented by the structural formula (17)-13 given above and Alq₃ represented by the structural formula given above. The samples were tested for how the concentration of the styryl compound represented by the structural formula (17)-13 in the emitting layer affects the color of emitted light, the driving voltage, and the life of the element. The results are shown in Table 1 below.

The organic electroluminescent element conforms to the layer structure and film forming method mentioned in Example 2.

TABLE 1

Characteristic properties of elements in Example 69

| Concentration of styryl compound of (17)-13 in emitting layer (wt %) | Chromaticity at 300 cd/m² | Driving voltage at 300 cd/m² (V) | Half-life at initial luminance = 300 cd/m² (hours) |
|---|---|---|---|
| 0 | 0.348, 0.523 | 6.5 | — |
| 5 | 0.588, 0.411 | 8.5 | 3500 |
| 10 | 0.595, 0.404 | 8.1 | 3300 |
| 20 | 0.602, 0.397 | 7.7 | 3200 |
| 30 | 0.608, 0.391 | 7.2 | 3000 |
| 50 | 0.612, 0.387 | 7.0 | 2800 |
| 75 | 0.611, 0.388 | 6.8 | 2700 |
| 90 | 0.612, 0.387 | 6.6 | 2600 |
| 100 | 0.613, 0.386 | 6.5 | 400 |

It is apparent from Table 1 that as the concentration of the styryl compound in the emitting layer increases, the emitted color takes on a deeper red color and the driving voltage lowers but the life of the element decreases. This relation between the concentration of the styryl compound in the emitting layer and the characteristic properties of the element suggests the the existence of a practically optimal concentration for the desired chromaticity, driving voltage, and half-life. The results in this example suggest that the concentration of the styryl compound should preferably be 30 to 90 wt % although it may range from 5 to 90 wt %.

EXAMPLE 70

In this example, several samples of the organic electroluminescent elements (bottom emitting type) of single hetero structure were prepared in which the electron transporting and emitting layer is formed from a mixture of a styryl compound represented by the structural formula (17)-32 given above or a styryl compound represented by the structural formula A-1 given below and Alq₃ represented by the structural formula given above. The styryl compound of A-1 is one in which a specific substituent is removed from the aryl part represented by X in the general formula [I] given above. The samples were tested for characteristic properties. The results are shown in Table 2. The organic electroluminescent elements conform to the layer structure and film forming method mentioned in Example 2.

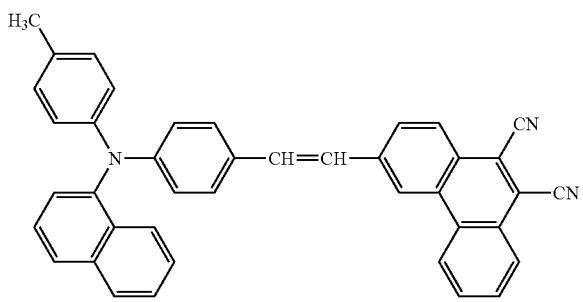

A-1

Structure of Elements:
Element 1: (Example 35) ITO/α-NPD (50 nm)/styryl compound of structural formula (17)-32+Alq₃ (50 nm)/Mg:Ag (200 nm)
Element 2: (Example 70) ITO/α-NPD (50 nm)/styryl compound of compound A-1+Alq₃ (50 nm)/Mg:Ag (200 nm)

TABLE 2

Comparison of characteristic properties of elements

| | EL maximum (nm) | Luminance at 8 V (cd/m$^2$) | Half-life at initial luminance = 300 cd/m$^2$ (hours) |
|---|---|---|---|
| Element 1 | 640 | 1150 | 5500 |
| Element 2 | 640 | 1000 | 4700 |

It is noted from Table 2 that element 1 has a longer half-life (in continuous lighting) than element 2, because the former has the emitting layer formed from a mixture of a styryl compound of structural formula (17)-32 and Alq₃. Having cyano groups and/or methyl groups in the aryl part of the molecule, this styryl compound makes the emitting layer amorphous.

EXAMPLE 71

This example demonstrates an organic electroluminescent element (bottom emitting type) of single hetero structure in which the electron transporting and emitting layer is formed from a mixture of a styryl compound represented by the structural formula (17)-71 below (which is one of the styryl compounds represented by the general formula [I] given above) and Alq₃ represented by the structural formula given above.

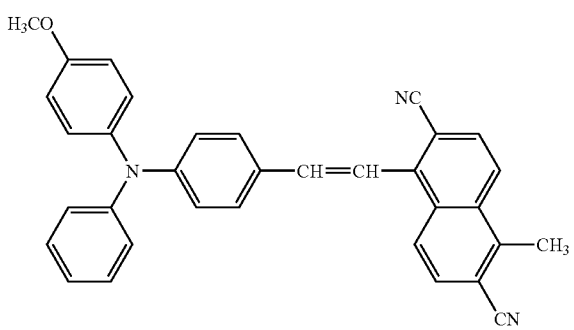

(17)-71

The organic electroluminescent element conforms to the layer structure and film forming method mentioned in Example 2.

The thus obtained organic electroluminescent element of an Example 71 was tested for light-emitting characteristics by application of forward bias direct current in an atmosphere of nitrogen. It emitted an orange light, which was found by spectrometry (as in Example 1) to have a peak at about 595 nm. It gave a luminance of 1500 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1600 hours for luminance to decrease by half.

EXAMPLE 72

This example demonstrates an organic electroluminescent element (bottom emitting type) of single hetero structure in which the electron transporting and emitting layer is formed from a mixture of a styryl compound represented by the structural formula (17)-72 below (which is one of the styryl compounds represented by the general formula [I] given above) and Alq₃ represented by the structural formula given above.

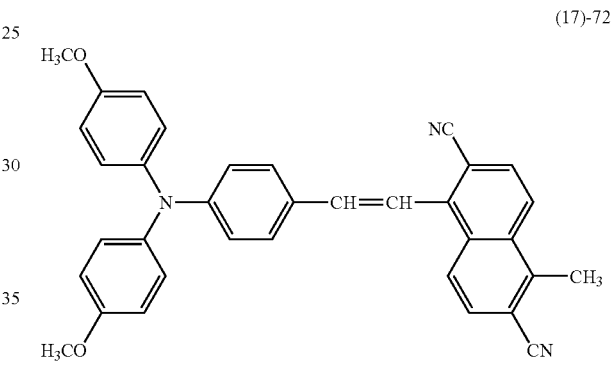

(17)-72

The organic electroluminescent element conforms to the layer structure and film forming method mentioned in Example 2.

The thus obtained organic electroluminescent element of an Example 72 was tested for light-emitting characteristics by application of forward bias direct current in an atmosphere of nitrogen. It emitted an orange light, which was found by spectrometry (as in Example 1) to have a peak at about 605 nm. It gave a luminance of 1100 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 950 hours for luminance to decrease by half.

EXAMPLE 73

This example demonstrates an organic electroluminescent element (bottom emitting type) of double hetero structure in which the emitting layer is a laminate consisting of a layer of a mixture of a styryl compound represented by the structural formula (17)-32 given above (which is one of the styryl compounds represented by the general formula [I] given above) and α-NPD represented by the structural formula given above and a layer of a mixture of a styryl compound represented by the structural formula (17)-32 given above and Alq₃ represented by the structural formula given above.

First, a glass substrate, measuring 30 mm by 30 mm and having an anode of ITO film (100 nm thick) formed on one surface thereof, underwent vacuum deposition to form a 25-nm thick film of α-NPD represented by the structural formula given above. On the hole transporting layer was formed an emitting layer from a mixture of a styryl compound represented by the structural formula (17)-32 given above and α-NPD in a mixing ratio of 1:1 by weight. The thickness of the emitting layer is 25 nm. Another emitting layer was formed from a mixture of a styryl compound represented by the structural formula (17)-32 given above and Alq$_3$ in a mixing ratio of 1:1 by weight. The thickness of this emitting layer is also 25 nm.

On the emitting layer was formed an electron transporting layer from Alq$_3$ by vacuum deposition. The thickness of the layer of Alq$_3$ is 25 nm.

A 200-nm thick cathode was formed by vacuum deposition from Mg and Ag in a mixing ratio of 1:3. In this way, there was obtained the organic electroluminescent element as desired.

The thus obtained organic electroluminescent element of an Example 73 was tested for light-emitting characteristics by application of forward bias direct current in an atmosphere of nitrogen. It emitted a red light, which was found by spectrometry (as in Example 1) to have a peak at 640 nm. It gave a luminance of 900 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3900 hours for luminance to decrease by half.

EXAMPLE 74

This example demonstrates an organic electroluminescent element (bottom emitting type) of double hetero structure in which the emitting layer is formed from a mixture composed of a styryl compound represented by the structural formula (17)-32 given above (which is one of the styryl compounds represented by the general formula [I] given above), Alq$_3$ represented by the structural formula given above, and α-NPD represented by the structural formula given above.

First, a glass substrate, measuring 30 mm by 30 mm and having an anode of ITO film (100 nm thick) formed on one surface thereof, underwent vacuum deposition to form a 30-nm thick film of α-NPD represented by the structural formula given above. On the hole transporting layer was formed an emitting layer from a mixture of a styryl compound represented by the structural formula (17)-32 given above, Alq$_3$, and α-NPD in a mixing ratio of 2:1:1 by weight. The thickness of the emitting layer (mixture layer) is also 30 nm.

On the emitting layer was formed by vacuum deposition an electron transporting layer from Alq$_3$ represented by the structural formula given above. The thickness of the layer of Alq$_3$ is 30 nm.

A 200-nm thick cathode was formed by vacuum deposition from Mg and Ag in a mixing ratio of 1:3. In this way, there was obtained the organic electroluminescent element as desired.

The thus obtained organic electroluminescent element of an Example 74 was tested for light-emitting characteristics by application of forward bias direct current in an atmosphere of nitrogen. It emitted a red light, which was found by spectrometry (as in Example 1) to have a peak at 640 nm. It gave a luminance of 1000 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 4100 hours for luminance to decrease by half.

EXAMPLE 75

This example demonstrates an organic electroluminescent element (bottom emitting type) of single hetero structure in which the electron transporting and emitting layer is formed from a mixture of a styryl compound represented by the structural formula (17)-73 below (which is one of the styryl compounds represented by the general formula [I] given above) and Alq$_3$ represented by the structural formula given above.

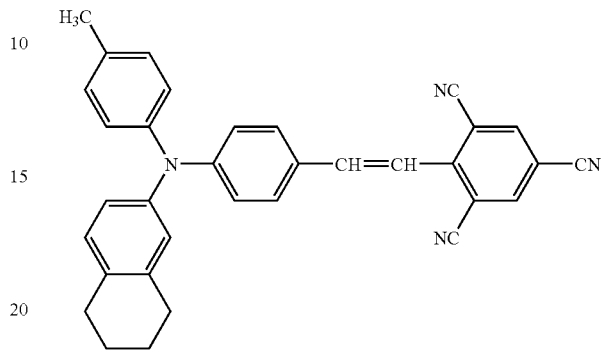

(17)-73

The organic electroluminescent element conforms to the layer structure and film forming method mentioned in Example 2.

The thus obtained organic electroluminescent element of an Example 75 was tested for light-emitting characteristics by application of forward bias direct current in an atmosphere of nitrogen. It emitted an orange light, which was found by spectrometry (as in Example 1) to have a peak at about 605 nm. It gave a luminance of 900 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 1000 hours for luminance to decrease by half.

EXAMPLE 76

This example demonstrates an organic electroluminescent element (bottom emitting type) of single hetero structure in which the electron transporting and emitting layer is formed from a mixture of a styryl compound represented by the structural formula (17)-74 below (which is one of the styryl compounds represented by the general formula [I] given above) and Alq$_3$ represented by the structural formula given above.

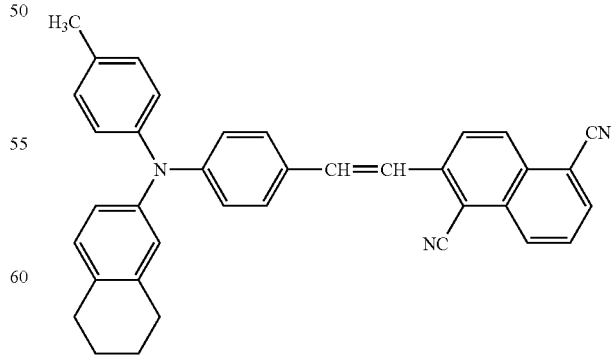

(17)-74

The organic electroluminescent element conforms to the layer structure and film forming method mentioned in Example 2.

The thus obtained organic electroluminescent element of an Example 76 was tested for light-emitting characteristics by application of forward bias direct current in an atmosphere of nitrogen. It emitted an orange light, which was found by spectrometry (as in Example 1) to have a peak at about 600 nm. It gave a luminance of 1700 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 3200 hours for luminance to decrease by half.

EXAMPLE 77

This example demonstrates an organic electroluminescent element (bottom emitting type) of single hetero structure in which the electron transporting and emitting layer is formed from a mixture of a styryl compound represented by the structural formula (17)-75 below (which is one of the styryl compounds represented by the general formula [I] given above) and Alq₃ represented by the structural formula given above.

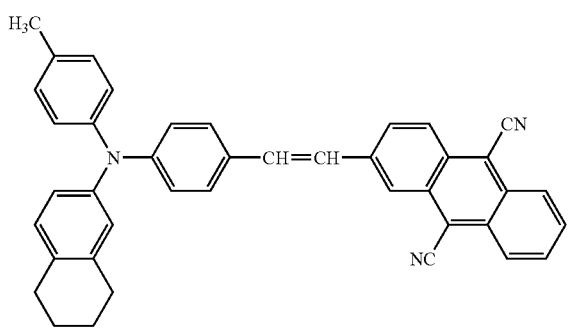

(17)-75

The organic electroluminescent element conforms to the layer structure and film forming method mentioned in Example 2.

The thus obtained organic electroluminescent element of an Example 77 was tested for light-emitting characteristics by application of forward bias direct current in an atmosphere of nitrogen. It emitted a red light, which was found by spectrometry (as in Example 1) to have a peak at about 670 nm. It gave a luminance of 280 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 500 hours for luminance to decrease by half.

EXAMPLE 78

This example demonstrates an organic electroluminescent element (bottom emitting type) of single hetero structure in which the electron transporting and emitting layer is formed from a mixture of a styryl compound represented by the structural formula (17)-76 below (which is one of the styryl compounds represented by the general formula [I] given above) and Alq₃ represented by the structural formula given above.

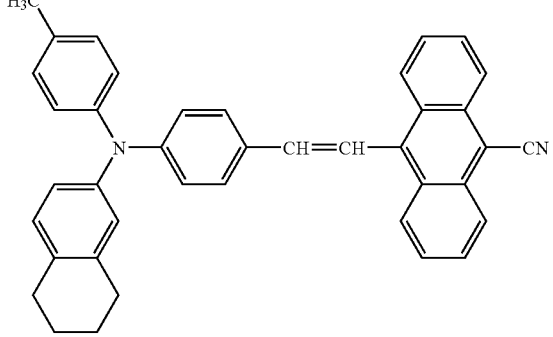

(17)-76

The organic electroluminescent element conforms to the layer structure and film forming method mentioned in Example 2.

The thus obtained organic electroluminescent element of an Example 78 was tested for light-emitting characteristics by application of forward bias direct current in an atmosphere of nitrogen. It emitted a red light, which was found by spectrometry (as in Example 1) to have a peak at about 625 nm. It gave a luminance of 630 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 700 hours for luminance to decrease by half.

EXAMPLE 79

This example demonstrates an organic electroluminescent element (bottom emitting type) of single hetero structure in which the electron transporting and emitting layer is formed from a mixture of a styryl compound represented by the structural formula (17)-77 below (which is one of the styryl compounds represented by the general formula [I] given above) and Alq₃ represented by the structural formula given above.

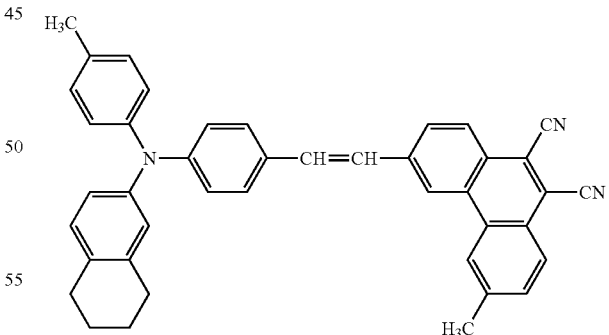

(17)-77

The organic electroluminescent element conforms to the layer structure and film forming method mentioned in Example 2.

The thus obtained organic electroluminescent element of an Example 79 was tested for light-emitting characteristics by application of forward bias direct current in an atmosphere of nitrogen. It emitted a red light, which was found by spectrometry (as in Example 1) to have a peak at about 635 nm. It gave a luminance of 1220 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 5200 hours for luminance to decrease by half.

EXAMPLE 80

This example demonstrates an organic electroluminescent element (bottom emitting type) of single hetero structure in which the electron transporting and emitting layer is formed from a mixture of a styryl compound represented by the structural formula (17)-78 below (which is one of the styryl compounds represented by the general formula [I] given above) and Alq₃ represented by the structural formula given above.

(17)-78

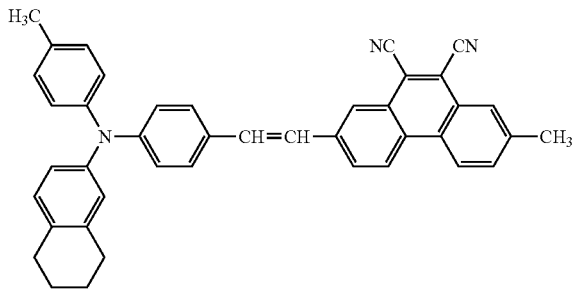

The organic electroluminescent element conforms to the layer structure and film forming method mentioned in Example 2.

The thus obtained organic electroluminescent element of an Example 80 was tested for light-emitting characteristics by application of forward bias direct current in an atmosphere of nitrogen. It emitted a red light, which was found by spectrometry (as in Example 1) to have a peak at about 645 nm. It gave a luminance of 1000 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1500 hours for luminance to decrease by half.

EXAMPLE 81

This example demonstrates an organic electroluminescent element (bottom emitting type) of single hetero structure in which the electron transporting and emitting layer is formed from a mixture of a styryl compound represented by the structural formula (17)-81 below (which is one of the styryl compounds represented by the general formula [I] given above) and Alq₃ represented by the structural formula given above.

(17)-81

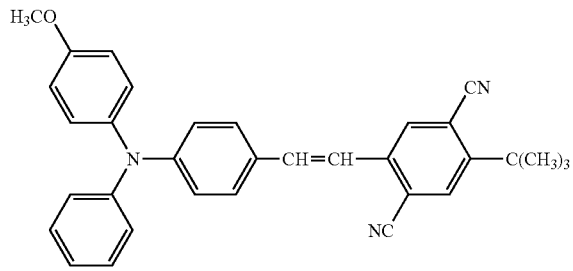

The organic electroluminescent element conforms to the layer structure and film forming method mentioned in Example 2.

The thus obtained organic electroluminescent element of an Example 81 was tested for light-emitting characteristics by application of forward bias direct current in an atmosphere of nitrogen. It emitted an orange light, which was found by spectrometry (as in Example 1) to have a peak at about 610 nm. It gave a luminance of 950 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 750 hours for luminance to decrease by half.

EXAMPLE 82

This example demonstrates an organic electroluminescent element (bottom emitting type) of single hetero structure in which the electron transporting and emitting layer is formed from a mixture of a styryl compound represented by the structural formula (17)-82 below (which is one of the styryl compounds represented by the general formula [I] given above) and Alq₃ represented by the structural formula given above.

(17)-82

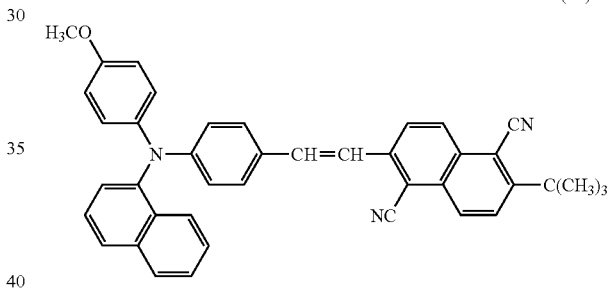

The organic electroluminescent element conforms to the layer structure and film forming method mentioned in Example 2.

The thus obtained organic electroluminescent element of an Example 82 was tested for light-emitting characteristics by application of forward bias direct current in an atmosphere of nitrogen. It emitted an orange light, which was found by spectrometry (as in Example 1) to have a peak at about 610 nm. It gave a luminance of 2000 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 2700 hours for luminance to decrease by half.

EXAMPLE 83

This example demonstrates an organic electroluminescent element (bottom emitting type) of single hetero structure in which the electron transporting and emitting layer is formed from a mixture of a styryl compound represented by the structural formula (17)-83 below (which is one of the styryl compounds represented by the general formula [I] given above) and Alq₃ represented by the structural formula given above.

(17)-83

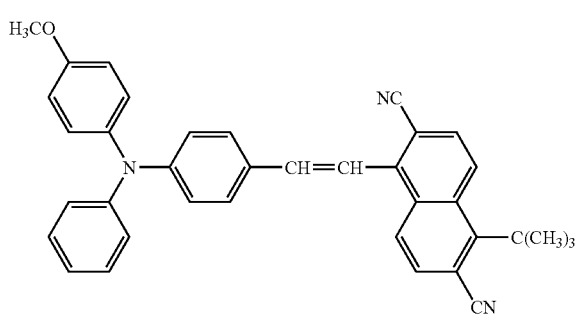

The organic electroluminescent element conforms to the layer structure and film forming method mentioned in Example 2.

The thus obtained organic electroluminescent element of an Example 83 was tested for light-emitting characteristics by application of forward bias direct current in an atmosphere of nitrogen. It emitted an orange light, which was found by spectrometry (as in Example 1) to have a peak at about 595 nm. It gave a luminance of 1400 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1500 hours for luminance to decrease by half.

EXAMPLE 84

This example demonstrates an organic electroluminescent element (bottom emitting type) of single hetero structure in which the electron transporting and emitting layer is formed from a mixture of a styryl compound represented by the structural formula (17)-84 below (which is one of the styryl compounds represented by the general formula [I] given above) and Alq₃ represented by the structural formula given above.

(17)-84

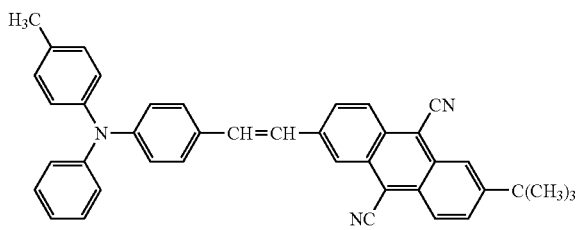

The organic electroluminescent element conforms to the layer structure and film forming method mentioned in Example 2.

The thus obtained organic electroluminescent element of an Example 84 was tested for light-emitting characteristics by application of forward bias direct current in an atmosphere of nitrogen. It emitted a red light, which was found by spectrometry (as in Example 1) to have a peak at about 690 nm. It gave a luminance of 170 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 450 hours for luminance to decrease by half.

EXAMPLE 85

This example demonstrates an organic electroluminescent element (bottom emitting type) of single hetero structure in which the electron transporting and emitting layer is formed from a mixture of a styryl compound represented by the structural formula (17)-85 below (which is one of the styryl compounds represented by the general formula [I] given above) and Alq₃ represented by the structural formula given above.

(17)-85

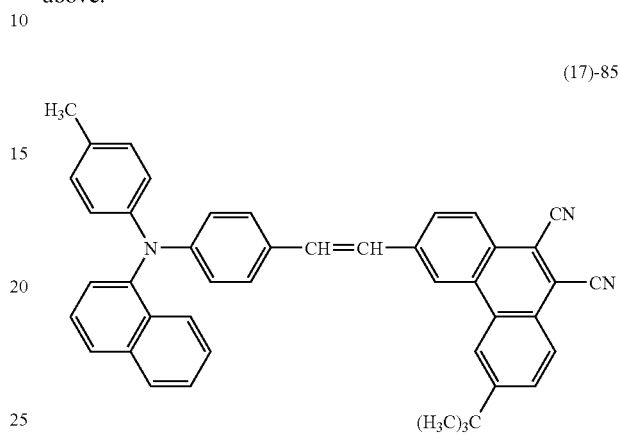

The organic electroluminescent element conforms to the layer structure and film forming method mentioned in Example 2.

The thus obtained organic electroluminescent element of an Example 85 was tested for light-emitting characteristics by application of forward bias direct current in an atmosphere of nitrogen. It emitted a red light, which was found by spectrometry (as in Example 1) to have a peak at about 640 nm. It gave a luminance of 1100 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 5300 hours for luminance to decrease by half.

EXAMPLE 86

This example demonstrates an organic electroluminescent element (bottom emitting type) of single hetero structure in which the electron transporting and emitting layer is formed from a mixture of a styryl compound represented by the structural formula (17)-86 below (which is one of the styryl compounds represented by the general formula [I] given above) and Alq₃ represented by the structural formula given above.

(17)-86

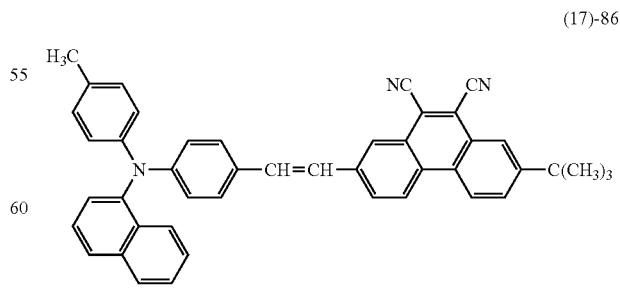

The organic electroluminescent element conforms to the layer structure and film forming method mentioned in Example 2.

The thus obtained organic electroluminescent element of an Example 86 was tested for light-emitting characteristics by application of forward bias direct current in an atmosphere of nitrogen. It emitted a red light, which was found by spectrometry (as in Example 1) to have a peak at about 650 nm. It gave a luminance of 900 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 1600 hours for luminance to decrease by half.

COMPARATIVE EXAMPLE 1

This comparative example is intended to make a comparison between two organic electroluminescent elements for their characteristic properties, one element having an electron transporting layer (emitting layer) formed from a mixture of a styryl compound represented by the structural formula (17)-8 given above and Alq$_3$ represented by the structural formula given above, and the other element having an electron transporting layer (emitting layer) formed only from a styryl compound represented by the structural formula (17)-8 given above.

The organic electroluminescent element conforms to the layer structure and film forming method mentioned in Example 2.
Structure of Element:
Element 3 (Example 12): ITO/α-NPD (50 nm)/styryl compound of structural formula (17)-8 +Alq$_3$ (50 nm)/Mg:Ag (200 nm)
Element 4 (Comparative Example 1): ITO/α-NPD (50 nm)/ compound (17)-8 (50 nm)/Mg:Ag (200 nm)

Both element 3 and element 4 emitted an orange light, which was found by spectrometry (as in Example 1) to have a peak at about 610 nm.

These elements underwent accelerated test for degradation in which current to produce the initial luminance of 300 cd/m² was maintained. The results indicated that element 3 took 1300 hours for luminance to decrease by half, whereas element 4, in which the emitting layer was formed only from a styryl compound, took 350 hours for luminance to decrease by half.

COMPARATIVE EXAMPLE 2

This comparative example is intended to make a comparison between two organic electroluminescent elements for their characteristic properties, one element having an electron transporting layer (emitting layer) formed from a mixture of a styryl compound represented by the structural formula (17)-14 given above and Alq$_3$ represented by the structural formula given above, and the other element having an electron transporting layer (emitting layer) formed only from a styryl compound represented by the structural formula (17)-14 given above.

The organic electroluminescent element conforms to the layer structure and film forming method mentioned in Example 2.
Structure of Element:
Element 5 (Example 17): ITO/α-NPD (50 nm)/styryl compound of structural formula (17)-14+Alq$_3$ (50 nm)/Mg:Ag (200 nm)
Element 6 (Comparative Example 2): ITO/α-NPD (50 nm)/ styryl compound of structural formula (17)-14 (50 nm)/ Mg:Ag (200 nm)

Both element 5 and element 6 emitted an orange light, which was found by spectrometry (as in Example 1) to have a peak at about 605 nm.

These elements underwent accelerated test for degradation in which current to produce the initial luminance of 300 cd/m² was maintained. The results indicated that element 5 took 3300 hours for luminance to decrease by half, whereas element 6, in which the emitting layer was formed only from a styryl compound, took 600 hours for luminance to decrease by half.

COMPARATIVE EXAMPLE 3

This comparative example is intended to make a comparison between two organic electroluminescent elements for their characteristic properties, one element having an electron transporting layer (emitting layer) formed from a mixture of a styryl compound represented by the structural formula (17)-20 given above and Alq$_3$ represented by the structural formula given above, and the other element having an electron transporting layer (emitting layer) formed only from a styryl compound represented by the structural formula (17)-20 given above.

The organic electroluminescent element conforms to the layer structure and film forming method mentioned in Example 2.
Structure of Element:
Element 7 (Example 23): ITO/α-NPD (50 nm)/styryl compound of structural formula (17)-20+Alq$_3$ (50 nm)/Mg:Ag (200 nm)
Element 8 (Comparative Example 3): ITO/α-NPD (50 nm)/ styryl compound of structural formula (17)-20 (50 nm)/ Mg:Ag (200 nm)

Both element 7 and element 8 emitted a red light, which was found by spectrometry (as in Example 1) to have a peak at about 680 nm.

These elements underwent accelerated test for degradation in which current to produce the initial luminance of 300 cd/m² was maintained. The results indicated that element 7 took 500 hours for luminance to decrease by half, whereas element 8, in which the emitting layer was formed only from a styryl compound, took 120 hours for luminance to decrease by half.

COMPARATIVE EXAMPLE 4

This comparative example is intended to make a comparison between two organic electroluminescent elements for their characteristic properties, one element having an electron transporting layer (emitting layer) formed from a mixture of a styryl compound represented by the structural formula (17)-26 given above and Alq$_3$ represented by the structural formula given above, and the other element having an electron transporting layer (emitting layer) formed only from a styryl compound represented by the structural formula (17)-26 given above.

The organic electroluminescent element conforms to the layer structure and film forming method mentioned in Example 2.
Structure of Element:
Element 9 (Example 29): ITO/α-NPD (50 nm)/styryl compound of structural formula (17)-26+Alq$_3$ (50 nm)/Mg:Ag (200 nm)
Element 10 (Comparative Example 4): ITO/α-NPD (50 nm)/ styryl compound of structural formula (17)-26 (50 nm)/ Mg:Ag (200 nm)

Both element 9 and element 10 emitted a red light, which was found by spectrometry (as in Example 1) to have a peak at about 630 nm.

These elements underwent accelerated test for degradation in which current to produce the initial luminance of 300 cd/m$^2$ was maintained. The results indicated that element 9 took 780 hours for luminance to decrease by half, whereas element 10, in which the emitting layer was formed only from a styryl compound, took 170 hours for luminance to decrease by half.

COMPARATIVE EXAMPLE 5

This comparative example is intended to make a comparison between two organic electroluminescent elements for their characteristic properties, one element having an electron transporting layer (emitting layer) formed from a mixture of a styryl compound represented by the structural formula (17)-32 given above and Alq$_3$ represented by the structural formula given above, and the other element having an electron transporting layer (emitting layer) formed only from a styryl compound represented by the structural formula (17)-32 given above.

The organic electroluminescent element conforms to the layer structure and film forming method mentioned in Example 2.

Structure of Element:

Element 11 (Example 35): ITO/α-NPD (50 nm)/styryl compound of structural formula (17)-32+Alq$_3$ (50 nm)/Mg:Ag (200 nm)

Element 12 (Comparative Example 5): ITO/α-NPD (50 nm)/styryl compound of structural formula (17)-32 (50 nm)/Mg:Ag (200 nm)

Both element 11 and element 12 emitted a red light, which was found by spectrometry (as in Example 1) to have a peak at about 640 nm.

These elements underwent accelerated test for degradation in which current to produce the initial luminance of 300 cd/m$^2$ was maintained. The results indicated that element 11 took 5500 hours for luminance to decrease by half, whereas element 12, in which the emitting layer was formed only from a styryl compound, took 800 hours for luminance to decrease by half.

COMPARATIVE EXAMPLE 6

This comparative example is intended to make a comparison between two organic electroluminescent elements for their characteristic properties, one element having an electron transporting layer (emitting layer) formed from a mixture of a styryl compound represented by the structural formula (17)-42 given above and Alq$_3$ represented by the structural formula given above, and the other element having an electron transporting layer (emitting layer) formed only from a styryl compound represented by the structural formula (17)-42 given above.

The organic electroluminescent element conforms to the layer structure and film forming method mentioned in Example 2.

Structure of Element:

Element 13 (Example 45): ITO/α-NPD (50 nm)/styryl compound of structural formula (17)-42+Alq$_3$ (50 nm)/Mg:Ag (200 nm)

Element 14 (Comparative Example 6): ITO/α-NPD (50 nm)/styryl compound of structural formula (17)-42 (50 nm)/Mg:Ag (200 nm)

Both element 13 and element 14 emitted a red light, which was found by spectrometry (as in Example 1) to have a peak at about 650 nm.

These elements underwent accelerated test for degradation in which current to produce the initial luminance of 300 cd/m$^2$ was maintained. The results indicated that element 13 took 1550 hours for luminance to decrease by half, whereas element 14, in which the emitting layer was formed only from a styryl compound, took 280 hours for luminance to decrease by half.

COMPARATIVE EXAMPLE 7

This comparative example is intended to make a comparison between two organic electroluminescent elements for their characteristic properties, one element having an electron transporting layer (emitting layer) formed from a mixture of a styryl compound represented by the structural formula (17)-51 given above and Alq$_3$ represented by the structural formula given above, and the other element having an electron transporting layer (emitting layer) formed only from a styryl compound represented by the structural formula (17)-51 given above.

The organic electroluminescent element conforms to the layer structure and film forming method mentioned in Example 2.

Structure of Element:

Element 15 (Example 54): ITO/α-NPD (50 nm)/styryl compound of structural formula (17)-51 +Alq$_3$ (50 nm)/Mg:Ag (200 nm)

Element 16 (Comparative Example 7): ITO/α-NPD (50 nm)/styryl compound of structural formula (17)-51 (50 nm)/Mg:Ag (200 nm)

Both element 15 and element 16 emitted a red light, which was found by spectrometry (as in Example 1) to have a peak at about 645 nm.

These elements underwent accelerated test for degradation in which current to produce the initial luminance of 300 cd/m$^2$ was maintained. The results indicated that element 15 took 1050 hours for luminance to decrease by half, whereas element 16, in which the emitting layer was formed only from a styryl compound, took 180 hours for luminance to decrease by half.

COMPARATIVE EXAMPLE 8

This comparative example is intended to make a comparison between two organic electroluminescent elements for their characteristic properties, one element having an electron transporting layer (emitting layer) formed from a mixture of a styryl compound represented by the structural formula (17)-55 given above and Alq$_3$ represented by the structural formula given above, and the other element having an electron transporting layer (emitting layer) formed only from a styryl compound represented by the structural formula (17)-55 given above.

The organic electroluminescent element conforms to the layer structure and film forming method mentioned in Example 2.

Structure of Element:

Element 17 (Example 58): ITO/α-NPD (50 nm)/styryl compound of structural formula (17)-55+Alq$_3$ (50 nm)/Mg:Ag (200 nm)

Element 18 (Comparative Example 8): ITO/α-NPD (50 nm)/styryl compound of structural formula (17)-55 (50 nm)/Mg:Ag (200 nm)

Both element 17 and element 18 emitted an orange light, which was found by spectrometry (as in Example 1) to have a peak at about 590 nm.

These elements underwent accelerated test for degradation in which current to produce the initial luminance of 300 cd/m$^2$ was maintained. The results indicated that element 17 took 250 hours for luminance to decrease by half, whereas element 18, in which the emitting layer was formed only from a styryl compound, took 70 hours for luminance to decrease by half.

EXAMPLE 87

This example demonstrates an organic electroluminescent element of top emitting type in which the electron transporting layer (emitting layer) is formed from a mixture composed of a styryl compound represented by the structural formula (17)-32 given above (which is one of the styryl compounds represented by the general formula [I] given above) and Alq$_3$ represented by the structural formula given above.

First, a glass substrate, measuring 30 mm by 30 mm, was placed in a vacuum deposition apparatus. This glass substrate has an anode composed of a 100-nm thick film of silver alloy and a 10-nm thick film of ITO, which are formed on top of the other. The glass substrate underwent vacuum deposition at 10$^{-4}$ Pa or less, with a metal mask arranged close thereto, which has a plurality of openings, each measuring 2.0 mm by 2.0 mm. The vacuum deposition gave rise to a 20-nm thick layer of 2-TNATA represented by the structural formula given below and then a 43-nm thick layer of α-NPD. The rate of deposition was adjusted to 0.1 nm/s for each component.

2-TNATA

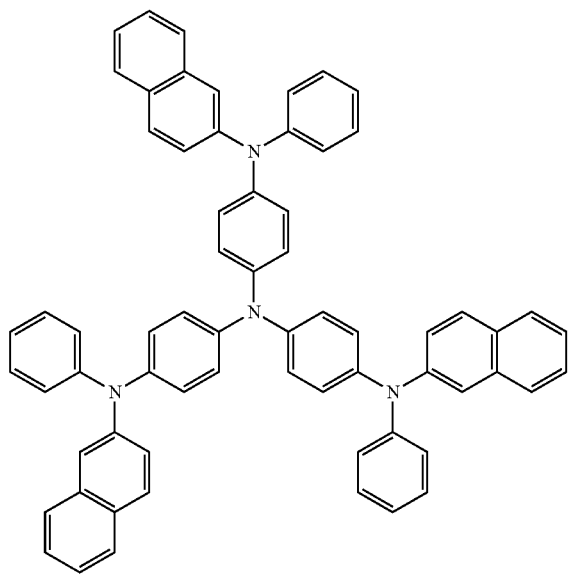

On the hole transporting layer was formed the electron transporting and emitting layer from a mixture of a styryl compound represented by the structural formula (17)-32 given above and Alq$_3$ in a mixing ratio of 1:1 by weight. The thickness of the emitting layer (mixture layer) is 30 nm. The rate of deposition was adjusted to 0.2 nm/s for each component.

On the emitting layer was formed by vacuum deposition an electron transporting layer from Alq$_3$. The thickness of the layer of Alq$_3$ is 36 nm.

A 12-nm thick cathode was formed by vacuum deposition from Mg and Ag in a mixing ratio of 5:1. In this way, there was obtained the organic electroluminescent element as shown in FIG. 6.

The thus obtained organic electroluminescent element was tested for light-emitting characteristics by application of forward bias direct current in an atmosphere of nitrogen. It emitted a red light, which was found by spectrometry (as in Example 1) to have a peak at about 640 nm. It gave a luminance of 850 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 8300 hours for luminance to decrease by half.

EXAMPLE 88

This example demonstrates an organic electroluminescent element of top emitting type in which the electron transporting and emitting layer is formed from a mixture of a styryl compound represented by the structural formula (17)-33 given above (which is one of the styryl compounds represented by the general formula [I] given above) and Alq$_3$ represented by the structural formula given above.

The organic electroluminescent element conforms to the layer structure and film forming method mentioned in Example 87.

The thus obtained organic electroluminescent element of an Example 88 was tested for light-emitting characteristics by application of forward bias direct current in an atmosphere of nitrogen. It emitted a red light, which was found by spectrometry (as in Example 1) to have a peak at about 640 nm. It gave a luminance of 900 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 7000 hours for luminance to decrease by half.

EXAMPLE 89

This example demonstrates an organic electroluminescent element of top emitting type in which the electron transporting and emitting layer is formed from a mixture of a styryl compound represented by the structural formula (17)-34 given above (which is one of the styryl compounds represented by the general formula [I] given above) and Alq$_3$ represented by the structural formula given above.

The organic electroluminescent element conforms to the layer structure and film forming method mentioned in Example 87.

The thus obtained organic electroluminescent element of an Example 89 was tested for light-emitting characteristics by application of forward bias direct current in an atmosphere of nitrogen. It emitted a red light, which was found by spectrometry (as in Example 1) to have a peak at about 643 nm. It gave a luminance of 800 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 6000 hours for luminance to decrease by half.

EXAMPLE 90

This example demonstrates an organic electroluminescent element of top emitting type in which the electron transporting and emitting layer is formed from a mixture of a styryl compound represented by the structural formula (17)-27 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 90 was tested for light-emitting characteristics by application of forward bias direct current in an atmosphere of nitrogen. It emitted a red light, which was found by spectrometry (as in Example 1) to have a peak at about 640 nm. It gave a luminance of 650 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 2200 hours for luminance to decrease by half.

EXAMPLE 91

This example demonstrates an organic electroluminescent element of top emitting type in which the electron transporting and emitting layer is formed from a mixture of a styryl compound represented by the structural formula (17)-28 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 91 was tested for light-emitting characteristics by application of forward bias direct current in an atmosphere of nitrogen. It emitted a red light, which was found by spectrometry (as in Example 1) to have a peak at about 642 nm. It gave a luminance of 680 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3500 hours for luminance to decrease by half.

EXAMPLE 92

This example demonstrates an organic electroluminescent element of top emitting type in which the electron transporting and emitting layer is formed from a mixture of a styryl compound represented by the structural formula (17)-29 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 92 was tested for light-emitting characteristics by application of forward bias direct current in an atmosphere of nitrogen. It emitted a red light, which was found by spectrometry (as in Example 1) to have a peak at about 645 nm. It gave a luminance of 660 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3800 hours for luminance to decrease by half.

EXAMPLE 93

This example demonstrates an organic electroluminescent element of top emitting type in which the electron transporting and emitting layer is formed from a mixture of a styryl compound represented by the structural formula (17)-30 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 93 was tested for light-emitting characteristics by application of forward bias direct current in an atmosphere of nitrogen. It emitted a red light, which was found by spectrometry (as in Example 1) to have a peak at about 650 nm. It gave a luminance of 700 cd/m$^2$ at 8 V.

The sample showed no sign of degradation after standing for 1 month in an atmosphere of nitrogen. The accelerated test for degradation, in which current to produce the initial luminance of 300 cd/m$^2$ was maintained, revealed that it took 3300 hours for luminance to decrease by half.

EXAMPLE 94

This example demonstrates an organic electroluminescent element of top emitting type in which the electron transporting and emitting layer is formed from a mixture of a styryl compound represented by the structural formula (17)-31 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 94 was tested for light-emitting characteristics by application of forward bias direct current in an atmosphere of nitrogen. It emitted a red light, which was found by spectrometry (as in Example 1) to have a peak at about 640 nm. It gave a luminance of 1100 cd/m$^2$ at 8 V.

The sample showed no sign of degradation after standing for 1 month in an atmosphere of nitrogen. The accelerated test for degradation, in which current to produce the initial luminance of 3.00 cd/m$^2$ was maintained, revealed that it took 6000 hours for luminance to decrease by half.

EXAMPLE 95

This example demonstrates an organic electroluminescent element of top emitting type in which the electron transporting and emitting layer is formed from a mixture of a styryl compound represented by the structural formula (17)-20 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 95 was tested for light-emitting characteristics by application of forward bias direct current in an atmosphere of nitrogen. It emitted a red light, which was found by spectrometry (as in Example 1) to have a peak at about 655 nm. It gave a luminance of 200 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 500 hours for luminance to decrease by half.

EXAMPLE 96

This example demonstrates an organic electroluminescent element of top emitting type in which the electron transporting and emitting layer is formed from a mixture of a styryl compound represented by the structural formula (17)-23 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 96 was tested for light-emitting characteristics by application of forward bias direct current in an atmosphere of nitrogen. It emitted a red light, which was found by spectrometry (as in Example 1) to have a peak at about 655 nm. It gave a luminance of 210 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 350 hours for luminance to decrease by half.

EXAMPLE 97

This example demonstrates an organic electroluminescent element of top emitting type in which the electron transporting and emitting layer is formed from a mixture of a styryl compound represented by the structural formula (17)-13 given above (which is one of the styryl compounds represented by the general formula [I] given above) and $Alq_3$ represented by the structural formula given above.

The organic electroluminescent element conforms to the layer structure and film forming method mentioned in Example 87.

The thus obtained organic electroluminescent element of an Example 97 was tested for light-emitting characteristics by application of forward bias direct current in an atmosphere of nitrogen. It emitted a red light, which was found by spectrometry (as in Example 1) to have a peak at about 630 nm. It gave a luminance of 1800 cd/m² at 8 V.

The sample showed no sign of degradation after standing for 1 month in an atmosphere of nitrogen. The accelerated test for degradation, in which current to produce the initial luminance of 300 cd/m² was maintained, revealed that it took 2500 hours for luminance to decrease by half.

The present invention provides an organic electroluminescent element and a light-emitting device incorporated therewith. The organic electroluminescent element has an organic layer with an emitting region which is sandwiched between an anode and a cathode. The organic layer includes at least one layer which is formed from a mixture of at least one species of the styryl compounds represented by the general formula [I] given above and a material with charge transporting capability. Owing to this structure, the organic electroluminescent element is superior in luminance, reliability, and thermal stability. It selectively emits light with comparative long wavelengths such as red and good color purity.

The invention claimed is:

1. An organic electroluminescent element in which organic layers having an emitting layer for emitting red light are formed between the anode and the cathode, characterized in that the emitting layer is formed from a mixture comprised of at least one species of the styryl compounds represented by the general formula given below and an electron transporting material selected from the group consisting of 8-hydroxyquinoline aluminum ($Alq^3$), anthracene, naphthalene, phenanthrene, pyrene, chrysene, perylene, butadiene, coumarin, acridine, and stilbene, and derivatives thereof, and further comprising at least one member from the group consisting of DCM, porphins, phthalocyanines, perylene compounds, Nile red, or squarilium compounds,

   General formula where, in the general formula, X denotes any group represented by the general formulas (1) to (13) shown below;

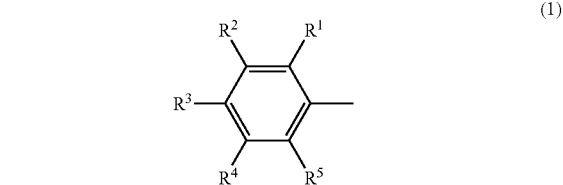

(1)

(2)

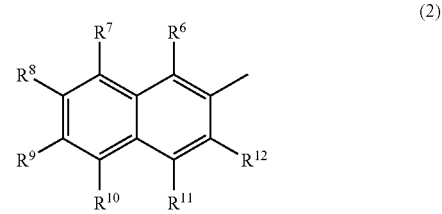

(3)

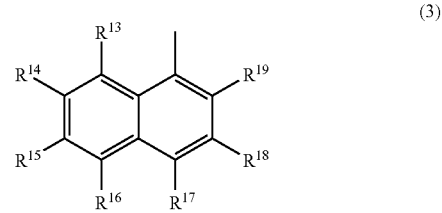

(4)

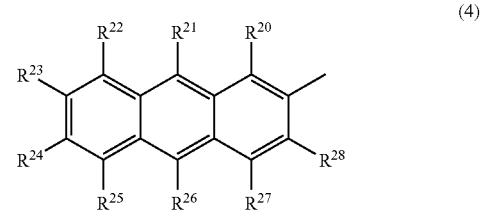

(5)

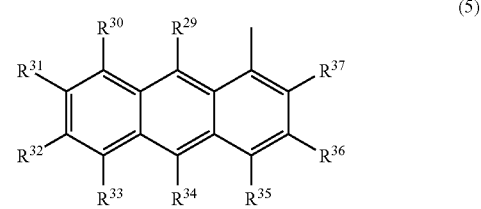

(6)

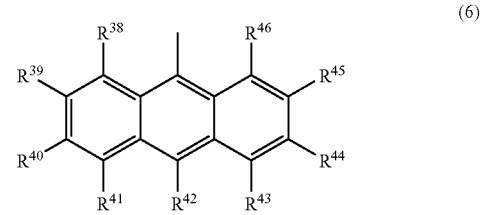

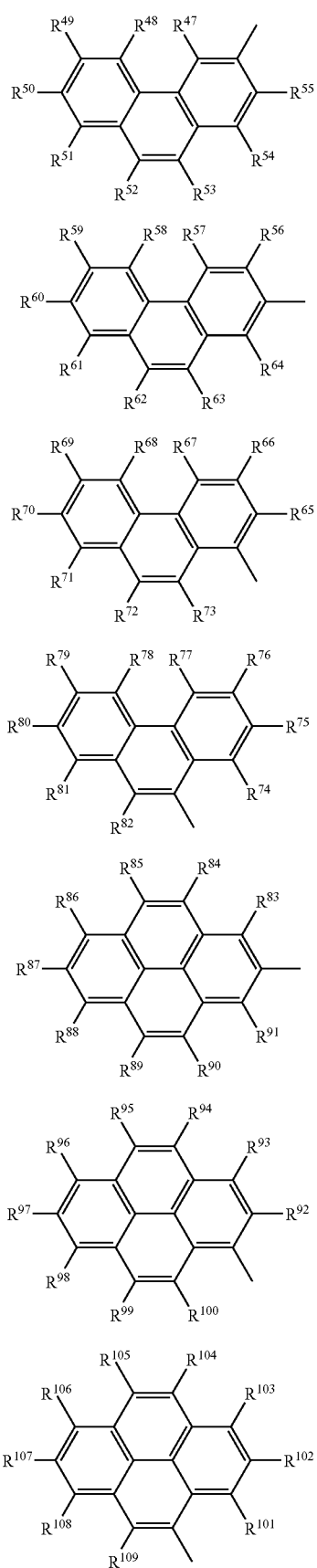

(where, in the general formula, $R^1$ to $R^5$ may be identical or different, and at least one of them is a group selected from halogen atom, nitro group, cyano group, trifluoromethyl group, alkyl group (optionally substituted), and alkoxyl group (optionally substituted); and in the general formulas (2) to (13), each of $R^6$ to $R^{109}$, which may be identical or different, denotes a group selected from halogen atom, nitro group, cyano group, trifluoromethyl group, alkyl group (optionally substituted), and alkoxyl group (optionally substituted);

also, in the general formula, Y denotes any group represented by the general formulas (14) to (16) shown below;

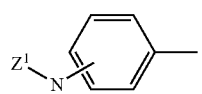 (14)

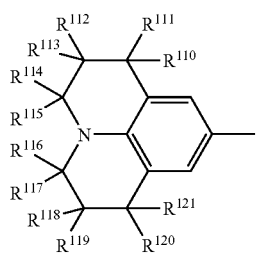 (15)

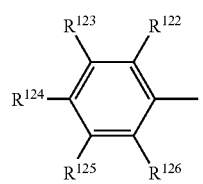 (16)

(where, in the general formula (14) above, each of $Z^1$ and $Z^2$, which may be identical or different, is a group selected from hydrogen atom, alkyl group (optionally substituted), and aryl group (optionally substituted); and in the general formulas (15) and (16) above, each of $R^{110}$ to $R^{126}$, which may be identical or different, denotes a group selected from hydrogen atom, alkyl group (optionally substituted), aryl group (optionally substituted), alkoxyl group (optionally substituted), halogen atom, nitro group, cyano group, and trifluoromethyl group).

2. The organic electroluminescent element as defined in claim 1, wherein at least one species of the styryl compounds represented by the general formula given above is mixed in concentrations ranging from 5 to 90 wt% with the material having the charge transporting capability in the mixture layer.

3. The organic electroluminescent element as defined in claim 2, wherein the least one species of the styryl compounds represented by the general formula given above is mixed in concentrations ranging from 30 to 90 wt% with the material having the charge transporting capability in the mixture layer.

4. The organic electroluminescent element as defined in claim 1, wherein the mixture contains at least one species of the styryl compounds represented by the general formula I given above and a red or orange emitting dye which has the emission maximum in the range of 600 nm to 700 nm.

5. A light-emitting device or display device incorporated with the organic electroluminescent element defined in any of claims 1 to 4.

6. A light-emitting device or display device incorporated with the organic electroluminescent element defined in claim 1, which has pixels constructed at least partially of the organic electroluminescent element.

7. The organic electroluminescent element as defined in claim 1, wherein the mixture contains at least two different species of the styryl compounds represented by the general formula I given above.

8. An organic electroluminescent element in which organic layers having an emitting layer for emitting red light are formed between the anode and the cathode, characterized in that the emitting layer is formed from a mixture comprised of at least one species of the styryl compounds represented by the structural formulas (17)-1 to (17)-18, and (17)-20 to (17)-86 given below and an electron transporting material selected from the group consisting of 8-hydroxyquinoline aluminum ($Alq^3$), anthracene, naphthalene, phenanthrene, pyrene, chrysene, perylene, butadiene, coumarin, acridine, and stilbene, and derivatives thereof, and further comprising at least one member from the group consisting of DCM, porphins, phthalocyanines, perylene compounds, Nile red, or squarilium compounds and further wherein the styryl compounds are comprised of one or more of the following a halogen atom, nitro group, cyano group, trifluoromethyl group, alkyl group (optionally substituted), and alkoxyl group (optionally substituted)

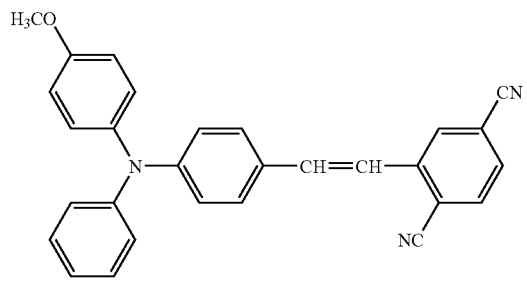

(17)-1

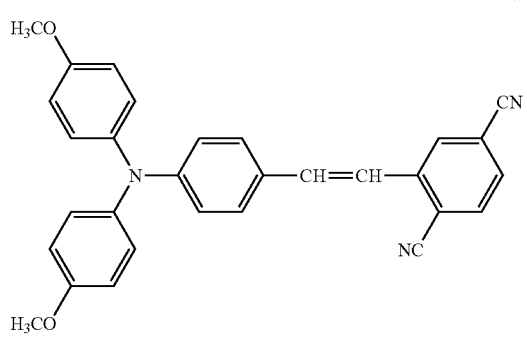

(17)-2

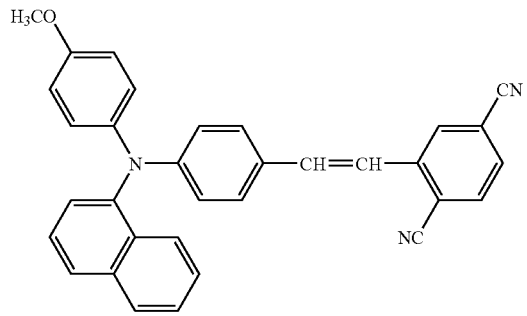

(17)-3

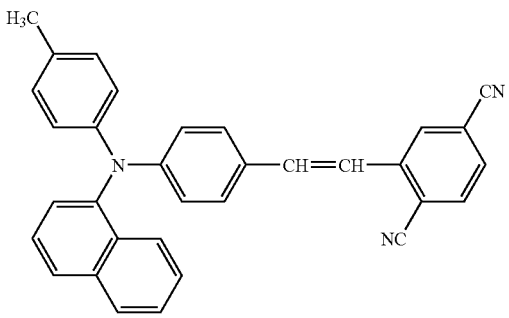

(17)-4

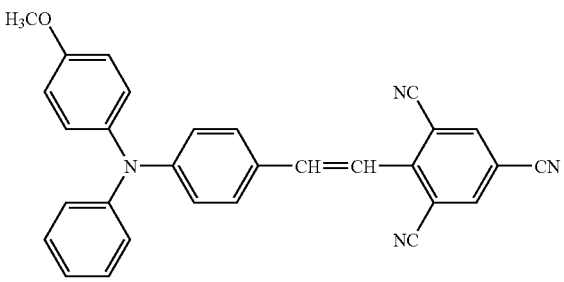

(17)-5

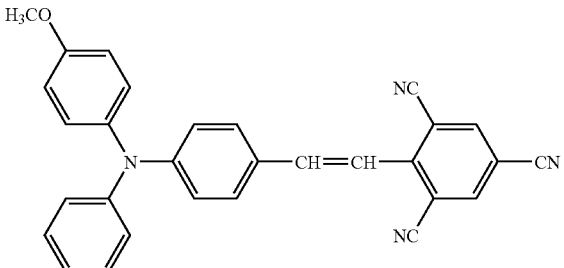

(17)-6

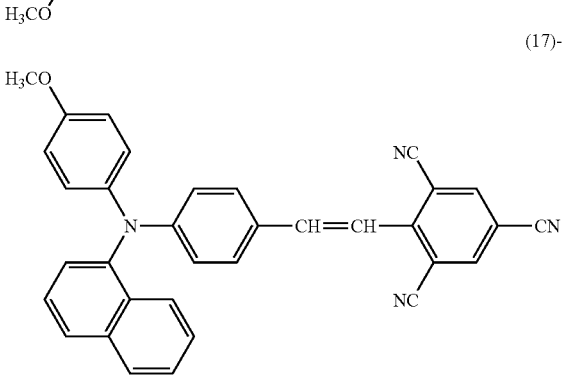

(17)-7

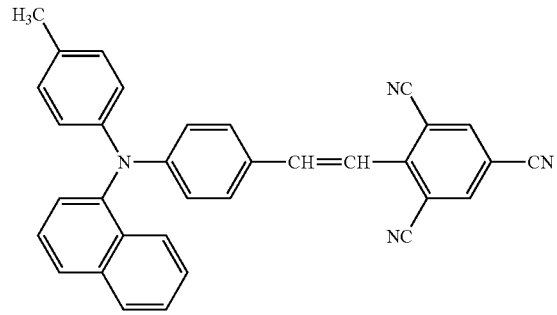

(17)-8

(17)-9
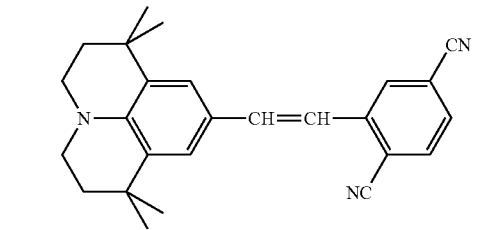
(17)-10
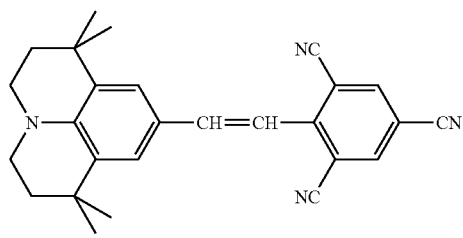
(17)-11
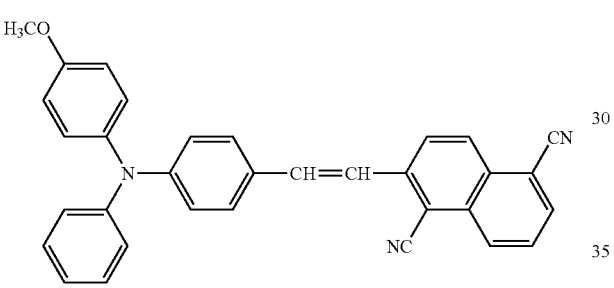
(17)-12
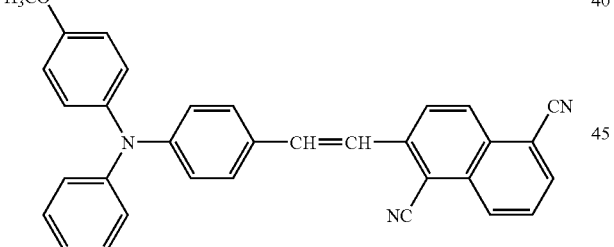
(17)-13
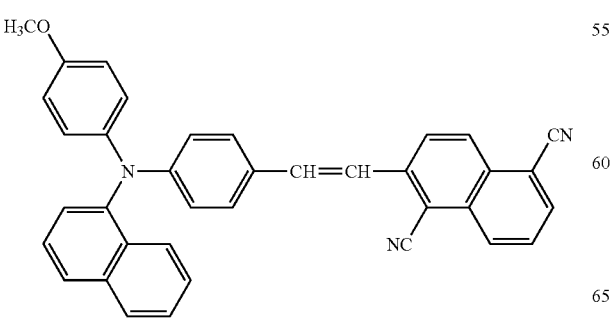
(17)-14
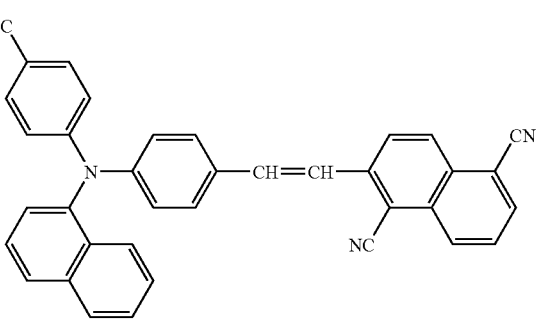
(17)-15
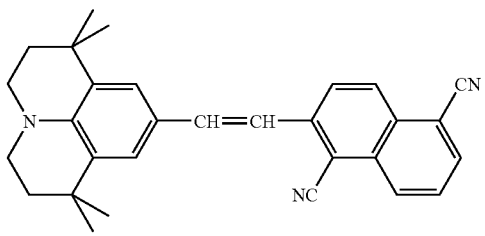
(17)-16
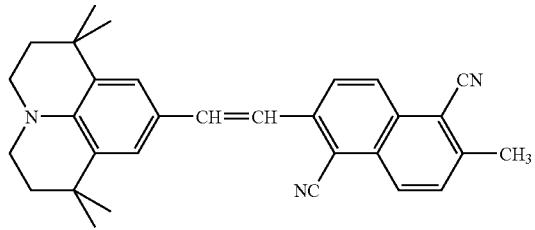
(17)-17
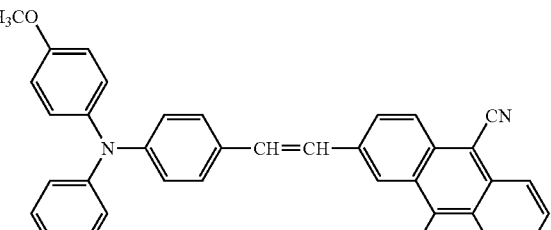
(17)-18
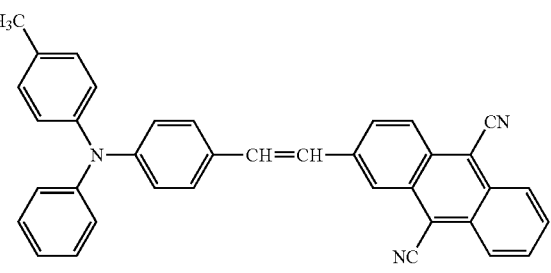

-continued
(17)-19
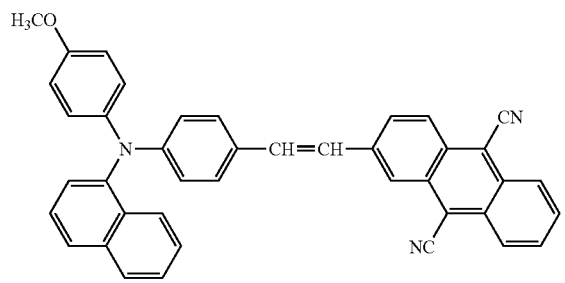
(17)-20
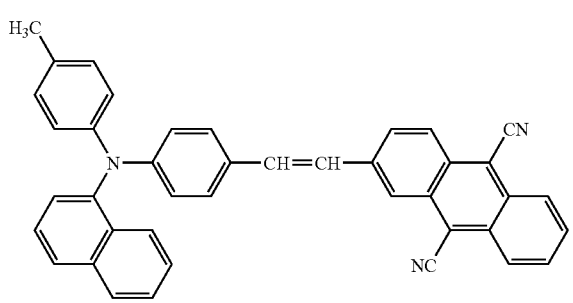
(17)-21
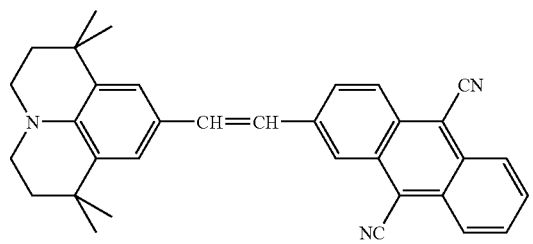
(17)-22
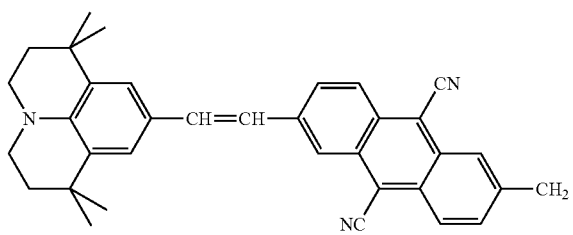
(17)-23
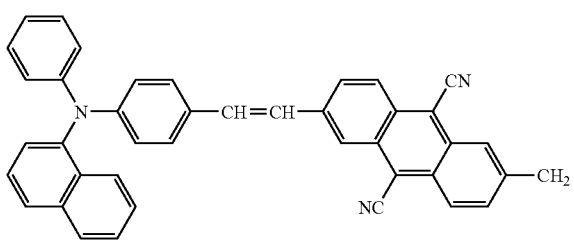
-continued
(17)-24
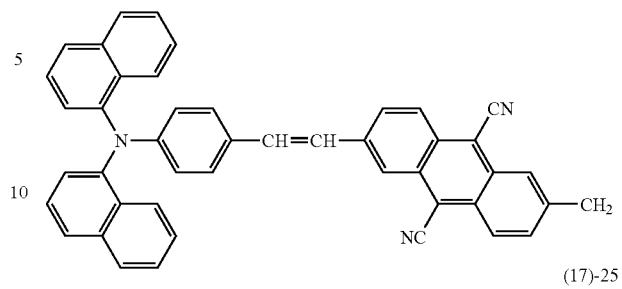
(17)-25
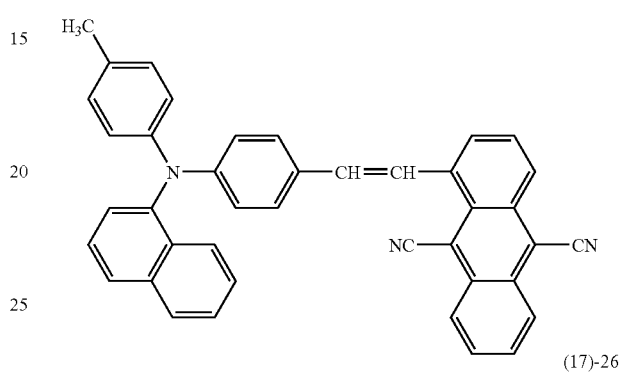
(17)-26
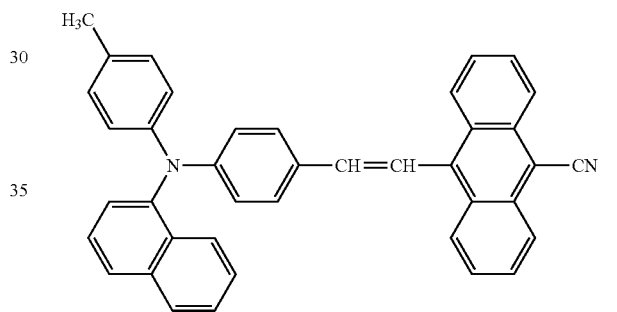
(17)-27
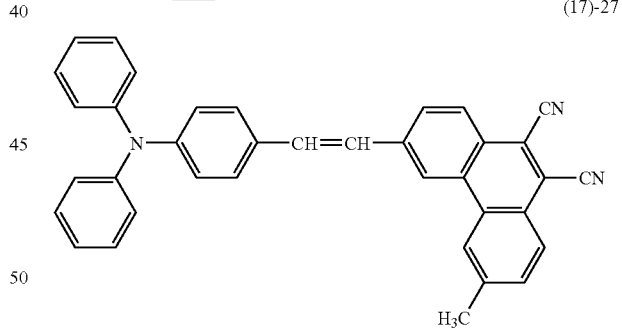
(17)-28
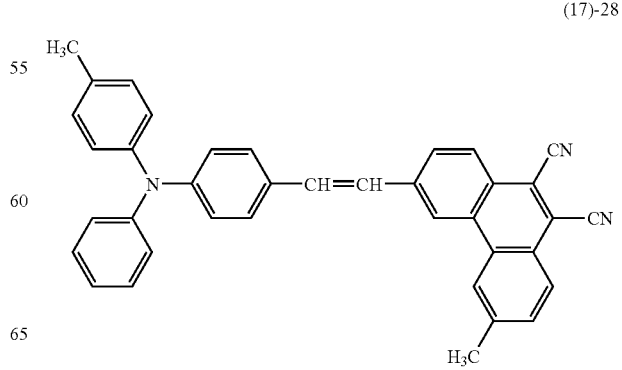

(17)-29
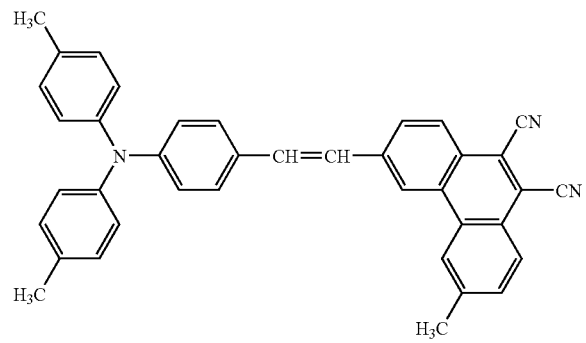
(17)-33
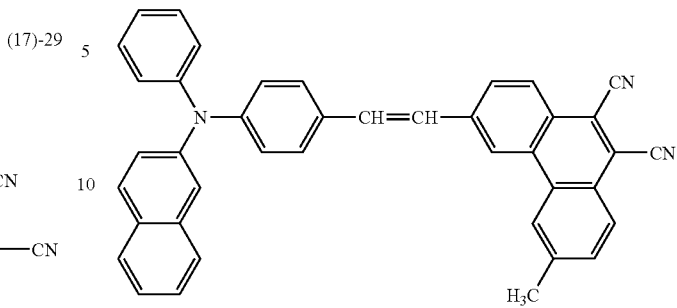
(17)-30
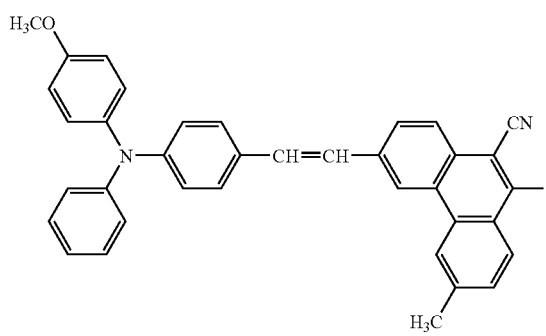
(17)-34
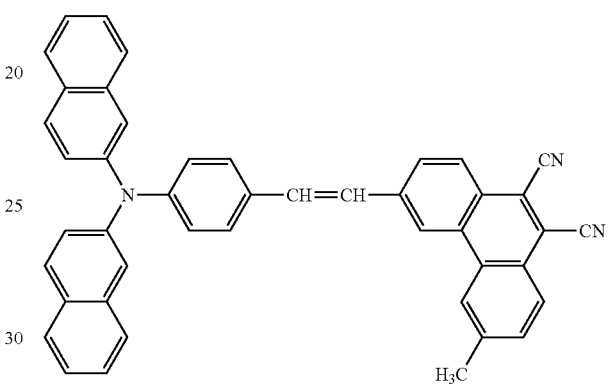
(17)-31
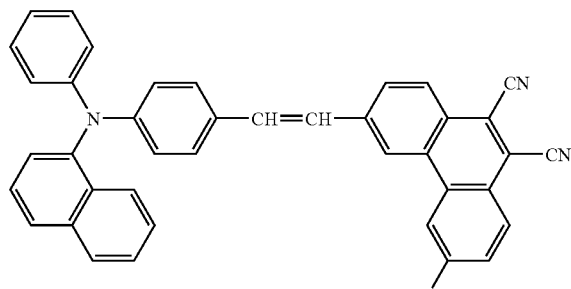
(17)-35
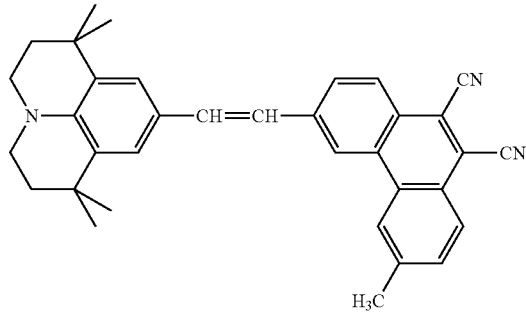
(17)-36
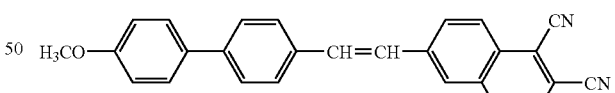
(17)-32
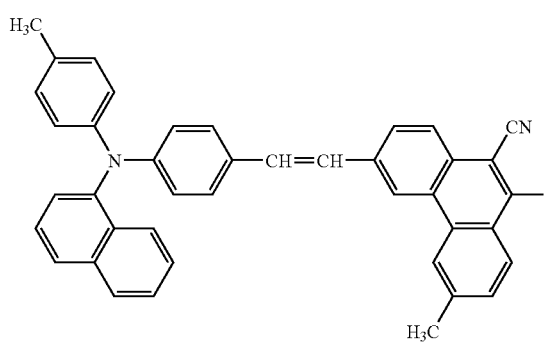
(17)-37
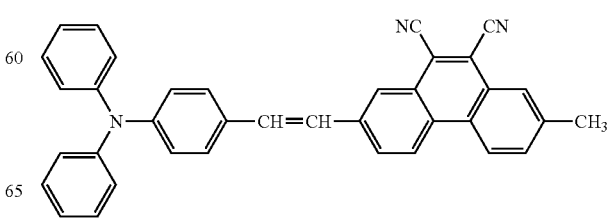

-continued
(17)-38
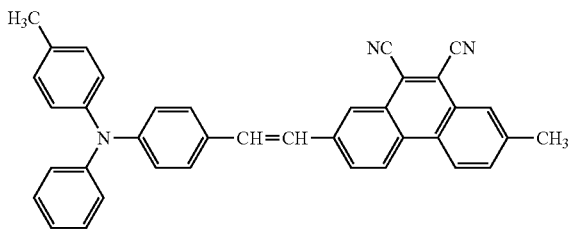
(17)-39
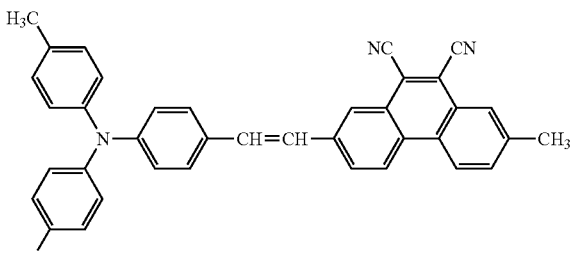
(17)-40
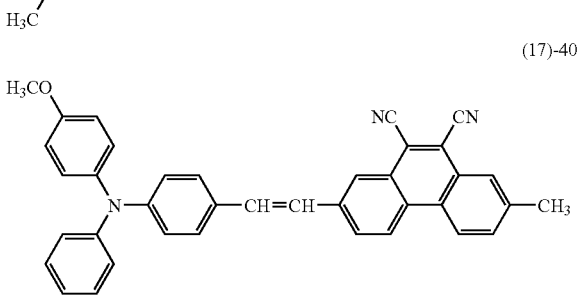
(17)-41
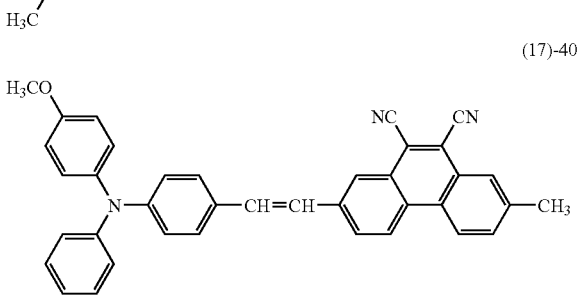
(17)-42
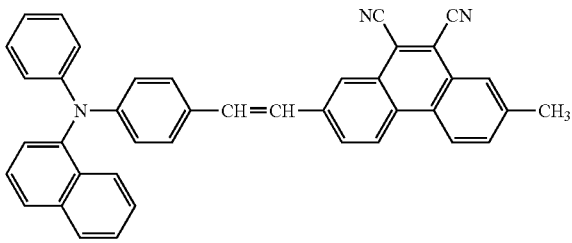
(17)-43
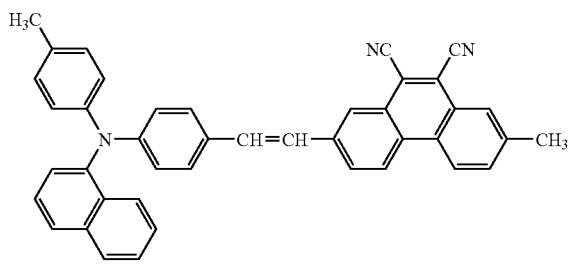
-continued
(17)-44
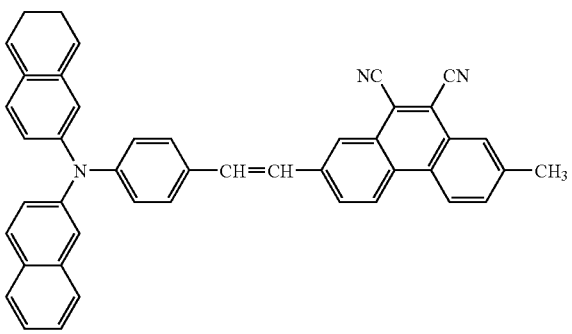
(17)-45
(17)-46
(17)-47

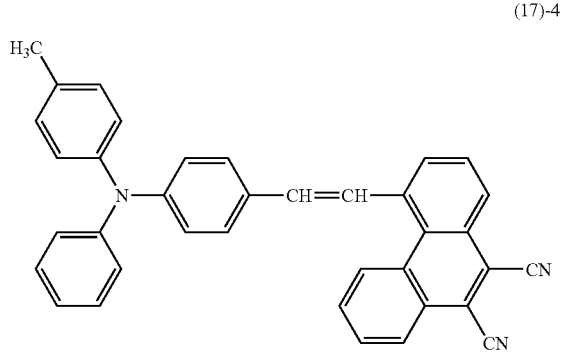
(17)-48
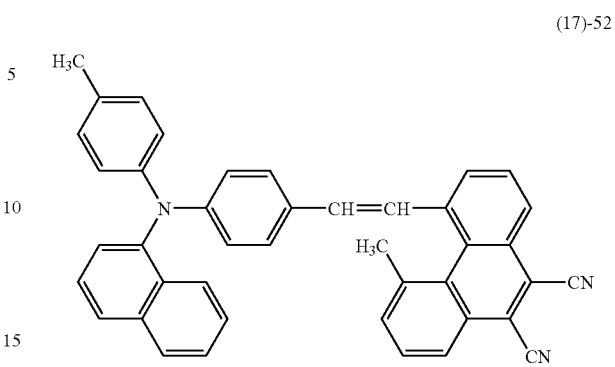
(17)-52
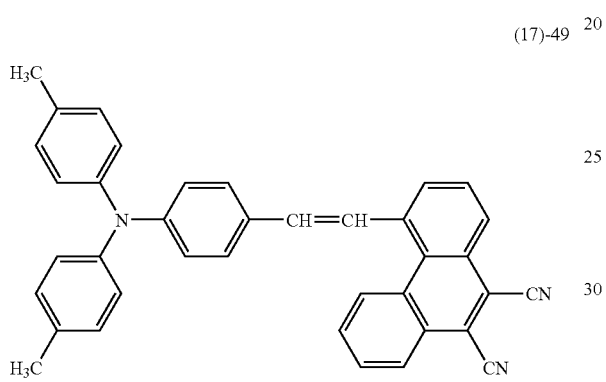
(17)-49
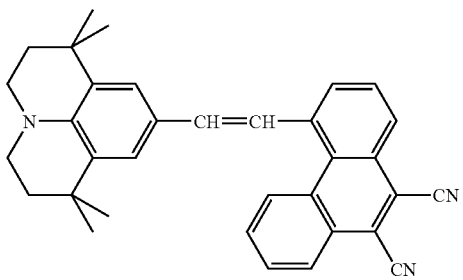
(17)-53
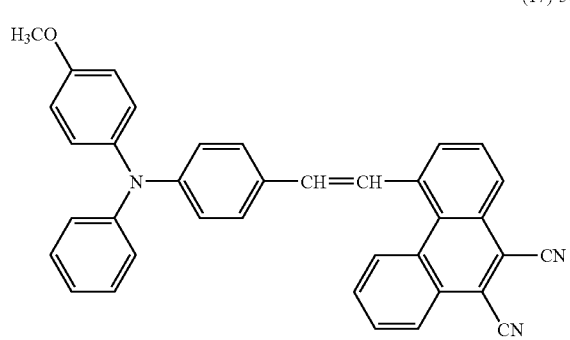
(17)-50
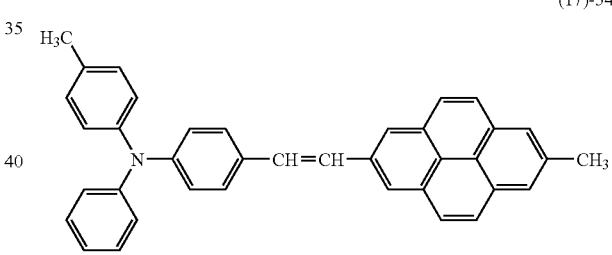
(17)-54
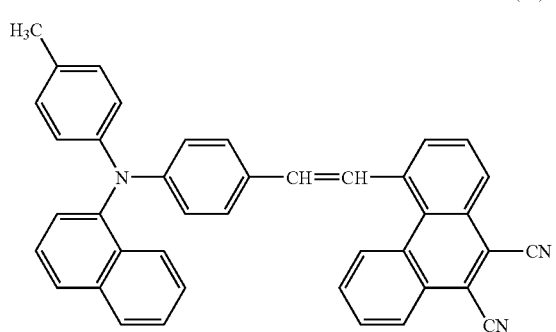
(17)-51
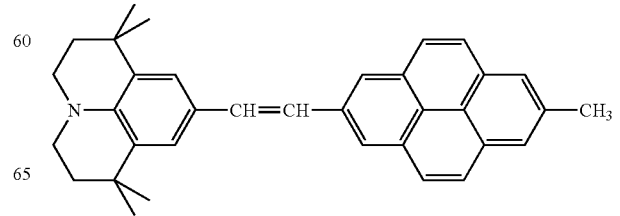
(17)-55
(17)-56

(17)-57
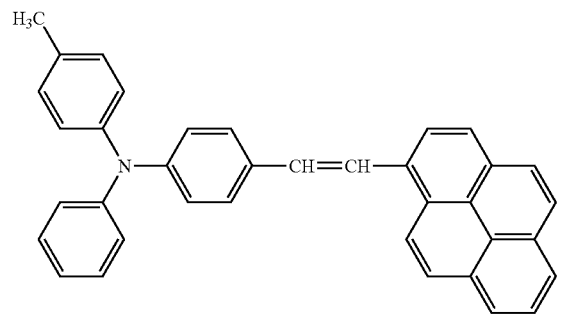
(17)-58
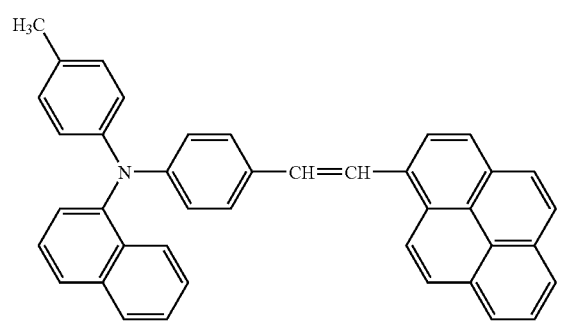
(17)-59
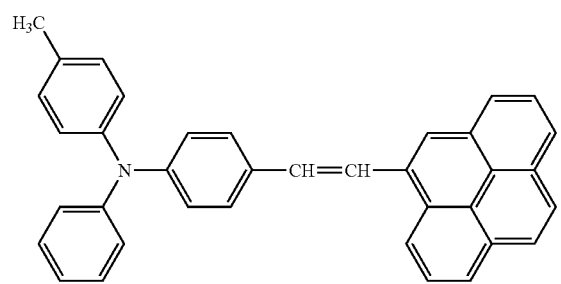
(17)-60
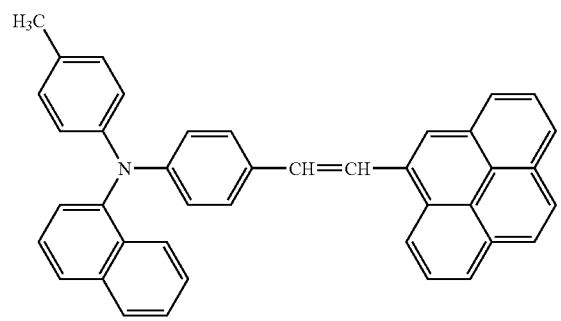
(17)-61
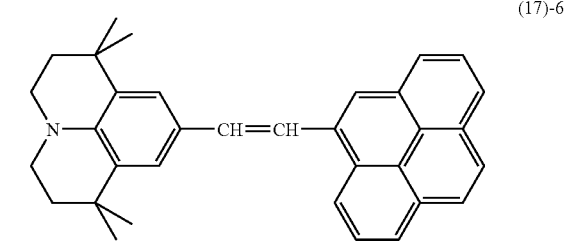
(17)-62
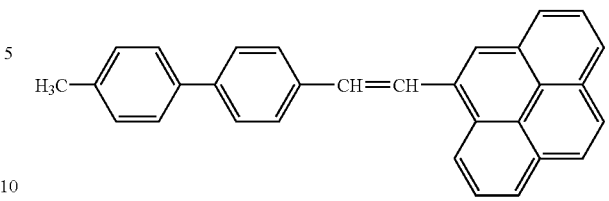
(17)-63
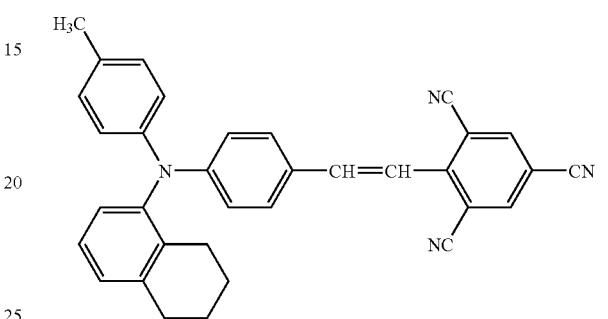
(17)-64
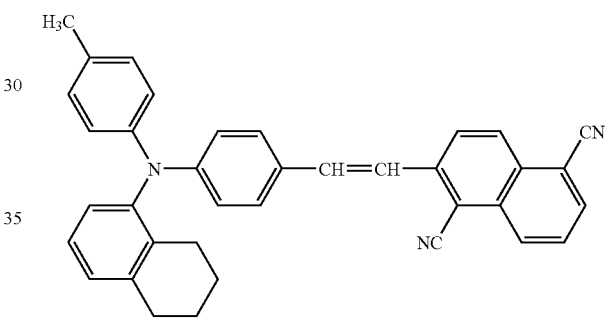
(17)-65
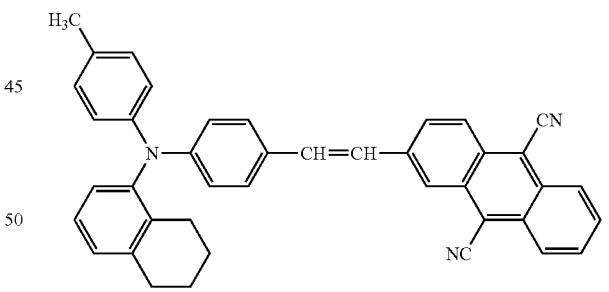
(17)-66
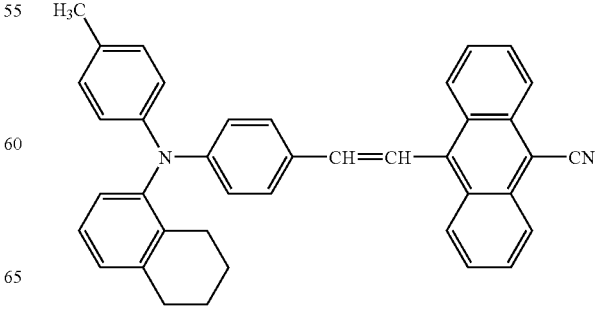

(17)-67
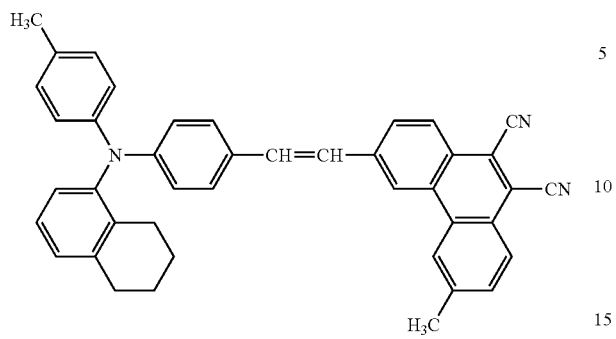
(17)-68
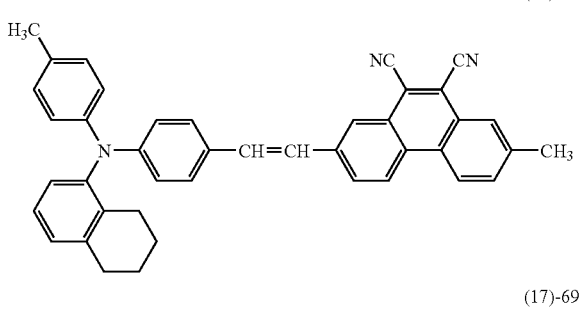
(17)-69
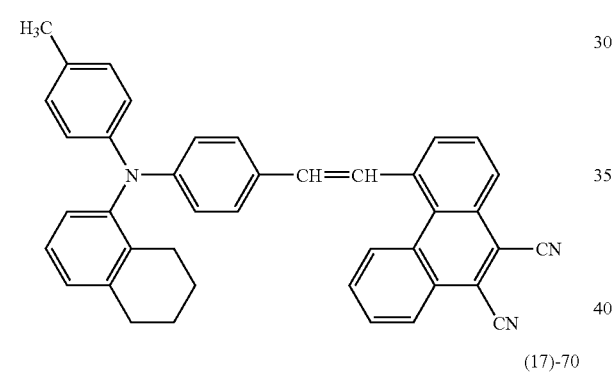
(17)-70
(17)-71
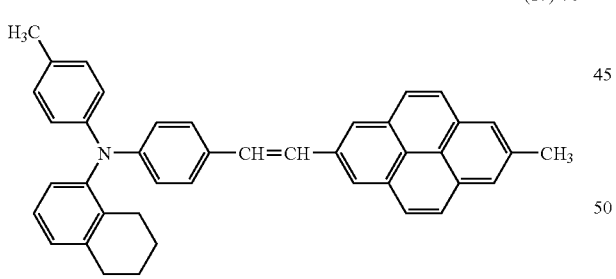
(17)-72
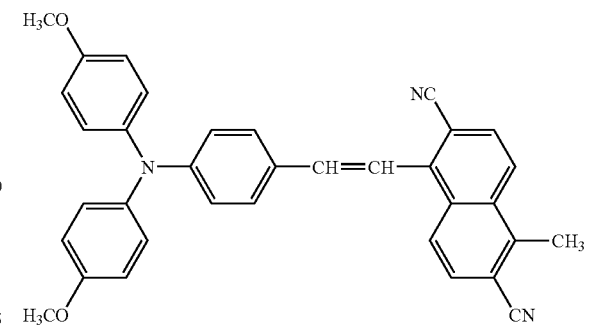
(17)-73
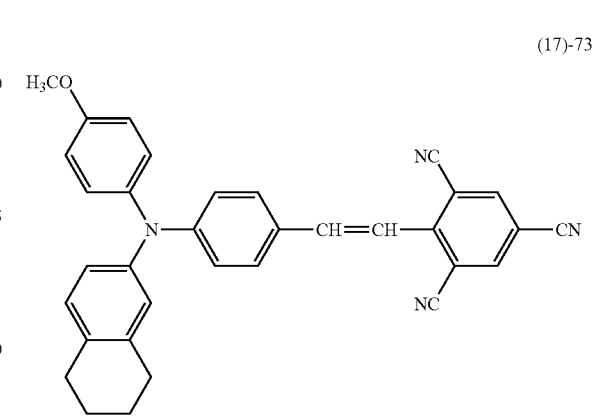
(17)-74
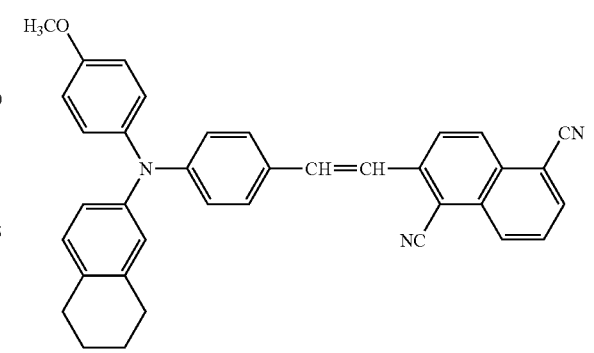
(17)-75
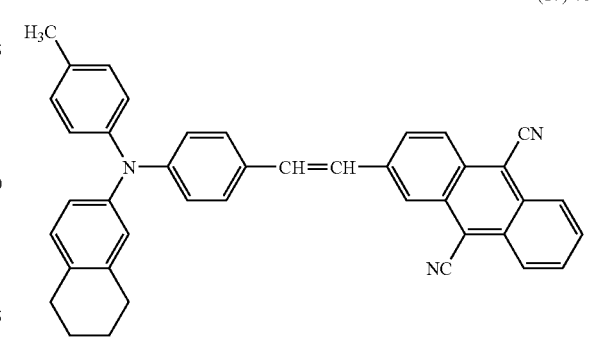

(17)-76
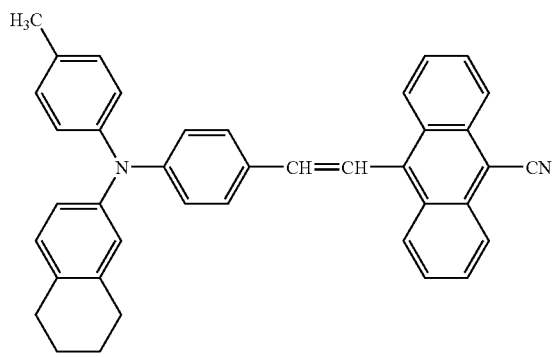
(17)-77
(17)-78
(17)-79
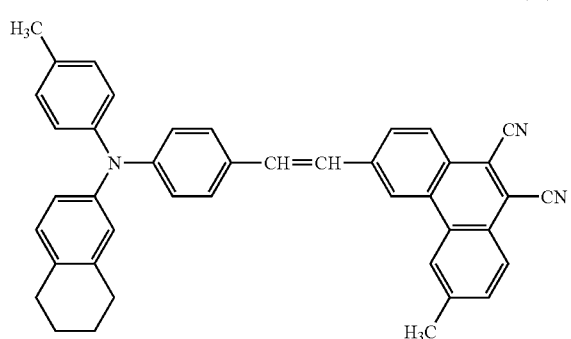
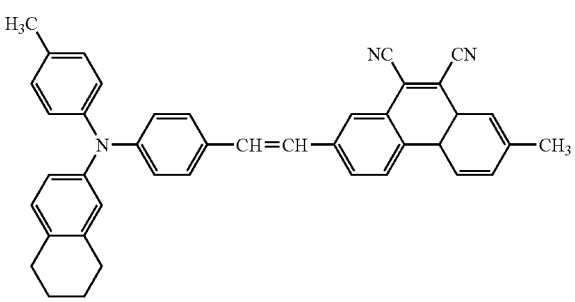
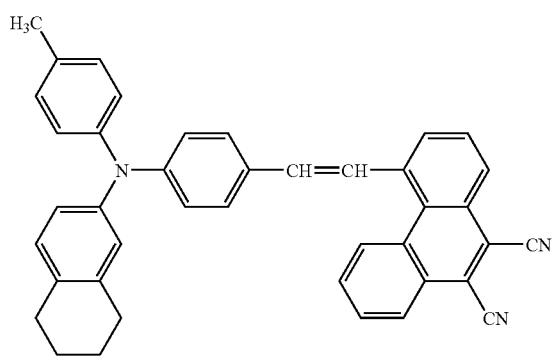
(17)-80
(17)-81
(17)-82
(17)-83
(17)-84
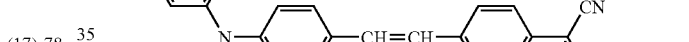
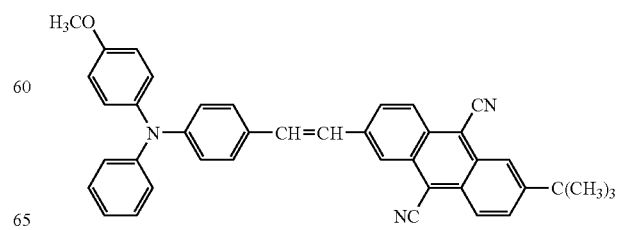

-continued

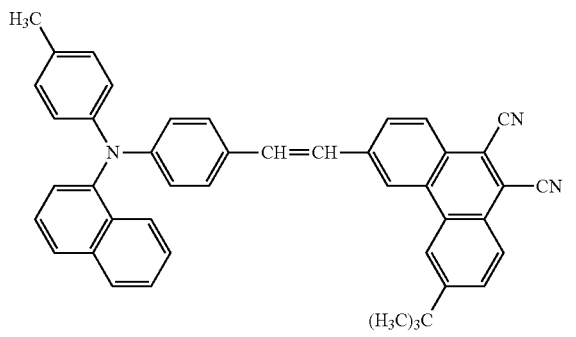
(17)-85

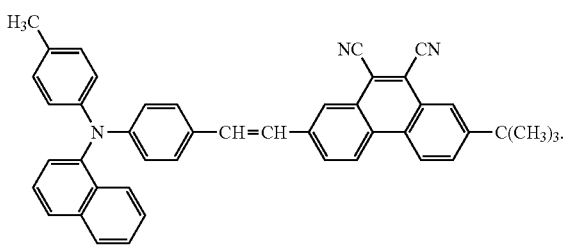
(17)-86

9. The organic electroluminescent element as defined in claim 8, wherein at least one species of the styryl compounds represented by the structural formulas (17)-1 to (17)-18, and (17)-20 to (17)-86 given above is mixed in concentrations ranging from 5 to 90 wt% with the material having the charge transporting capability in the mixture layer.

10. The organic electroluminescent element as defined in claim 9, wherein the at least one species of the styryl compounds represented by the structural formulas (17)-1 to (17)-18, and (17)-20 to (17)-86 given above is mixed in concentrations ranging from 30 to 90wt% with the material having the charge transporting capability in the mixture layer.

11. The organic electroluminescent element as defined in claim 9, wherein the mixture contains at least two different species of the styryl compounds represented by the structural formulas (17)-1 to (17)-18, and (17)-20 to (17)-86 given above.

12. The organic electroluminescent element as defined in claim 8, wherein the mixture contains at least one species of the styryl compounds represented by the structural formulas (17)-1 to (17)-18, and (17)-20 to (17)-86 given above and a red or orange emitting dye which has the emission maximum in the range of 600 nm to 700 nm.

13. A light-emitting device or display device incorporated with the organic electroluminescent element defined in any of claims 8 to 12.

14. A light-emitting device or display device incorporated with the organic electroluminescent element defined in claim 8, which has pixels constructed at least partially of the organic electroluminescent element.

* * * * *